(12) United States Patent
Hasegawa

(10) Patent No.: US 8,836,362 B2
(45) Date of Patent: Sep. 16, 2014

(54) SWITCH PROBE AND DEVICE AND SYSTEM FOR SUBSTRATE INSPECTION

(75) Inventor: Tohru Hasegawa, Sagamihara (JP)

(73) Assignee: Ricoh Company, Ltd., Tokyo (JP)

( * ) Notice: Subject to any disclaimer, the term of this patent is extended or adjusted under 35 U.S.C. 154(b) by 466 days.

(21) Appl. No.: 13/118,901

(22) Filed: May 31, 2011

(65) Prior Publication Data

US 2011/0291684 A1   Dec. 1, 2011

(30) Foreign Application Priority Data

May 31, 2010   (JP) ................................. 2010-123702

(51) Int. Cl.
*G01R 31/00* (2006.01)
*G01R 1/067* (2006.01)

(52) U.S. Cl.
CPC .................. *G01R 1/06722* (2013.01)
USPC ............ 324/755.01; 324/754.01; 324/754.03; 324/756.01; 324/762.01; 439/482

(58) Field of Classification Search
USPC ............. 324/754.01, 754.03, 755.01, 755.05, 324/756.01, 762.01; 439/482
See application file for complete search history.

(56) References Cited

U.S. PATENT DOCUMENTS

| | | | | |
|---|---|---|---|---|
| 3,217,307 A | * | 11/1965 | Fogelquist | 340/870.27 |
| 3,726,740 A | * | 4/1973 | Schwenzheier | 156/363 |
| 3,756,920 A | * | 9/1973 | Kelbaugh et al. | 435/287.3 |
| 5,532,613 A | * | 7/1996 | Nagasawa et al. | 324/754.07 |
| 7,126,362 B2 | * | 10/2006 | Yoshida et al. | 324/756.03 |
| 7,180,317 B2 | * | 2/2007 | Hollman | 324/750.08 |
| 7,329,129 B2 | | 2/2008 | Soeta | |
| 2002/0000820 A1 | * | 1/2002 | Yeghiayan et al. | 324/761 |
| 2002/0000826 A1 | * | 1/2002 | Takao | 324/765 |
| 2002/0118030 A1 | * | 8/2002 | Ott et al. | 324/754 |
| 2005/0099130 A1 | * | 5/2005 | Espiau et al. | 315/39 |
| 2008/0218188 A1 | | 9/2008 | Arai et al. | |

FOREIGN PATENT DOCUMENTS

| | | |
|---|---|---|
| JP | 11-23614 | 1/1999 |
| JP | 2000-171512 | 6/2000 |
| JP | 2006-138808 | 6/2006 |
| JP | 2006-292715 | 10/2006 |
| JP | 2008-224295 | 9/2008 |
| JP | 2008-226881 | 9/2008 |
| JP | 2011-21900 | 2/2011 |

* cited by examiner

*Primary Examiner* — Huy Q Phan
*Assistant Examiner* — Temilade S Rhodes-Vivour
(74) *Attorney, Agent, or Firm* — Cooper & Dunham LLP

(57) ABSTRACT

A switch probe for use in a substrate inspection device to inspect a substrate includes a first tubular element, a first rod element partially accommodated in the first tubular element, and pressed into the first tubular element when the certain part is mounted for substrate inspection, a second tubular element fixed in the first tubular element, a second rod element partially accommodated in the second tubular element which is inside the first tubular element, and contacting with the first rod element when the first rod element is pressed into the first tubular element, and a fixing mechanism configured to temporarily fix the second rod element in a position so that the second rod element does not contact with the first rod element even when the first rod element is pressed into the first tubular element.

14 Claims, 58 Drawing Sheets

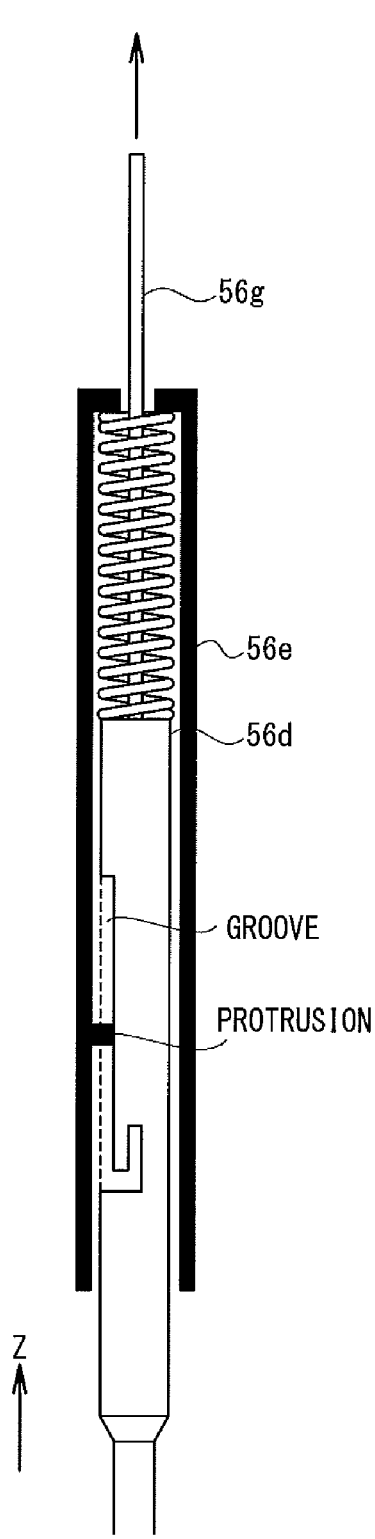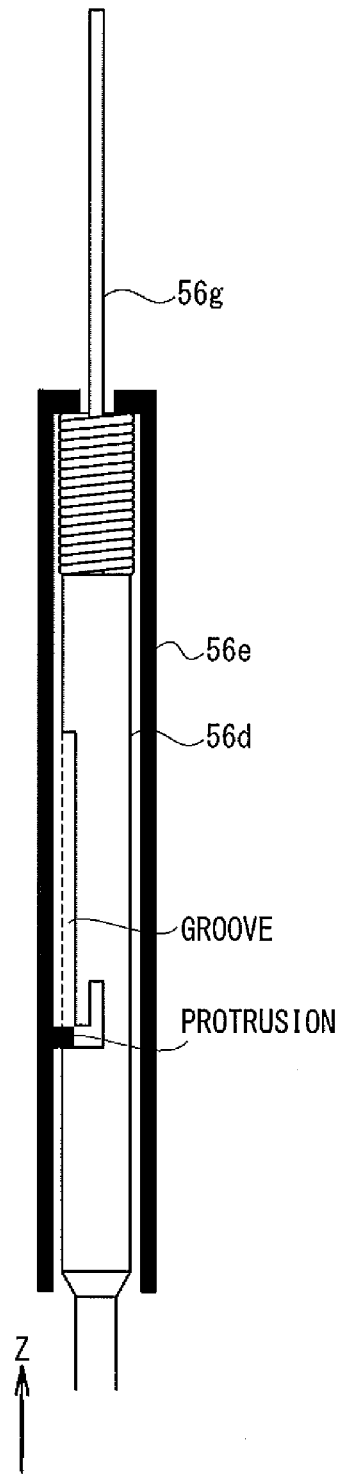

US 8,836,362 B2

SWITCH PROBE AND DEVICE AND SYSTEM FOR SUBSTRATE INSPECTION

CROSS REFERENCE TO RELATED APPLICATION

The present application is based on and claims priority from Japanese Patent Application No. 2010-123702, filed on May 31, 2010, the disclosure of which is hereby incorporated by reference in its entirety.

BACKGROUND OF THE INVENTION

1. Field of the Invention

The present invention relates to a switch probe and a substrate inspection device and a substrate inspection system incorporating such a switch probe to inspect printed substrates.

2. Description of the Prior Art

Recently, as an electric or electronic device has been improved in terms of reduced size and high performance, in a printed wiring substrate installed in the electric or electronic device, varieties of mounted components and wiring or lines, high density and narrow width of lines have been improved.

In order to effectively perform inspection of whether components are appropriately mounted on the printed wiring substrate, soldering is appropriately performed, there are defects such as wiring disconnection or short in wiring, or there are defects of components mounted on the substrate, a substrate inspection device for inspecting the printed wiring substrate by making a contact probe contact the board at a specific position thereof is designed (see Japanese Patent Application Publication Nos. 2000-171512, 2006-138808, 2006-292715, 2008-224295, and 2008-226881)

Japanese Patent Application Publication No. H11-23614 discloses that a contact probe having a rod-like contact pin having an end portion configured to be pressed onto a substrate to be inspected, a cylindrical contact pin receiver in which the contact pin is inserted, a spring provided between the contact pin and the contact pin receiver and configured to bias the end portion of the contact pin in a direction toward the substrate to be inspected, and a fixing device configured to fix the contact pin in a state where the contact pin is pressed down in a direction opposite to the direction toward the substrate.

In the substrate inspection device, so called switch probes as probes for detecting whether components are appropriately mounted on the substrate to be inspected at predetermined positions are provided at plural parts. The switch probe is a probe switched between an OFF state where the component is not mounted and an ON state where the component is mounted.

As one of terms for evaluating whether the substrate inspection device correctly operates, there is a test for detecting whether the plural switch probes are correctly connected to given input-output ports, respectively.

Conventionally, the substrate on which all components are mounted at the given positions is used and each component is removed one by one to check whether it is correctly detected or not that the component is not mounted.

In this case, it is necessary to remove all components from and to remount them on the substrate so that it is disadvantage that long time is required for the test. It is possible to cause failures in soldering, mounting positions, or the like, and degradation or destruction of a component to be mounted and adjacent components due to heat.

SUMMARY OF THE INVENTION

The present invention aims to provide a switch probe, a substrate inspection device and a substrate inspection system which can improve the work efficiency of substrate inspection.

According to one aspect of the present invention, a switch probe for use in a substrate inspection device to inspect a substrate to determine whether or not a certain part is mounted on the board in a predetermined position, the switch probe comprises a first tubular element; a first rod element partially accommodated in the first tubular element, and pressed into the first tubular element when the certain part is mounted for substrate inspection; a second tubular element fixed in the first tubular element; a second rod element partially accommodated in the second tubular element which is inside the first tubular element, and contacting with the first rod element when the first rod element is pressed into the first tubular element; and a fixing mechanism configured to temporarily fix the second rod element in a position so that the second rod element does not contact with the first rod element even when the first rod element is pressed into the first tubular element.

BRIEF DESCRIPTION OF THE DRAWINGS

Features, embodiments, and advantages of the present invention will become apparent from the following detailed description with reference to the accompanying drawings:

FIG. 20A is a view explaining an operation of an operator when the switch probe is set to be in the OFF state.

FIG. 20B is a view explaining an operation of an operator when the switch probe is set to be in the OFF state.

DETAILED DESCRIPTION OF THE PREFERRED EMBODIMENT

Hereinafter, embodiments of the present invention will be described in detail with reference to the accompanying drawings.

First Embodiment

Figure 1:
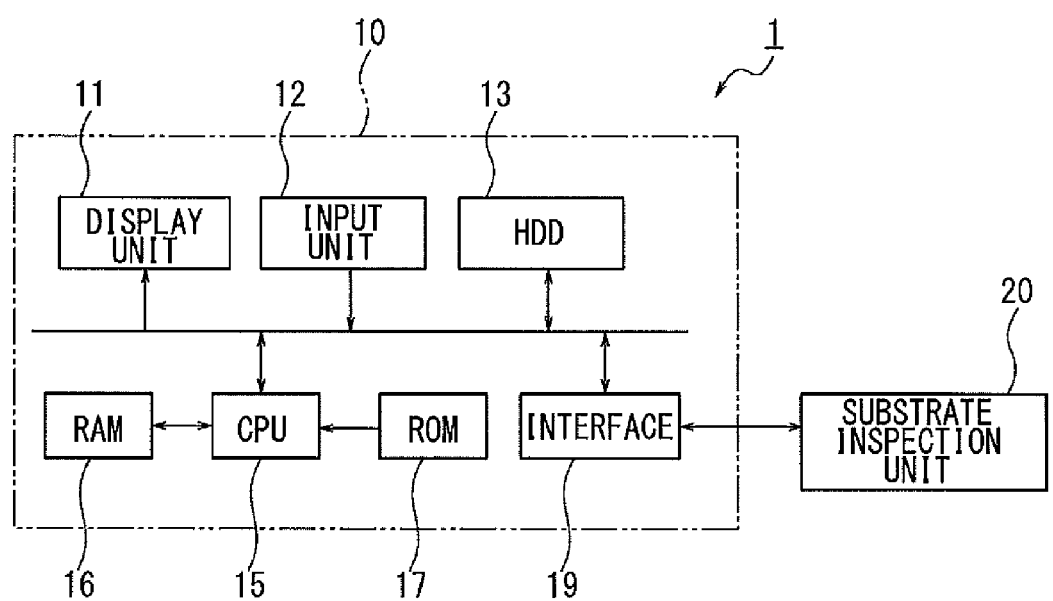
FIG. 1 is an explanatory view showing a schematic configuration of a substrate inspection system according to an embodiment of the present invention.

A first embodiment of the present invention is described with reference to FIG. 1 to FIG. 30. FIG. 1 schematically shows the structure of a substrate inspection system 1.

The substrate inspection system 1 comprises a personal computer and a substrate inspection unit 20.

The personal computer 10 comprises a display unit 11, an input unit 12, a hard disc device (HDD) 13, a CPU 15, a RAM 16, a ROM 17, and an interface 19.

The display unit 11 comprises a not-shown display such as CRT, a liquid crystal display (LCD), a plasma display panel (PDP) to display various information according to an instruction from the CPU 15.

The input unit 12 comprises at least one of a keyboard, a mouse, a tablet, a light pen, a touch panel (not shown) and the like to inform the CPU 15 of various information input by an operator. Alternatively, such information can be wirelessly input. Further, an LCD with a touch panel for example of an integration of the display unit 11 and the input unit 12 can be used.

The hard disc device 13 comprises a hard disc and a driver for the hard disc.

The interface 19 is a bidirectional communication interface with the substrate inspection unit 20 such as USB interface, PCI interface.

The ROM 17 contains various programs including a substrate inspection unit control program, an evaluation program, an inspection program written in codes decodable by the CPU 15 and data used for execution of these programs.

The CPU 15 controls the entire operation of the personal computer 10 according to the programs stored in the ROM 17.

The RAM 16 is a work memory.

Figure 2A:
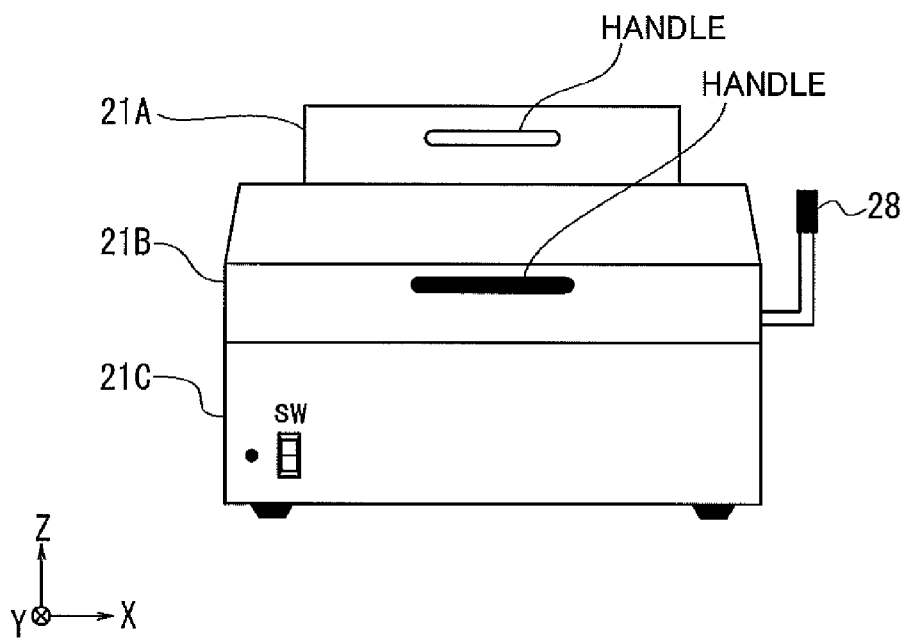
FIG. 2A is an external view showing the substrate inspection system in FIG. 1.
Figure 2B:
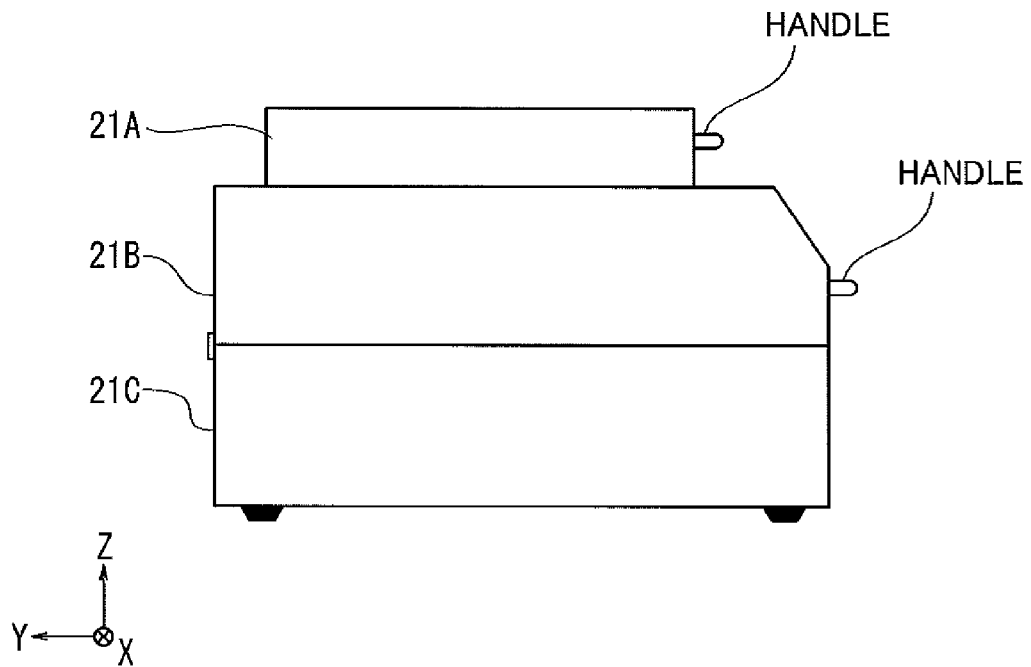
FIG. 2B is an external view showing the substrate inspection system in FIG. 1.

FIGS. 2A, 2B show an example of the exterior of the substrate inspection unit 20. The housing thereof consists of three parts as a top cover 21A, a top box 21B, and a bottom box 21C. Herein, a direction orthogonal to a floor on which the substrate inspection unit 20 is placed is defined to be Z-axis direction in an XYZ three-dimensional orthogonal coordinate system.

Figure 3A:
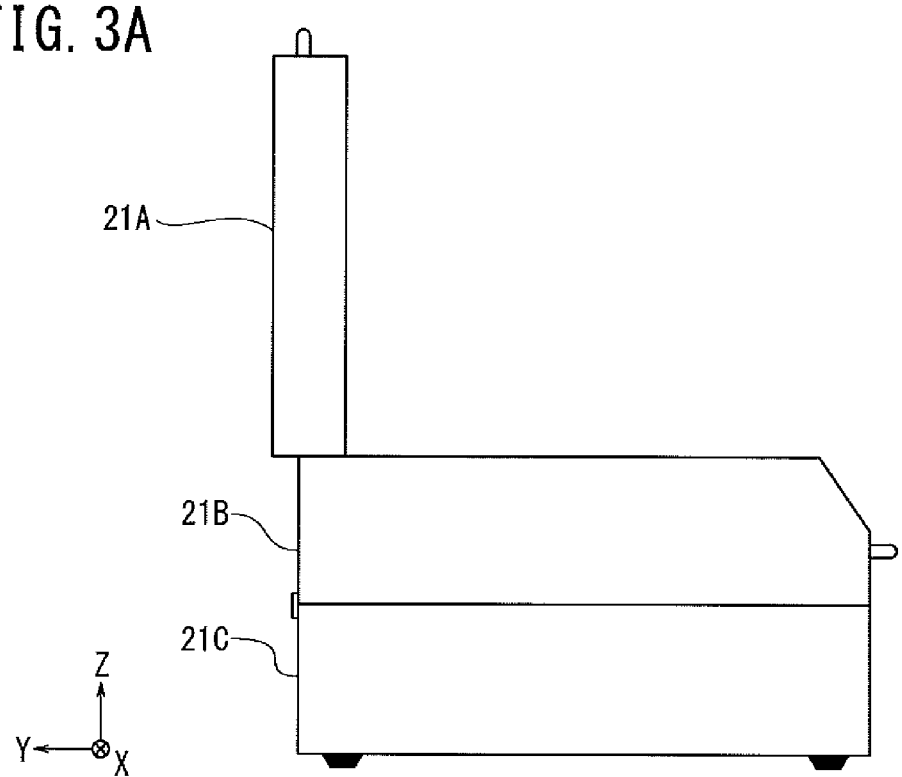
FIG. 3A is a view explaining a structure of a housing of the substrate inspection system.

The top cover 21A is fixed at one end on +Y-side on the top box 21B with a hinge and has a handle on the front face on −Y-side. An operator pulls up the handle to separate the top cover 21A and the top box 21B as shown in FIG. 3A, for example.

The top box 21B is fixed at one end on the +Y-side on the bottom box 21C with a hinge and has a handle on the front face on −Y-side. An operator pulls up the handle to separate the top box 21B and the bottom box 21C as shown in FIG. 3A, for example.

The housing of the substrate inspection unit 20 contains a set base 23, a pin board 24, jig plate 25, a plurality of contact probes 26, two power supply units 27A, 27B, and a plurality of switch probes 56. For simplicity, FIG. 4 omits showing wiring elements.

The switch probes 56 are fixed on the top cover 21A. Each of the switch probes 56 is turned on when a correct part is properly mounted on a printed substrate 31 to be inspected (hereinafter, target substrate 31) in a predetermined position, and turned off when it is not. With the personal computer 10, the on-state or off-state of the switch probes can be individually checked. The switch probes 56 will be described in detail later.

Each switch probe 56 is soldered near one end on +Z-side with one end of the wiring element. The other ends of the wiring elements are collected into a certain number of groups and placed into connectors. These connectors are connected with connectors of the top cover 21A.

Figure 5:
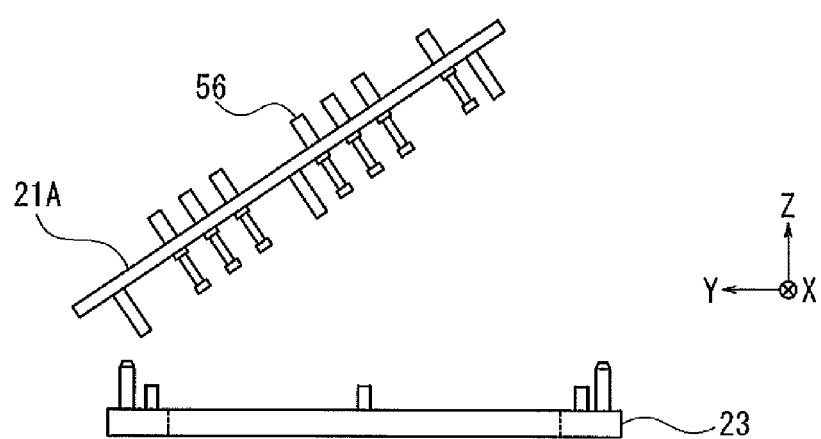
FIG. 5 is a view explaining a top cover.

With the top cover 21A pulled up, the switch probes 56 are simultaneously pulled up as shown in FIG. 5.

The set base 23 is a plate element to support the target substrate 31 and fixed in the top box 21B.

Figure 6:
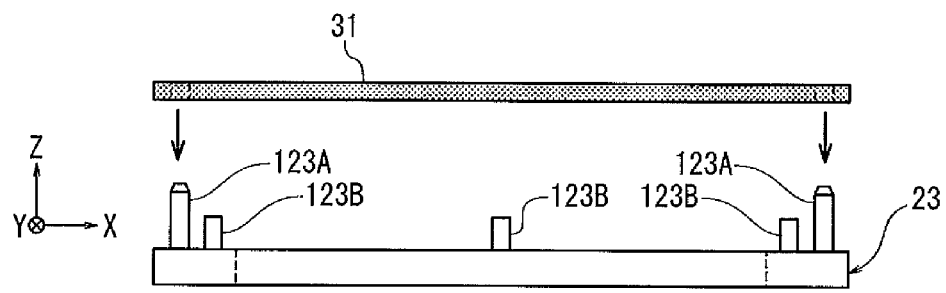
FIG. 6 is a view explaining a set base.
Figure 7:
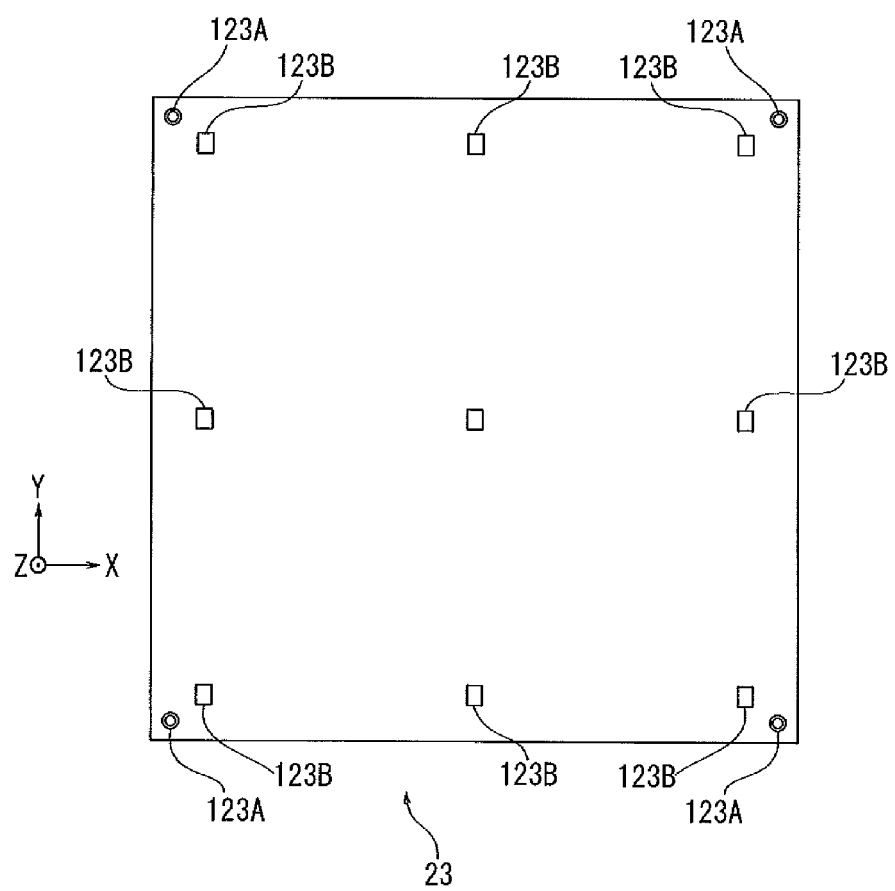
FIG. 7 is a view explaining a set base.

The set base 23 includes first protrusions 123A and second protrusions 123B on a +Z side face as shown in FIGS. 6-7 by way of example. The first protrusions 123A corresponds with holes formed in the target substrate 31 to guide the target substrate 31. The second protrusions 123B support the target substrate 31. FIG. 6 omits showing parts or components mounted on the target substrate 31.

Also, the set base 23 includes not-shown through holes through which the contact probes 26 are inserted.

Figure 8:
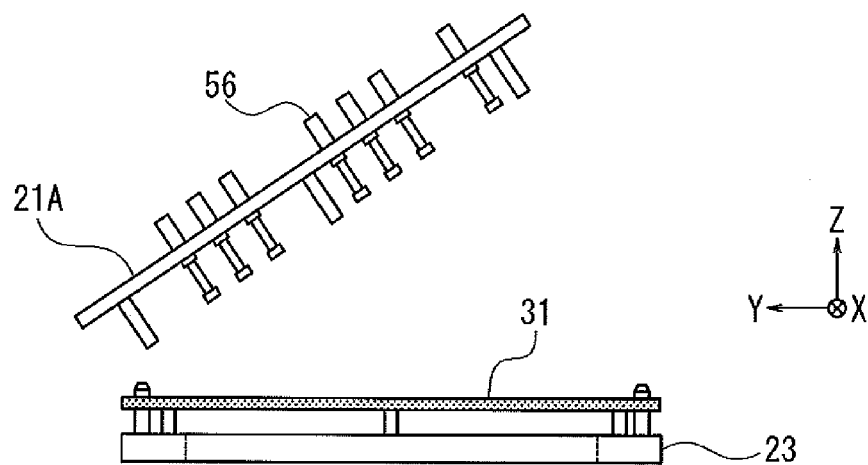
FIG. 8 is a view explaining a method for setting the substrate to be inspected.

The target substrate 31 is set on the set base 23 with the top cover 21A pulled up (FIG. 8).

Figure 9:
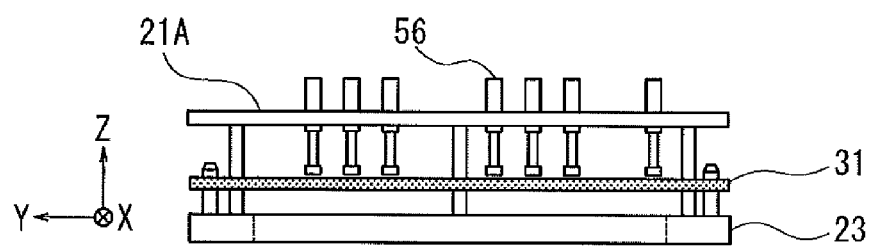
FIG. 9 is a view explaining a method for setting the substrate to be inspected.

The top cover 21A includes convexes in a position facing the second protrusions 123B when closed. With the top cover 21A closed, the target substrate 31 is pressed by the convexes onto the second protrusions 123B (FIG. 9). FIG. 8-9 also omits showing parts and components mounted on the target substrate 31.

The contact probes 26 contact with lead wires of the target substrate 31 or parts mounted thereon for signal inputs/outputs. The contact probes 26 will be described in detail later.

The pin board 24 is a plate with through holes to hold the contact probes 26 and fixed on the top box 21B.

The ends of the contact probes 26 on −Z-side are connected with one ends of the wiring elements. They can be connected by any of soldering, wrapping, soldering and swaging, and terminals.

The other ends of the wiring elements are collected into a certain number of groups and placed into connectors which are connected with the connectors of the pin board 24.

Figure 10:
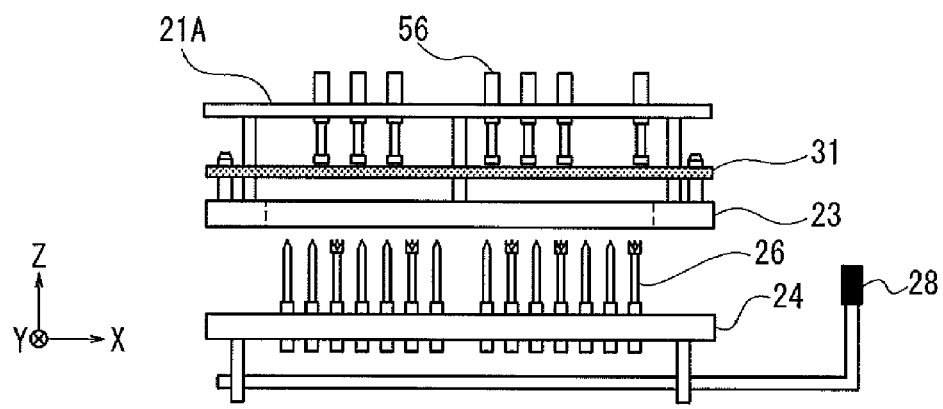
FIG. 10 is a view explaining an operation of a lever.
Figure 11:
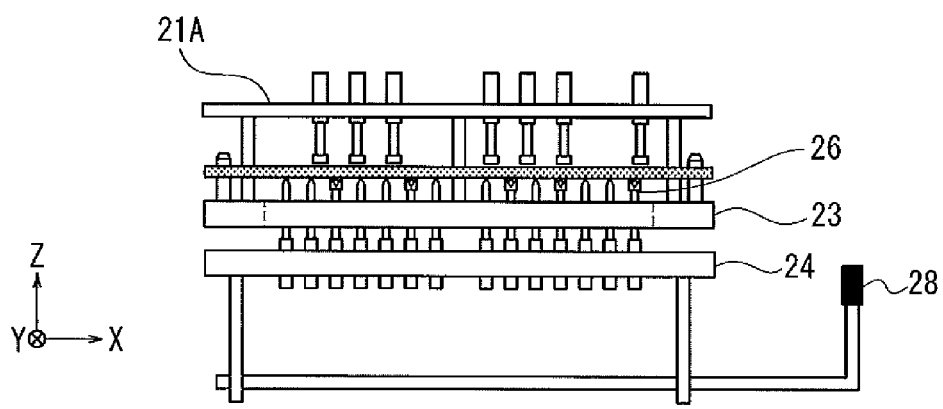
FIG. 11 is a view explaining an operation of the lever.

Referring back to FIGS. 2A, 2B, the top box 21B includes a lever 28 on a +X side face to connect with the pin board 24 as shown in FIG. 10 by way of example. The pin board 24 is raised (moved in +Z direction) by turning the lever 28 to the front (−Y direction) as shown in FIG. 11. FIG. 10-11 also omits showing parts and components mounted on the target substrate 31.

Figure 3B:
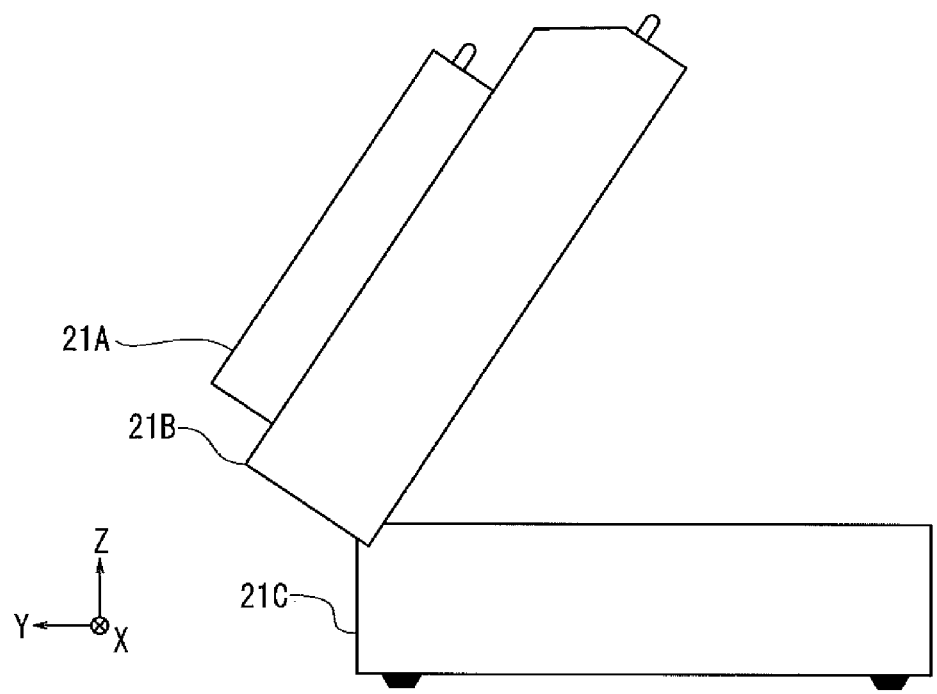
FIG. 3B is a view explaining a structure of the housing of the substrate inspection system.
Figure 4:
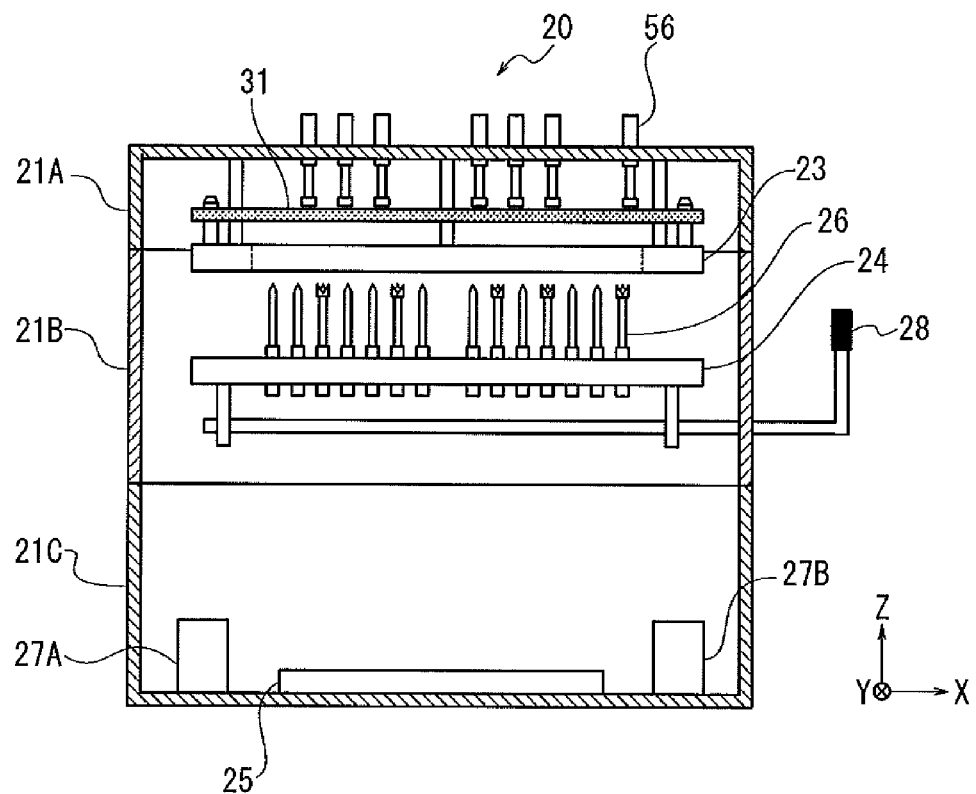
FIG. 4 is a view explaining each part housed in the housing of the substrate inspection system.

Referring back to FIG. 4, the jig plate 25 is a plate element fixed on the bottom box 21C and provided with connectors. Any of these connectors is connected with the wiring element of the connectors of the pin board 24 and the top cover 21A. The connectors are detached from the jig plate 25 while the top box 21B is held up (FIG. 3B).

Further, the jig plate 25 includes board sockets into which digital IO boards, AD conversion boards, buffer boards or the like are inserted. It is connected with the interface 19 of the personal computer 10 via cable.

The power supply unit 27A supplies power to the jig plate 25 and is turned on and off by a power supply switch on the bottom box 21C.

The power supply unit 27B supplies power to the target substrate 31 and is turned on and off by signals from the CPU 15.

Next, the contact probes 26 are described in detail. Two kinds of contact probes 26A, 26B having ends of different shapes are used herein.

Figure 12:
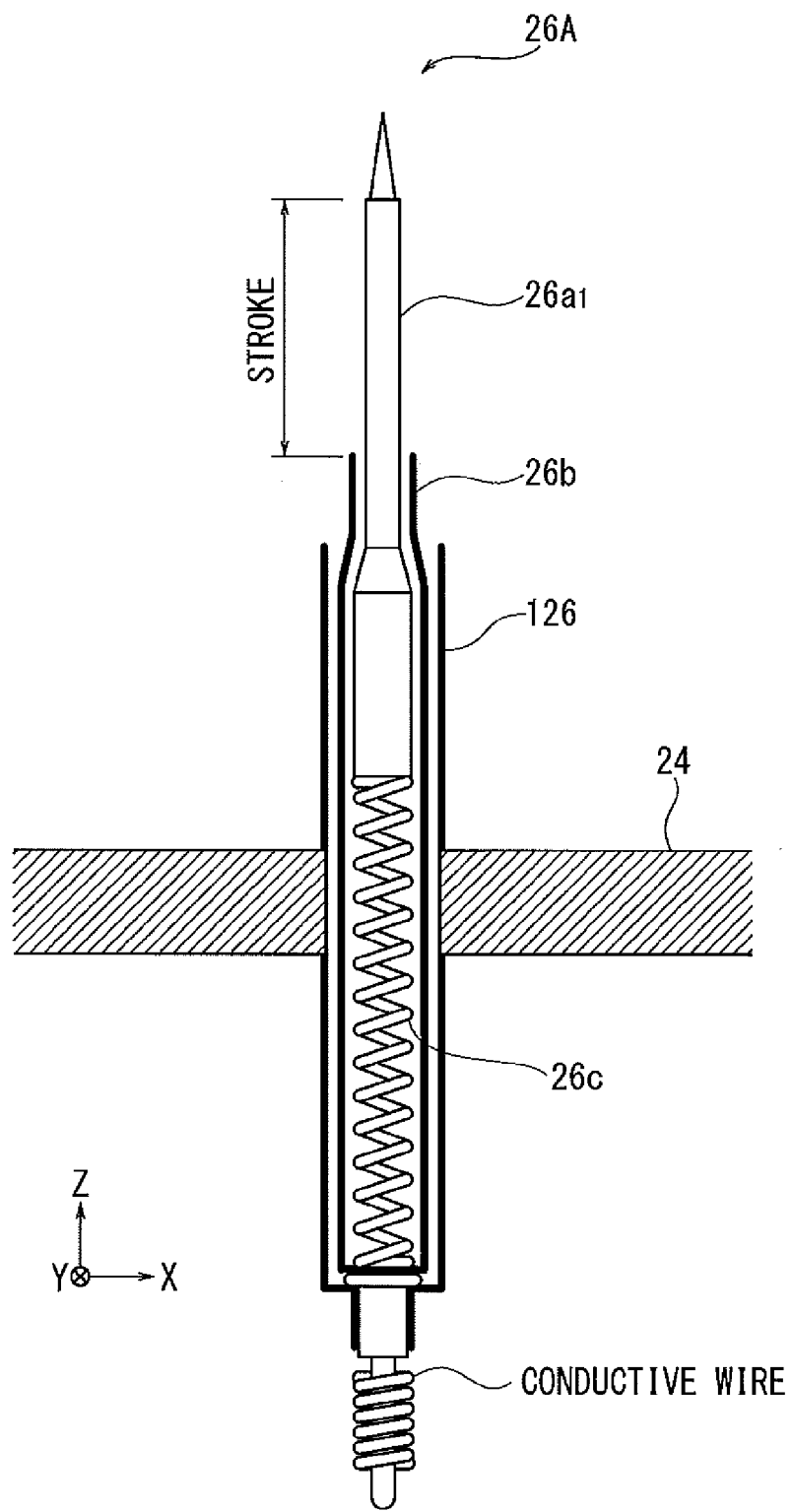
FIG. 12 is a view explaining a configuration of a general contact probe.

The contact probes 26A each comprise a plunger 26a1, a barrel 26b, and a spring 26c as shown in FIG. 12 by way of example and they are accommodated into sockets 126 inserted into the through holes of the pin board 24.

The plunger 26a1 is a needle-like element whose end on +Z side contacts with the target substrate 31. The plunger 26a1 is formed so that the diameter of a portion close to the end on −Z side is larger than that of a center portion.

The barrel 26b is a tubular container for the plunger 26a1 with a bottom face on −Z side in the drawing.

The barrel 26b contains the spring 26c and the plunger 26a1 on +Z side of the spring 26c and the plunger 26a1 is biased by the spring 26c in +Z-axis direction. A portion near the end of the barrel 26b on +Z side is narrowed so as to prevent the plunger 26a1 from dropping off.

Applied with force in −Z direction to the +Z side end, the plunger 26a1 is plunged into the inside of the barrel 26b. The maximal amount of pressing the plunger 26a1 in Z-axis direction, that is, a maximal sunk amount of the plunger 26a1 is referred to as a stroke.

Figure 13:
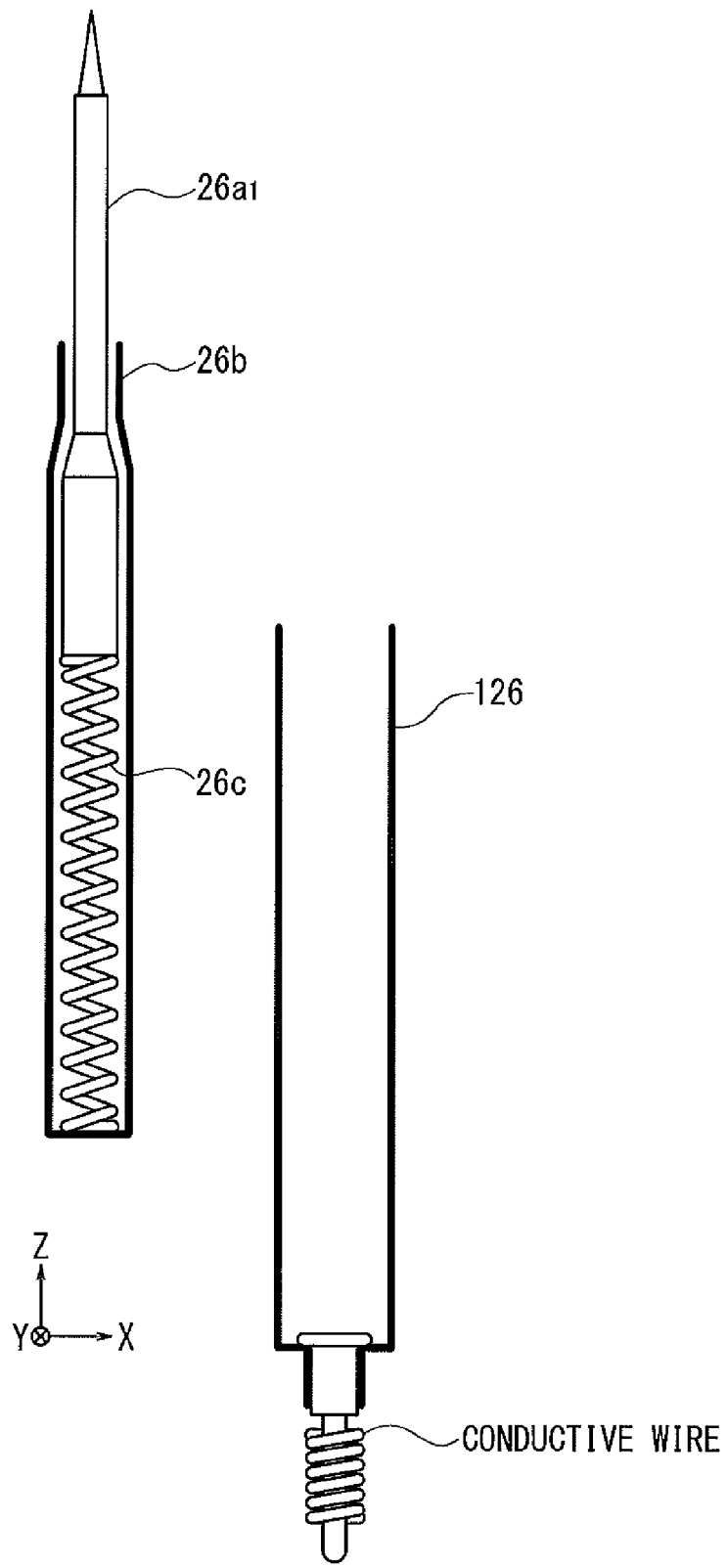
FIG. 13 is a view explaining a state where the general contact probe is removed from a socket.

Note that the contact probes are detachable from the sockets 126 as shown in FIG. 13.

Figure 14:
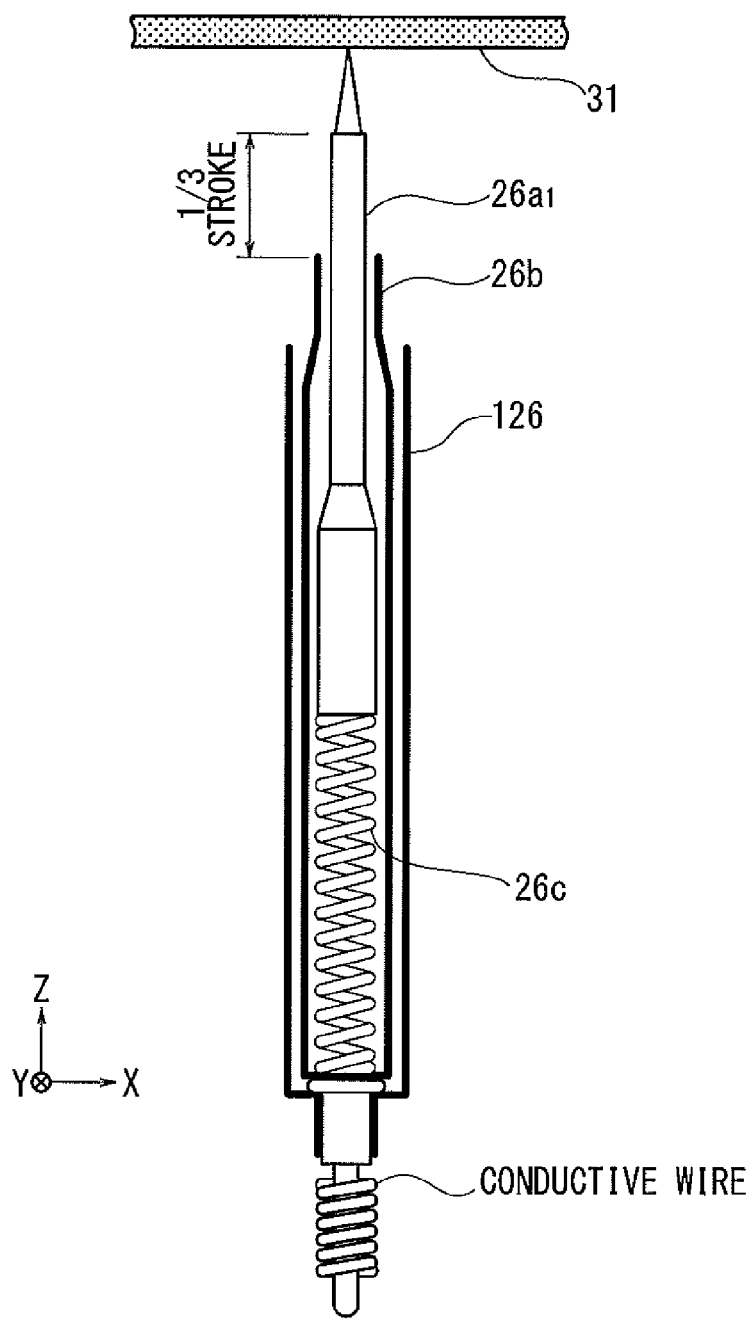
FIG. 14 is a view explaining a position of a plunger in a contact state with the printed wiring substrate set in the general contact probe.

Generally, the contact probes are designed to stably contact with the target substrate 31 when pressed into the barrel 26b with a sunk amount of ⅔ stroke as shown in FIG. 14.

Figure 15:
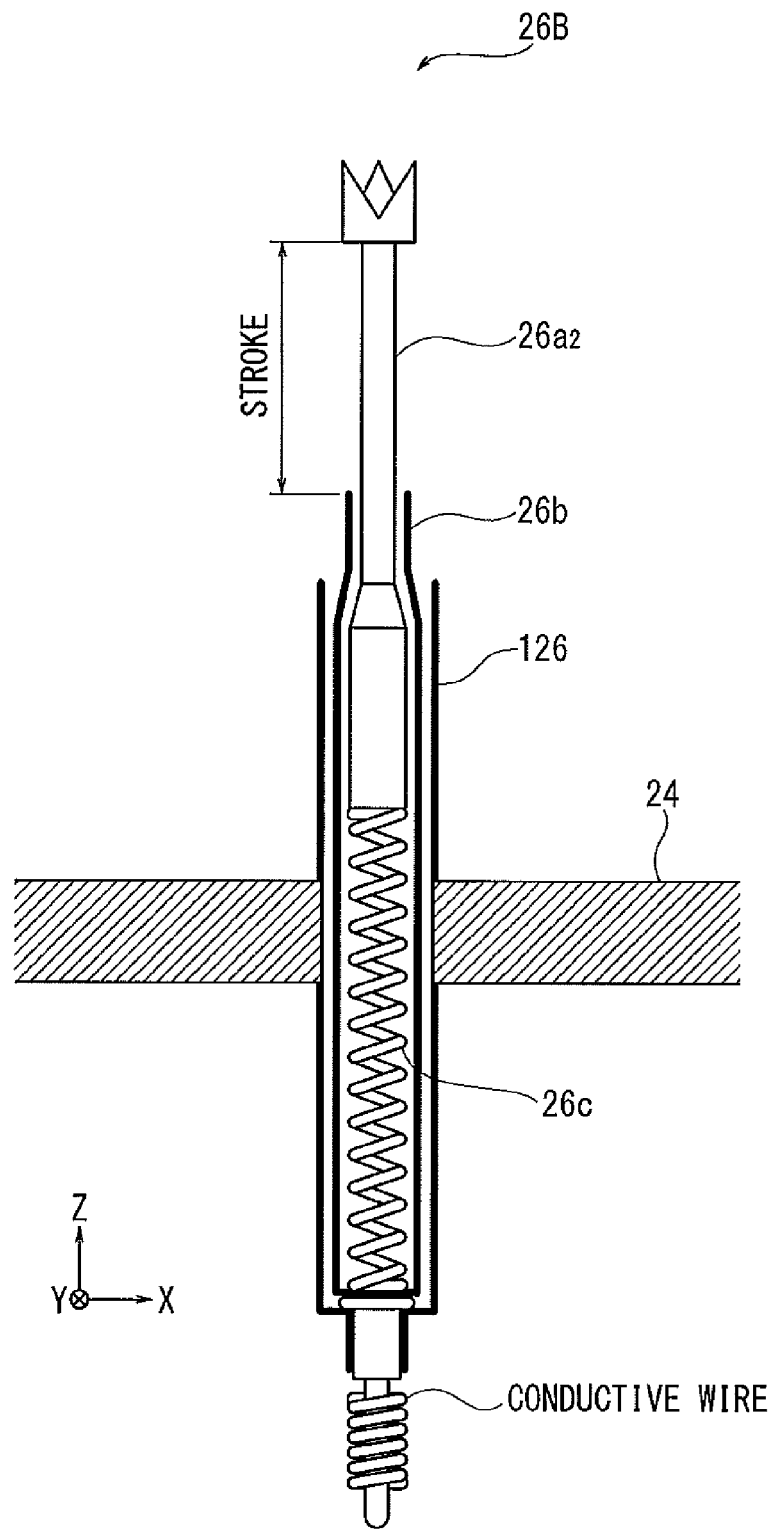
FIG. 15 is a view explaining a configuration of the general contact probe.

The contact probes 26B in FIG. 15 each comprise a plunger 26a2, a barrel 26b, and a spring 26c and are accommodated into the sockets 126 inserted into the through holes of the pin board 24, for example.

Figure 16:
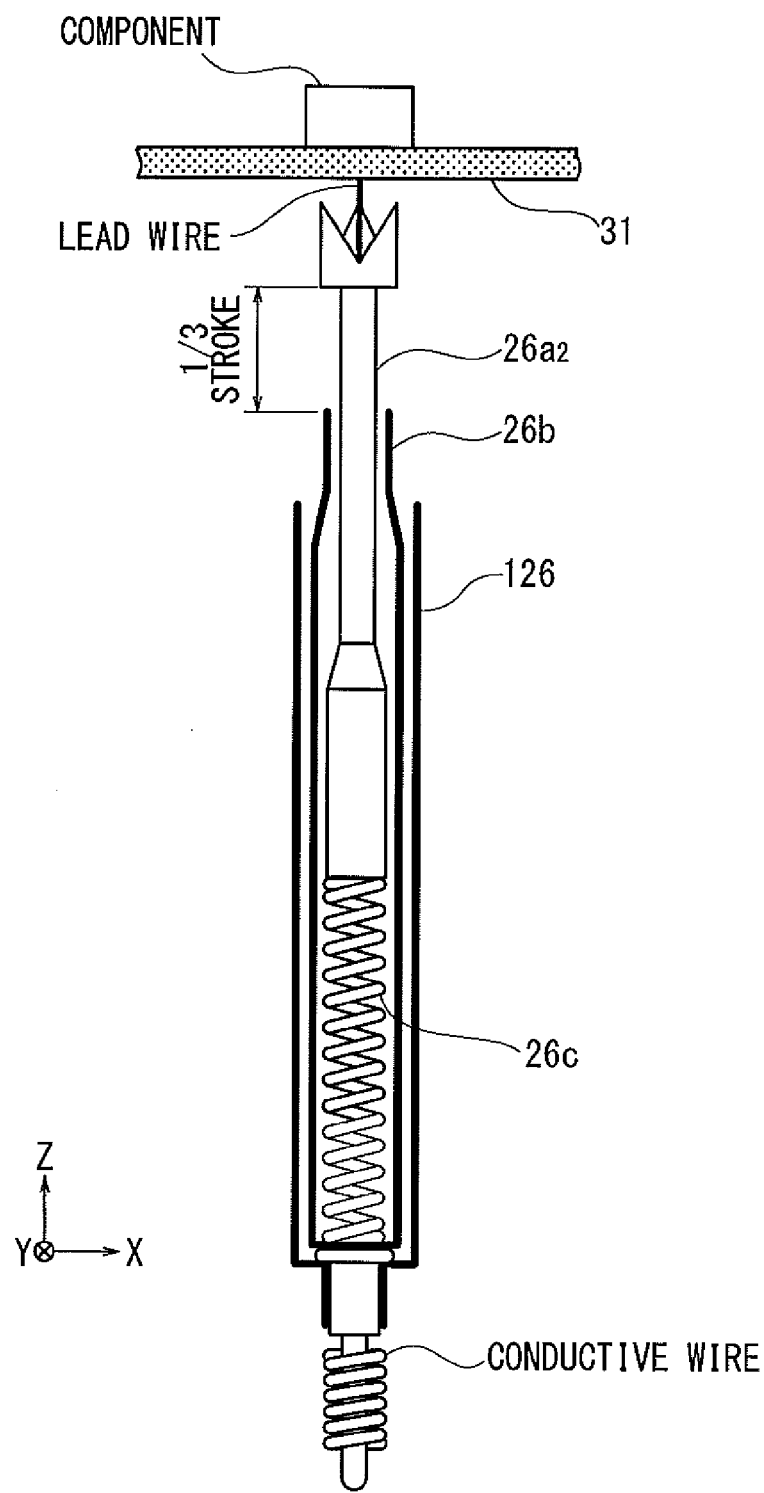
FIG. 16 is a view explaining a position of the plunger in a contact state with a lead wire of the component mounted on the printed wiring substrate in the general contact probe.

The plungers 26a2 in FIG. 16 contact with the lead wires of parts mounted on the target substrate 31 at one end on +Z side. The rest of the structure thereof is the same as that of the contact probes 26A.

Note that the contact probes are collectively referred to as contact probes 26 when distinction between the contact probes 26A and the contact probes 26B is not needed.

Next, the switch probes 56 are described in detail.

Figure 17:
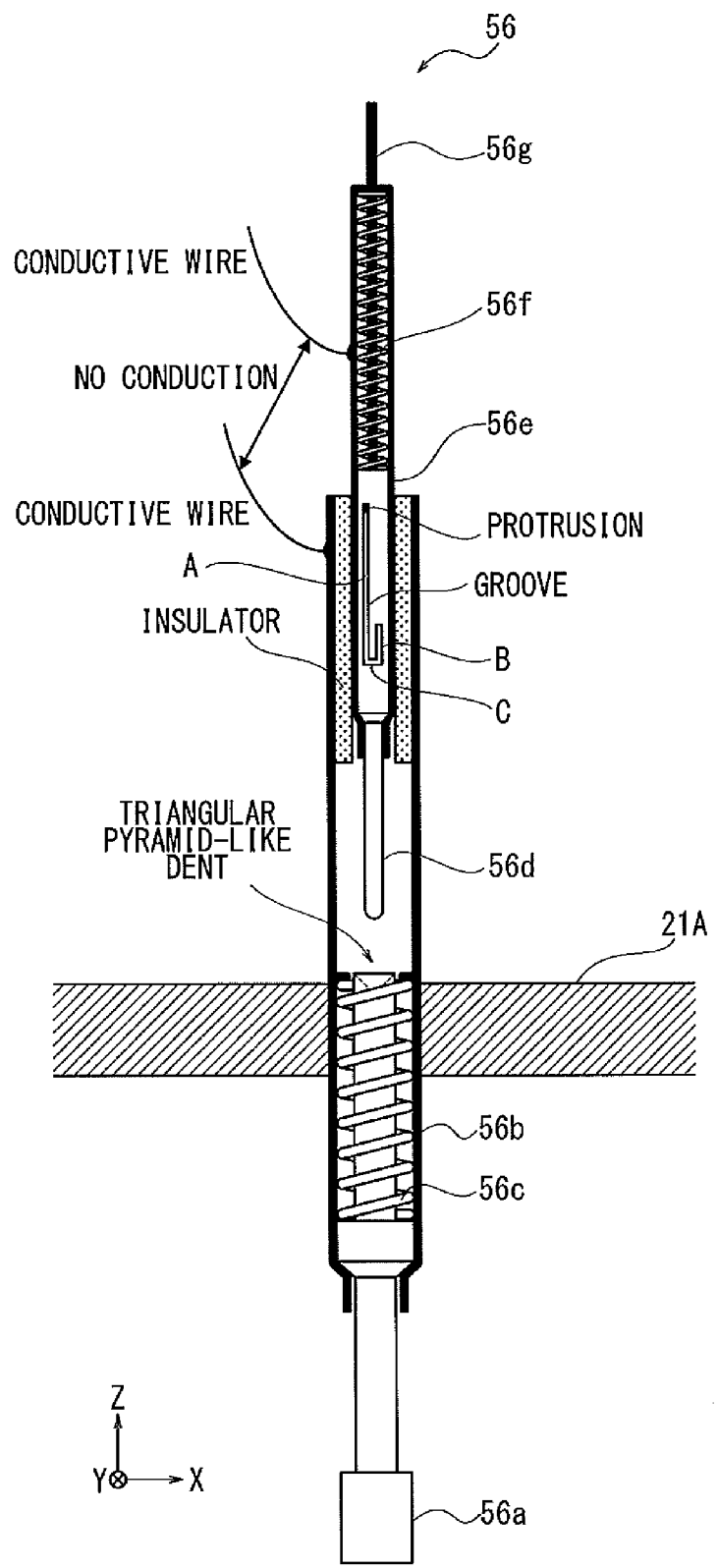
FIG. 17 is a view explaining a configuration of a switch probe according to an embodiment of the present invention.

Each switch probe 56 in FIG. 17 comprises a first plunger 56a, a first barrel 56b, a first spring 56c, a second plunger 56d, a second barrel 56e, a second spring 56f, a rod element 56g, a protrusion and a groove. FIG. 17 shows the switch probe 56 with the target substrate 31 not set. Note that a typical switch probe in prior art does not include the rod element 56g, protrusion, and groove.

The first plunger 56a is movable in Z-axis direction and one end thereof on −Z side which has a planar face orthogonal to the Z-axis is pressed onto a part mounted on the target substrate 31, for example. The shape of the end thereof should not be limited to such an example. Also, the end face of the first plunger 56a on +Z side is dented in triangular pyramid shape.

The first barrel 56b is a pipe-like container for the first plunger 56a and the second barrel 56e.

The first barrel 56b contains the first spring 56c on −Z side and the first plunger 56a on −Z side of the first spring 56c. The first plunger 56a is biased by the first spring 56c in −Z direction. A portion near the end of the first barrel 56b on −Z side is narrowed so as to prevent the first plunger 56a from dropping off.

Applied with force in +Z direction to the end on −Z side, the first plunger 56a is plunged into the inside of the first barrel 56b.

The first barrel 56b holds the second barrel 56e inside on +Z side via an insulator.

The second plunger 56d is a rod element movable in Z-axis direction. One end thereof on −Z side having a spherical face is inserted into the triangular pyramid-like dent of the first plunger 56a, for example. The shape of the end should not be limited to such an example. The rod element 56g is attached to the end face of the second plunger 56d on +Z side.

The second barrel 56e is a tubular container for the second plunger 56d with a bottom face on +Z side. The bottom face includes an opening through which the rod element 56g is inserted. That is, a part of the rod element 56g is exposed from the second barrel 56e.

The second barrel 56e contains the second spring 56f on +Z side and the second plunger 56d on −Z side of the second spring 56f. The second plunger 56d is biased by the second spring 56f in the −Z-axis direction. A portion near the end of the second barrel 56e on −Z side is narrowed so as to prevent the second plunger 56d from dropping off.

Applied with force in +Z direction to the end on −Z side, the second plunger 56d is pressed into the second barrel 56e.

With the target substrate 31 not set or the certain part not mounted thereon, the first and second plunger 56a, 56d do not contact with each other so that conductive wires connected to the surfaces of the first and second barrels 56b, 56e are non-conductive or in off-state.

Meanwhile, with the target substrate 31 and the certain part mounted thereon on −Z side of the switch probe 56, the first plunger 56a is moved by the certain part in +Z direction.

Figure 18:
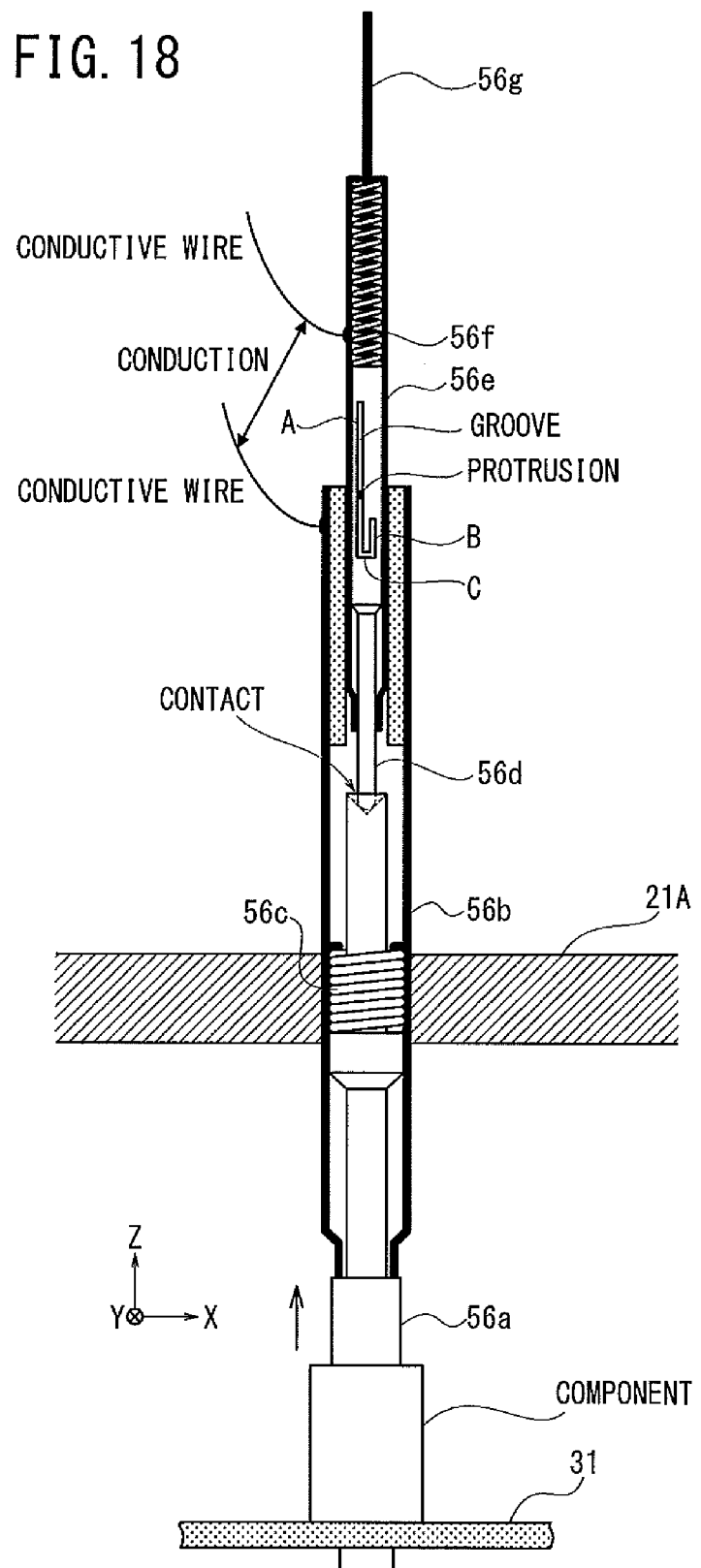
FIG. 18 is a view explaining an ON state of the switch probe.

Thereby, the first and second plunger 56a, 56d contact with each other so that conductive wires connected to the surfaces of the first and second barrels 56b, 56e become conductive or in on-state, as shown in FIG. 18.

That is, the switch probe 56 is in the on-state with the certain part mounted on the target substrate 31 while in the off-state with the certain part not mounted thereon.

In the present embodiment, the second barrel 56e includes a protrusion on an inner wall of the tubular side face.

The second plunger 56d has, on the side face, a hook-like groove consisting of a long groove A and a shoot groove B extending in the Z-axis direction and a groove C connecting the ends of the grooves A and B.

The end of the groove A on +Z side functions as a first engaging portion to engage with the protrusion of the second barrel 56e with the target substrate 31 not set.

Now, the work procedure of an operator to place the switch probe 56 into the off-state when the certain part is on the target substrate 31 is described.

Figure 19:
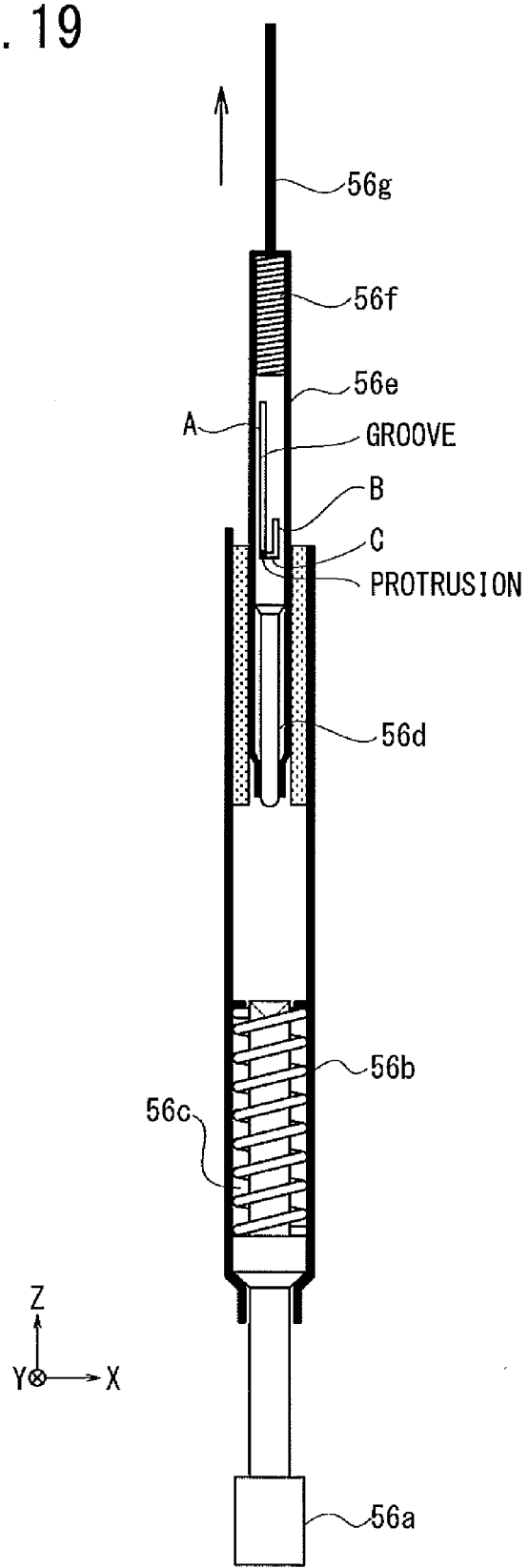
FIG. 19 is a view explaining an operation of an operator when the switch probe is set to be in an OFF state.

First, the rod element 56g is pulled in +Z direction to press the protrusion of the second barrel 56e onto the −Z side wall of the groove A as shown in FIG. 19, FIGS. 20A, 20B. FIGS. 20A, 20B are enlarged views of a part of the switch probe 56.

Figure 21:
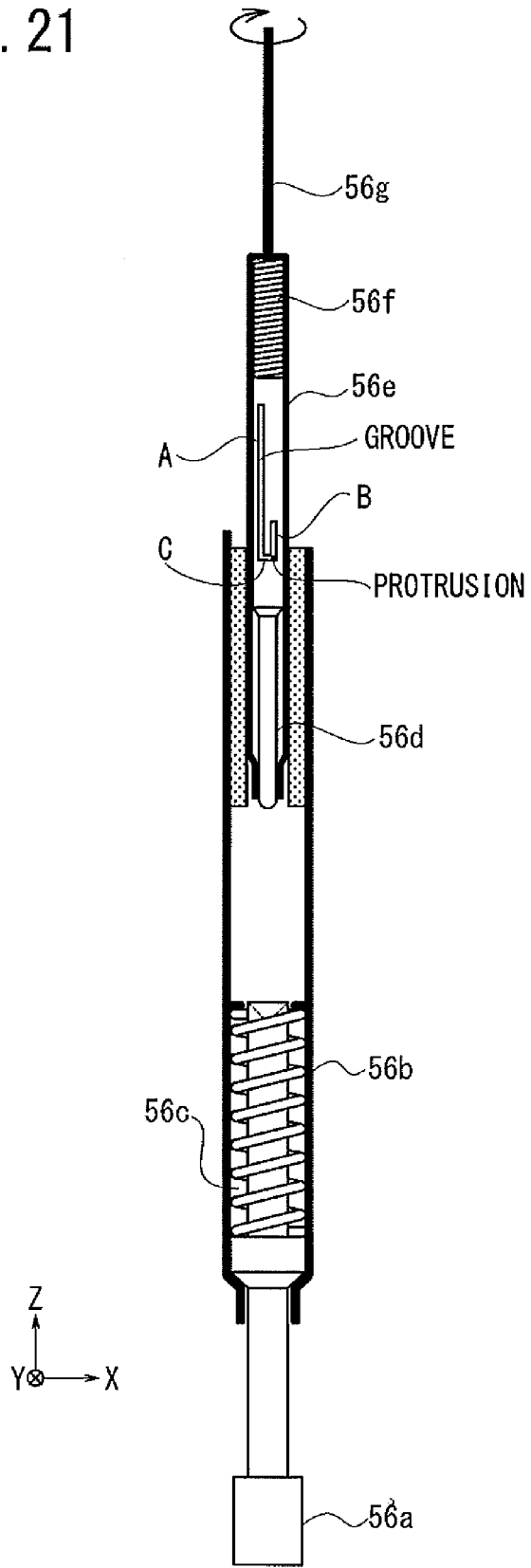
FIG. 21 is a view explaining an operation of an operator when the switch probe is set to be in the OFF state.
Figure 22:
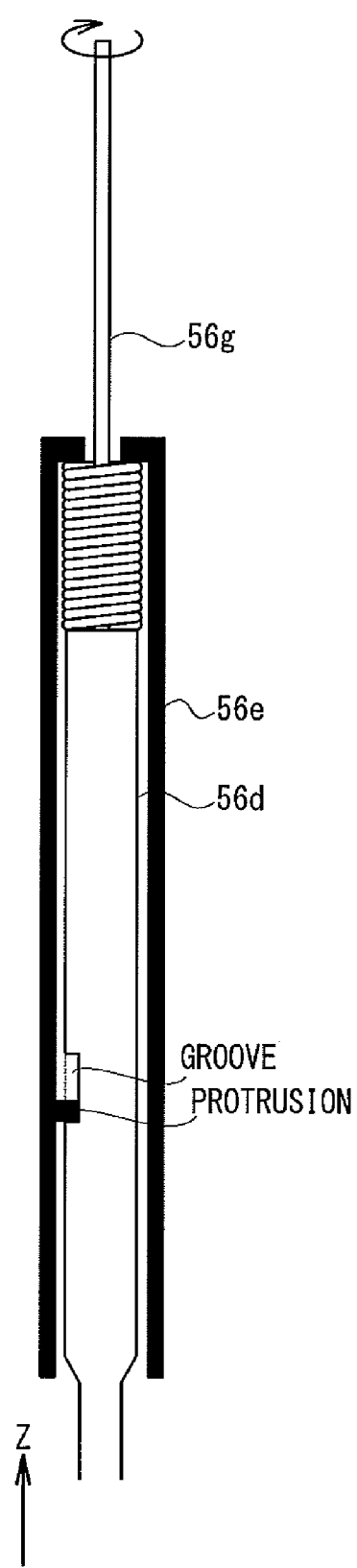
FIG. 22 is a view explaining an operation of an operator when the switch probe is set to be in the OFF state.

Then, the rod element 56g in the pulled state is rotated to press the protrusion of the second barrel 56e onto the wall of the groove B through the groove C as shown in (FIGS. 21, 22). FIG. 22 is an enlarged view of a part of the switch probe 56.

Figure 23:
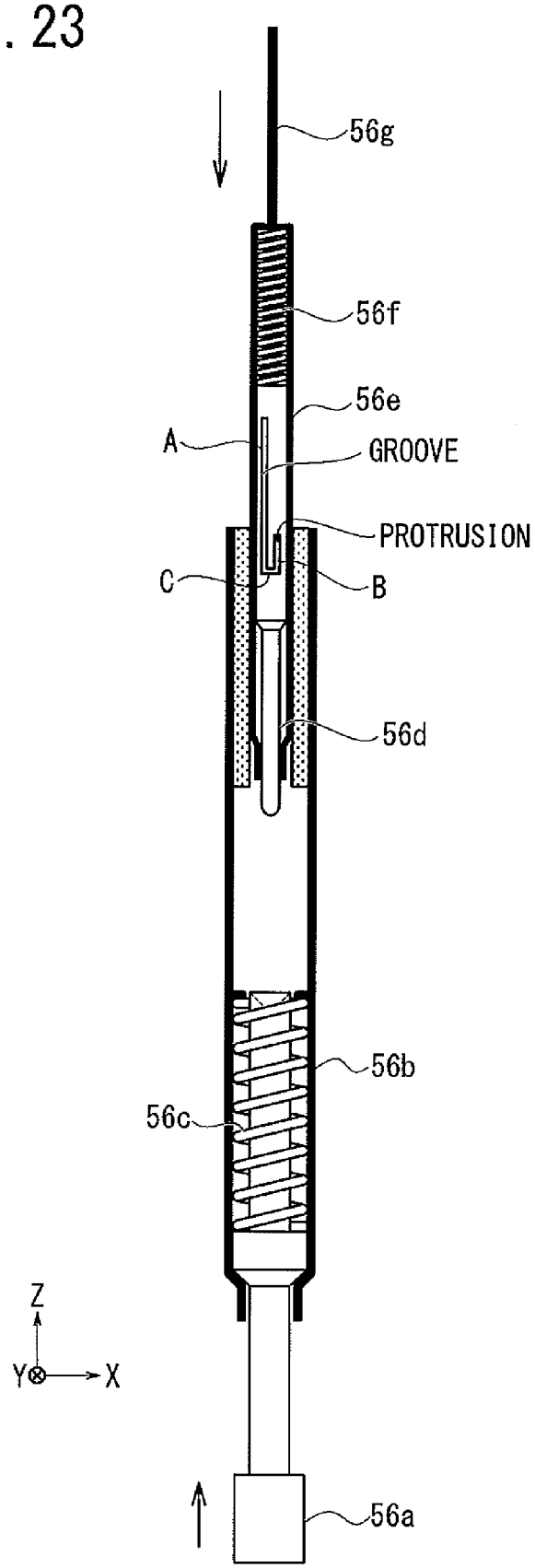
FIG. 23 is a view explaining an operation of an operator when the switch probe is set to be in the OFF state.
Figure 24:
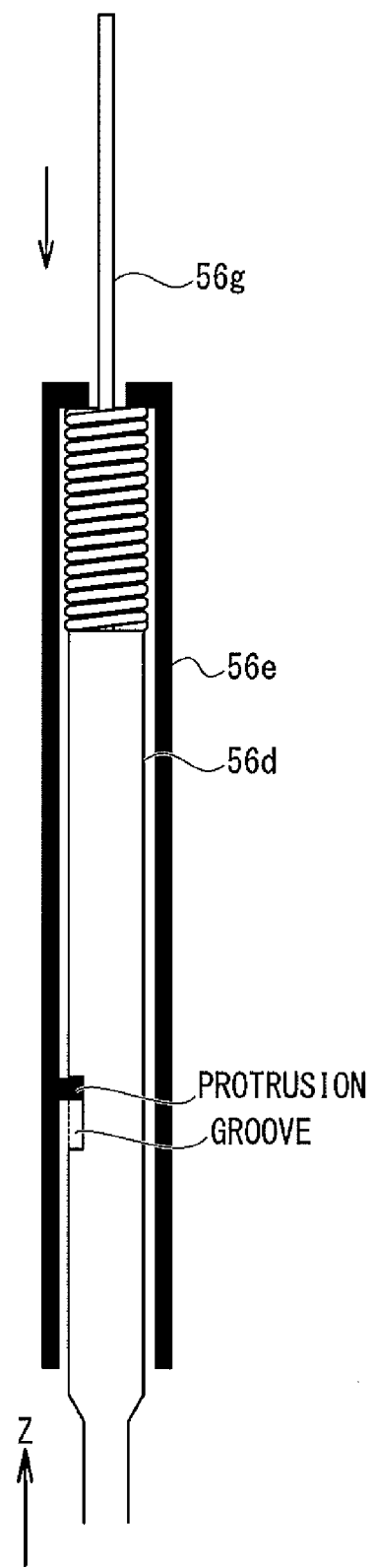
FIG. 24 is a view explaining an operation of an operator when the switch probe is set to be in the OFF state.

Thereafter, the rod element 56g is released. This makes the protrusion of the second barrel 56e engage with the +Z side wall of the groove B as shown in FIGS. 23, 24. FIG. 24 is an enlarged view of a part of the switch probe 56.

Figure 25:
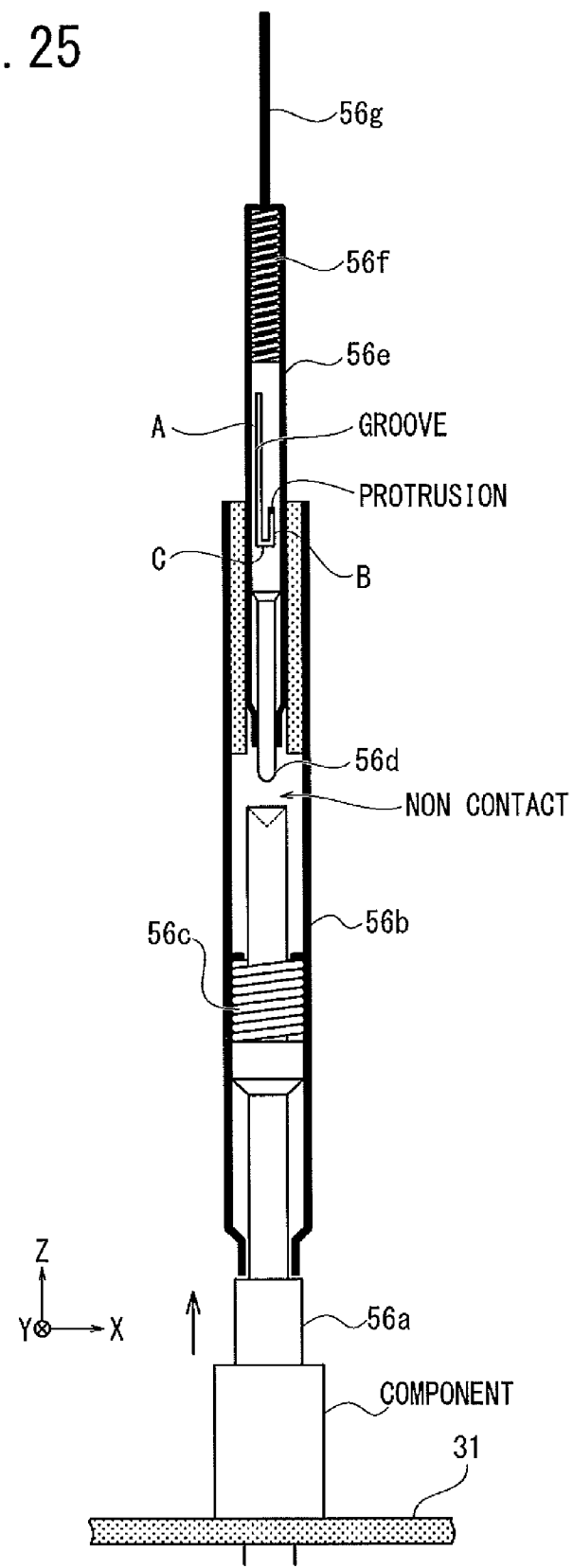
FIG. 25 is a view explaining a state where the switch probe is in the OFF state.

Thus, the movement of the first plunger 56a in +Z direction by the part mounted on the target substrate 31 does not affect the first plunger 56a and the second plunger 56d to contact with each other (FIG. 25). The switch probe 56 is brought in the off-state. The +Z side end of the groove B is an engaging portion to engage with the protrusion of the second barrel 56e when the switch probe is brought in the off-state.

Next, the work procedure of an operator to bring back the switch probe 56 from the off-state to the normal state.

First, the rod element 56g is pulled in the +Z direction to press the protrusion of the second barrel 56e onto the wall of the groove C on −Z side.

Then, the rod element 56g in the pulled state is rotated to press the protrusion of the second barrel 56e onto the wall of the groove A through the groove C.

Thereafter, the rod element 56g is released. This makes the protrusion of the second barrel 56e engage with the +Z side wall of the groove A.

Thus, with the target substrate 31 set in the substrate inspection unit 20, any of the switch probes 56 can be switched between the off-state and the normal state without pulling up the top cover 21A.

Next, the operation of the CPU 15 by the substrate inspection unit control program is described.

The operator inputs a request to use the substrate inspection unit 20 via the input unit 12 and sets a start address of the control program stored in the ROM 17 in a program counter to start the control operation.

Figure 26:
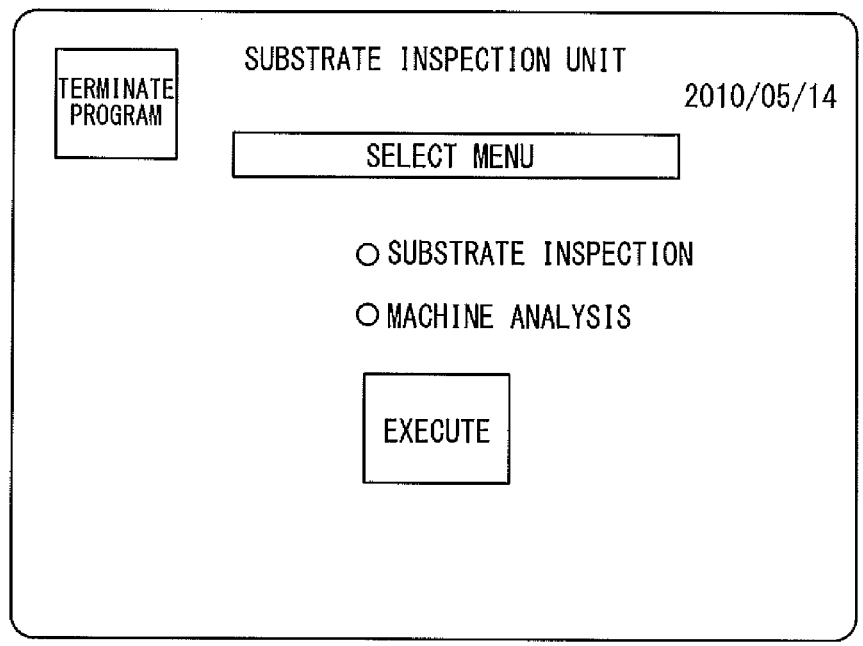
FIG. 26 is a view explaining contents to be displayed on a display part of a display unit when performing analysis process.
Figure 27:
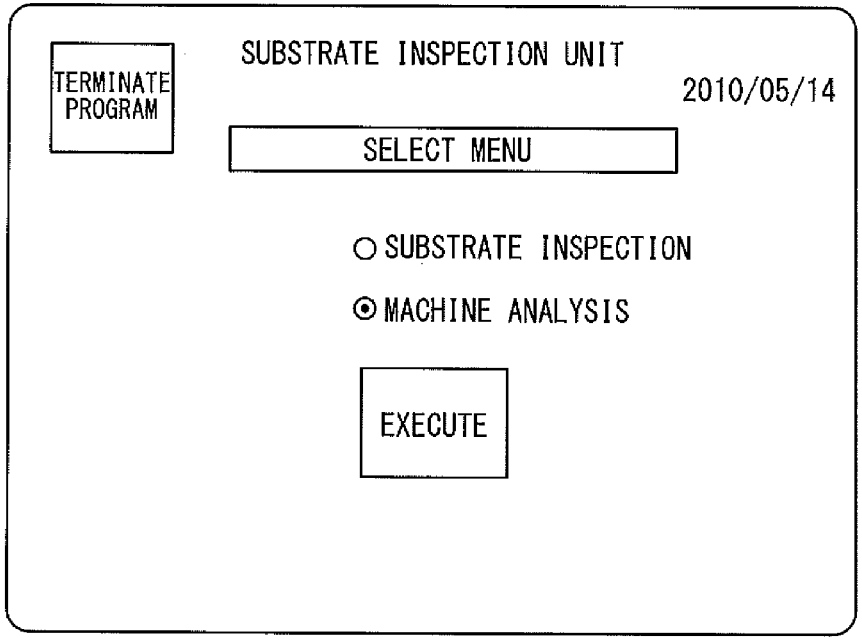
FIG. 27 is a view explaining contents to be displayed on the display part of the display unit when performing analysis process.

Referring to FIG. 26, a menu screen is displayed on the display unit 11, allowing the operator to select substrate inspection or machine analysis. FIG. 27 shows an example of the menu screen when the operator has selected the machine analysis.

In FIG. 27, when the operator clicks the "execute" button, a start address of the analysis program stored in the ROM 17 is set in the program counter to start the analysis program. When the operator selects the substrate inspection, a start address of the inspection program stored in the ROM 17 is set in the program counter to start the inspection program.

Figure 28:
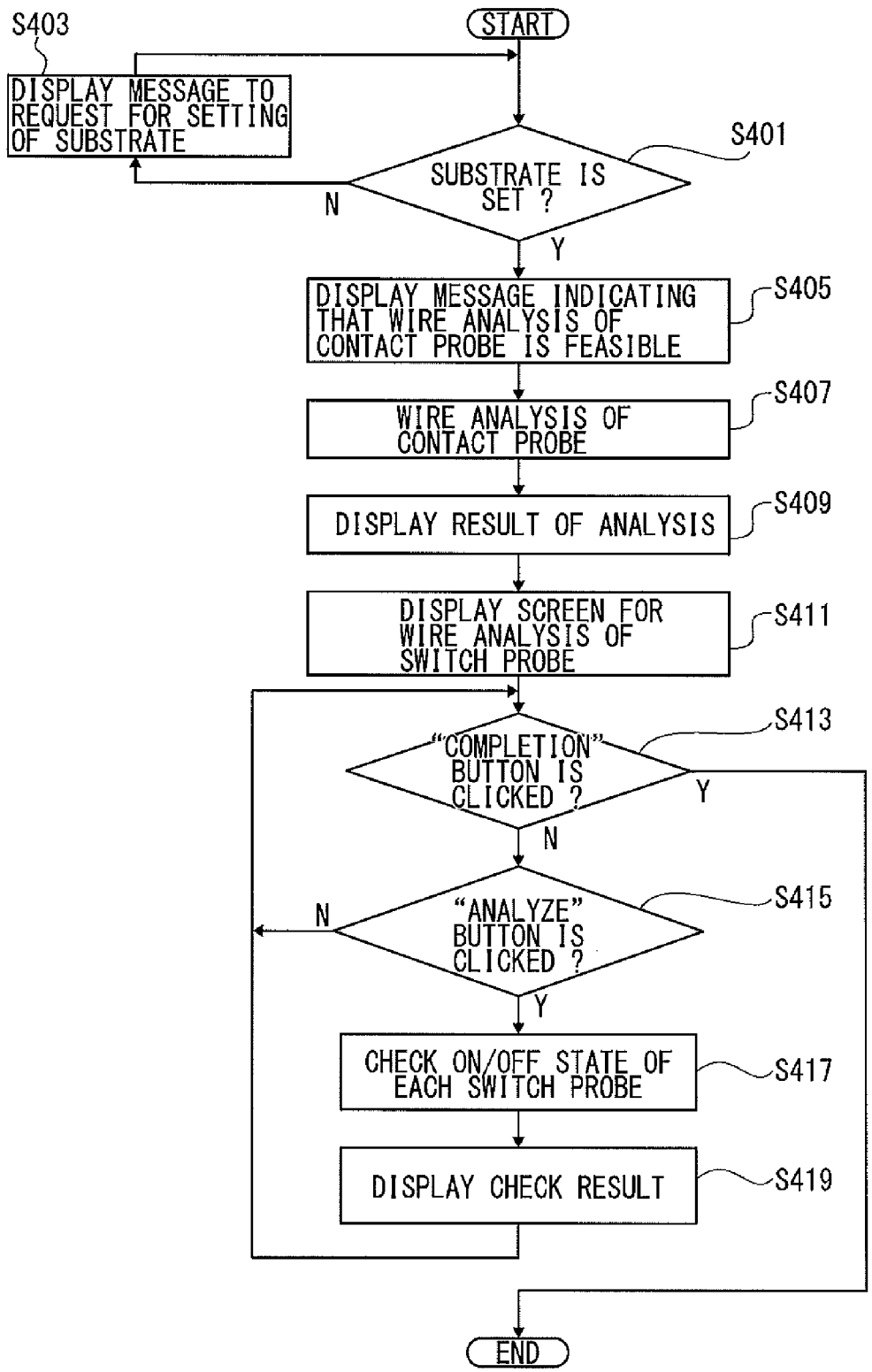
FIG. 28 is a flowchart for explaining the analysis process by a CPU.

FIG. 28 is a flowchart for executing a series of operation algorithm by the CPU 15 in the analysis process. Here, all the switch probes are assumed to be in the normal state.

In step S401 a determination is made on whether or not the target substrate 31 is set on the set base 23. For example, this determination is found to be negative when a signal from a predetermined contact probe 26 is not received upon start of power supply to the target substrate 31 from the power supply unit 27B. Then, the flow proceeds to step S403.

In step S403 a message to request for the setting of the target substrate 31 is displayed on the display unit 11. The flow returns to step S401.

The determination in step S401 is found to be positive when the target substrate 31 is set on the set base 23. The flow proceeds to step S405.

In step S405 a message that the wire analysis of the contact probes 26 is feasible is displayed on the display unit 11. "analysis start" button, "analysis abort" button and else are provided on the display. When the "analysis start" button is clicked, the flow proceeds to step S407.

In step S407 the wiring of the contact probes 26 is analyzed. A determination is made on whether or not all the contact probes 26 are properly connected with predetermined input and output ports. A detailed description thereof is omitted.

In step S409 a result of the analysis is displayed on the display unit 11. "re-analyze" button, "continue analysis" button, "analysis abort" button and else are provided on the display. When the "re-analyze" button is clicked, the flow returns to step S407 while when the "continue analysis" button is clicked, the flow proceeds to step S411.

Figure 29:
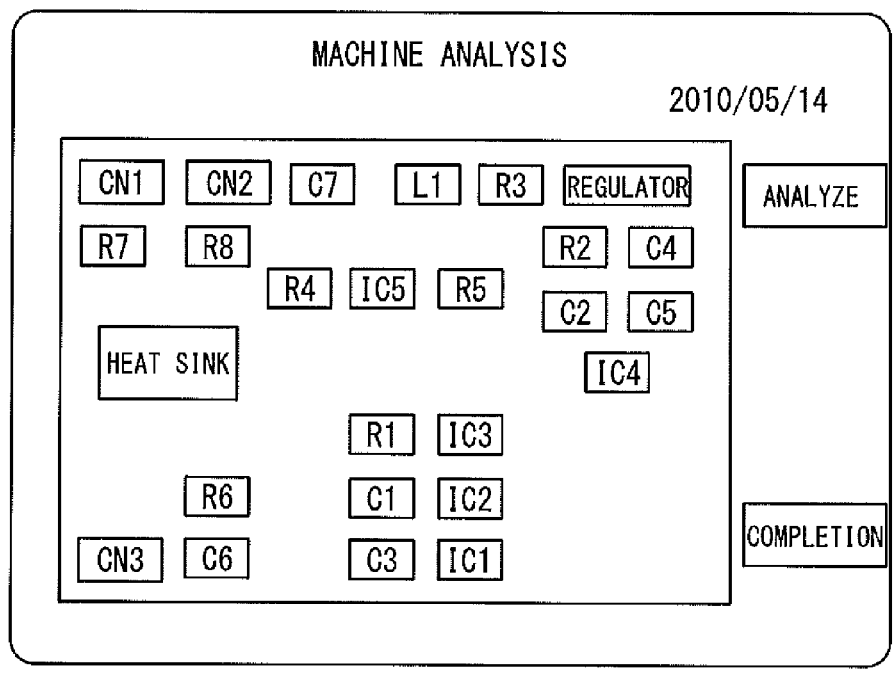
FIG. 29 is a view explaining contents to be displayed on the display part of the display unit when performing analysis process.

In step S411 the menu for wire analysis of the switch probes 56 is displayed on the display unit 11 as shown in FIG. 29. The layout of parts associated with each switch probe 56 such as heat sink, connector CN, IC, condenser C, resistance R, coil L, regulator is displayed.

The operator operates to place a target switch probe 56 in the off-state as described above from the above of the top cover 21A of the substrate inspection unit 20. If there is any switch probe 56 in the off-state other than the target, the operator places the switch probe in the normal state. Without pulling up the top cover 21A and removing the target substrate 31 from the substrate inspection unit 20, the operator can set the target switch probe 56 in the off-state. Upon completion of the operation, the operator clicks the "analyze" button.

In step S413 a determination is made on whether or not the "completion" button is clicked. With the button having not been clicked, the flow proceeds to step S415.

In step S415 a determination is made on whether or not the "analyze" button is clicked. With the button having not been clicked, the flow returns to step S413. With the button having been clicked, the flow proceeds to step S417.

Figure 30:
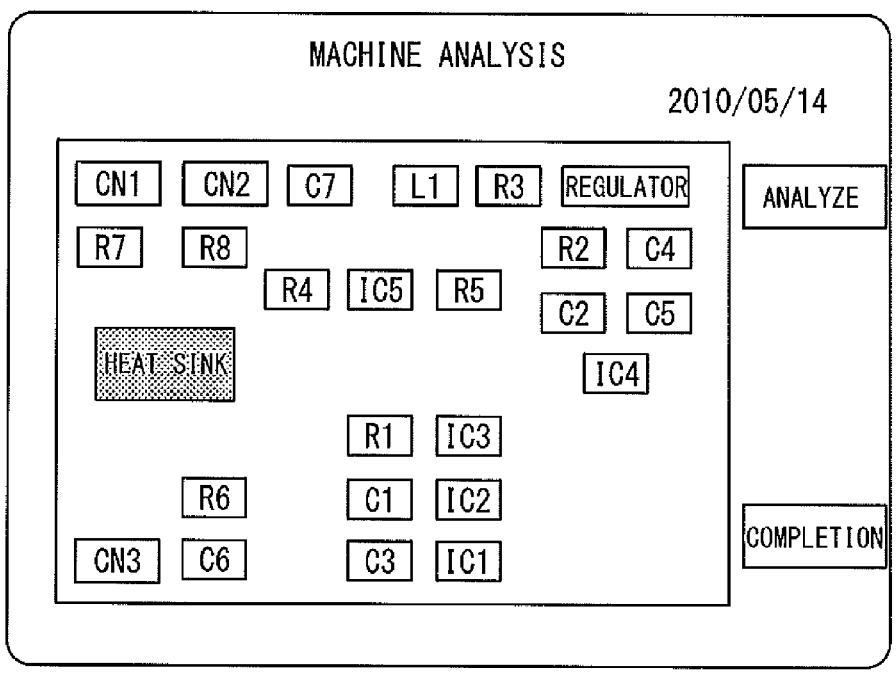
FIG. 30 is a view explaining contents to be displayed on the display part of the display unit when performing analysis process.

In step S417 the on-state or off-state of each switch probe 56 is checked and the color of a part associated with the switch probe in the off-state is changed to red on the display, for example (FIG. 30). FIG. 30 shows that the switch probe 56 associated with a heat sink is in the off-state. The flow returns to step S413.

Then, the operator places the individual switch probes 56 in the off-state in order and confirms that the color of a part associated with the switch probe 56 in question is changed. In a case where the color of a different part is changed, the operator determines that there is a wiring failure in the switch probe 56 in question, and checks the wiring to correct the failure.

In step S413, with the "completion" button having been clicked, the analysis process ends.

Note that the CPU 15's operation by the inspection program when the operator has selected the substrate inspection is almost the same as that in prior art, therefore, a description thereof is omitted.

As described above, the substrate inspection system 1 according to the first embodiment comprises the substrate inspection device including the substrate inspection unit 20 and the CPU 15.

Further, each switch probe 56 according to the first embodiment comprises the first barrel 56b, the first plunger 56a partially contained in the first barrel 56b and biased by the first spring 56c to the set target substrate 31, the second barrel 56e fixed in the first barrel 56b, and the second plunger 56d partially contained in the second barrel 56e and biased by the second spring 56f to the first plunger 56a. It is configured to be placed in the on-state while the first plunger 56a and second plunger 56d contact with each other and be placed in the off-state while they do not contact with each other.

Further, it comprises the fixing mechanism configured to temporarily fix the second plunger 56d in the position (hereinafter, off-position) so that the second plunger 56d does not contact with the first plunger 56a irrespective of the movement of the first plunger 56a to the second plunger 56d by the part mounted in the predetermined position on the target substrate 31.

Moreover, the fixing mechanism can temporarily fix the second plunger 56d in the off-position while the target substrate 31 on which the part is mounted is set in the substrate inspection unit 20 without the need to pull up the top cover 21A.

Accordingly, the switch probes can be placed in the off-state without removing the target substrate 31 from the substrate inspection unit 20 and the part from the target substrate 31. Thus, the substrate inspection unit 20 can dramatically shorten the length of time taken for the inspection compared with the prior art device.

Further, it is able to improve the work efficiency of the operator since the top cover 21A need not be pulled up for placing the switch probe 56 in the off-state.

Further, the corresponding part remains mounted on the target substrate 31 while the switch probe 56 is in the off-state, and the contact probe 26B can be made in contact with the lead wire of the part. Therefore, the wire analysis of the contact probe 26 and that of the switch probe 56 can be continuously conducted.

Accordingly, the substrate inspection system 1 according to the first embodiment incorporating the substrate inspection unit 20 can dramatically shorten the length of time taken for the inspection compared with the prior art device.

The first embodiment has described the switch probes 56 as an example. However, the present invention is not limited to such an example. Alternatively, different switch probes can be used, which will be described as switch probes 56A to 56E in the following. Note that only the differences from the switch probes 56 will be described, the same reference numbers will be given to the same or like parts as those of the switch probe 56, and a description thereof will be omitted or simplified.

Second Embodiment

Figure 31:
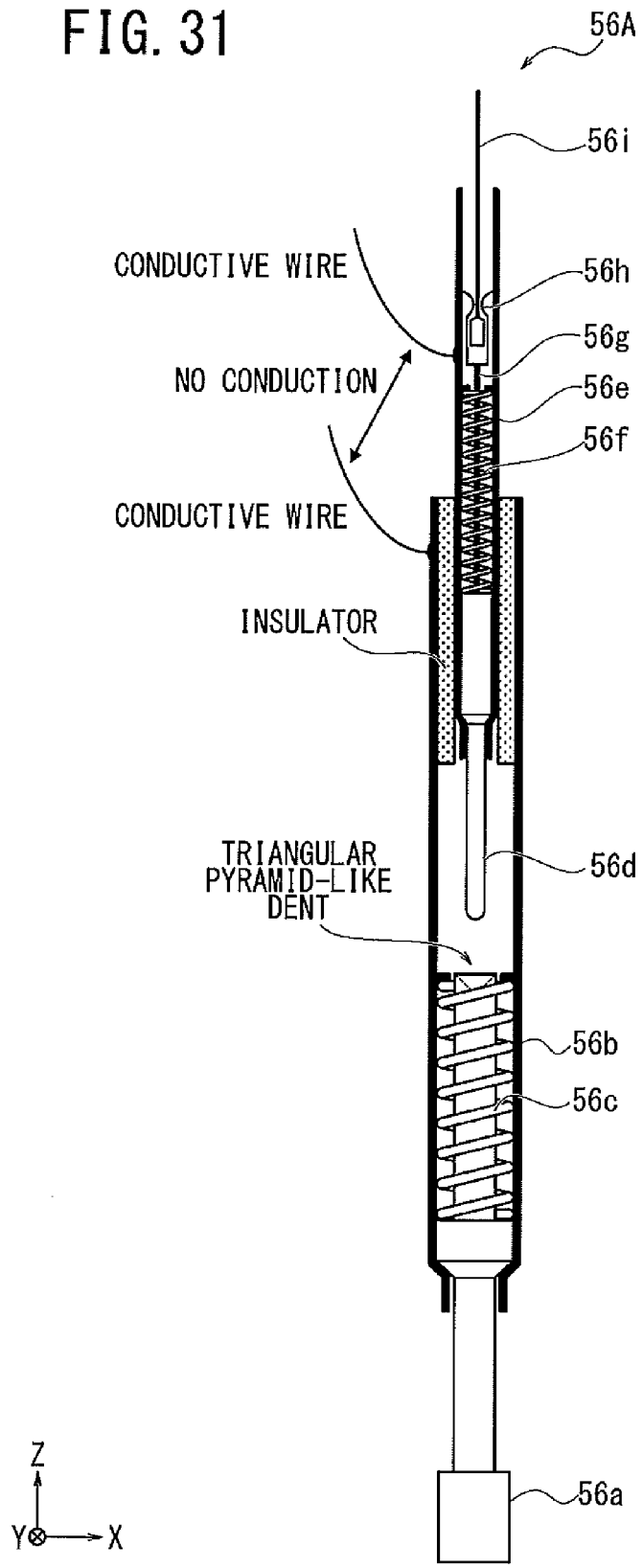
FIG. 31 is a view explaining a second embodiment of the switch probe.

FIG. 31 shows a switch probe 56A according to a second embodiment with the target substrate 31 not set. The switch probe 56b comprises a first plunger 56a, a first barrel 56b, a first spring 56c, a second plunger 56d, a second barrel 56e, a second spring 56f, a rod element 56g, an elastic element 56h, and a manipulation stick 56i.

The elastic element 56h is fixed to the +Z side end of the rod element 56g and comprises a plate spring which elastically deforms in X-axis direction. In the normal state the elastic element 56h is accommodated in the second barrel 56e.

The manipulation stick 56i is engaged with the elastic element 56h at one end on −Z side. The other end thereof is exposed from the second barrel 56e. The operator's pulling up the other end of the manipulation stick 56i moves the elastic element 56h in +Z-axis direction while his/her pressing it moves the elastic element 56h in −Z-axis direction.

While the target substrate 31 is not set or a certain part is not mounted thereon, the first plunger 56a and the second plunger 56d do not contact with each other, and conductive wires connected with the surfaces of the first and second barrels 56b, 56e are not conductive (off-state).

Meanwhile, when the target substrate 31 is set and the certain part is mounted thereon on −Z side of the switch probe 56, the first plunger 56a is moved by the part in +Z direction.

Figure 32:
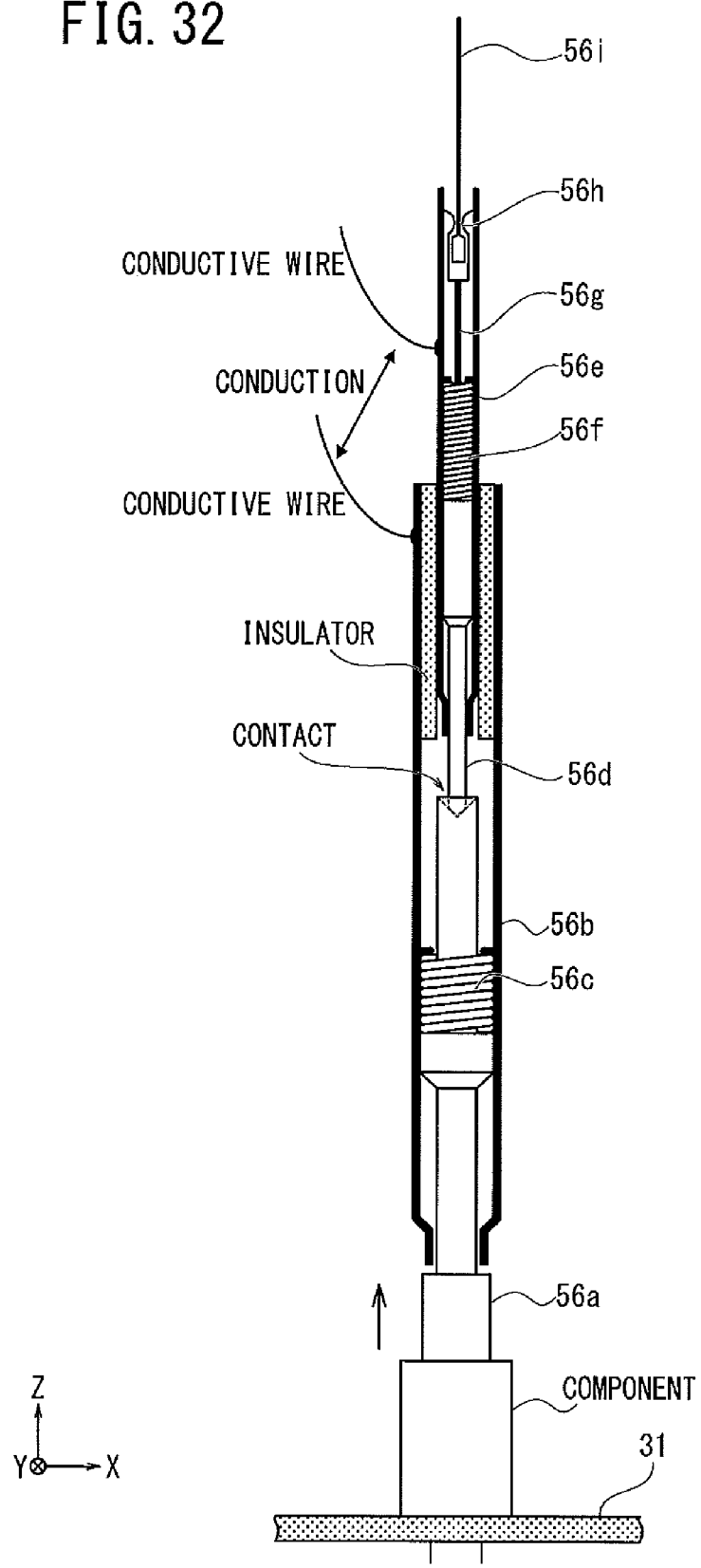
FIG. 32 is a view explaining an ON state of the switch probe of the second embodiment.

Then, the first plunger 56a and the second plunger 56d contact with each other and the conductive wires of the first barrel 56b and the second barrel 56e become conductive (on-state) as shown in FIG. 32.

Figure 33:
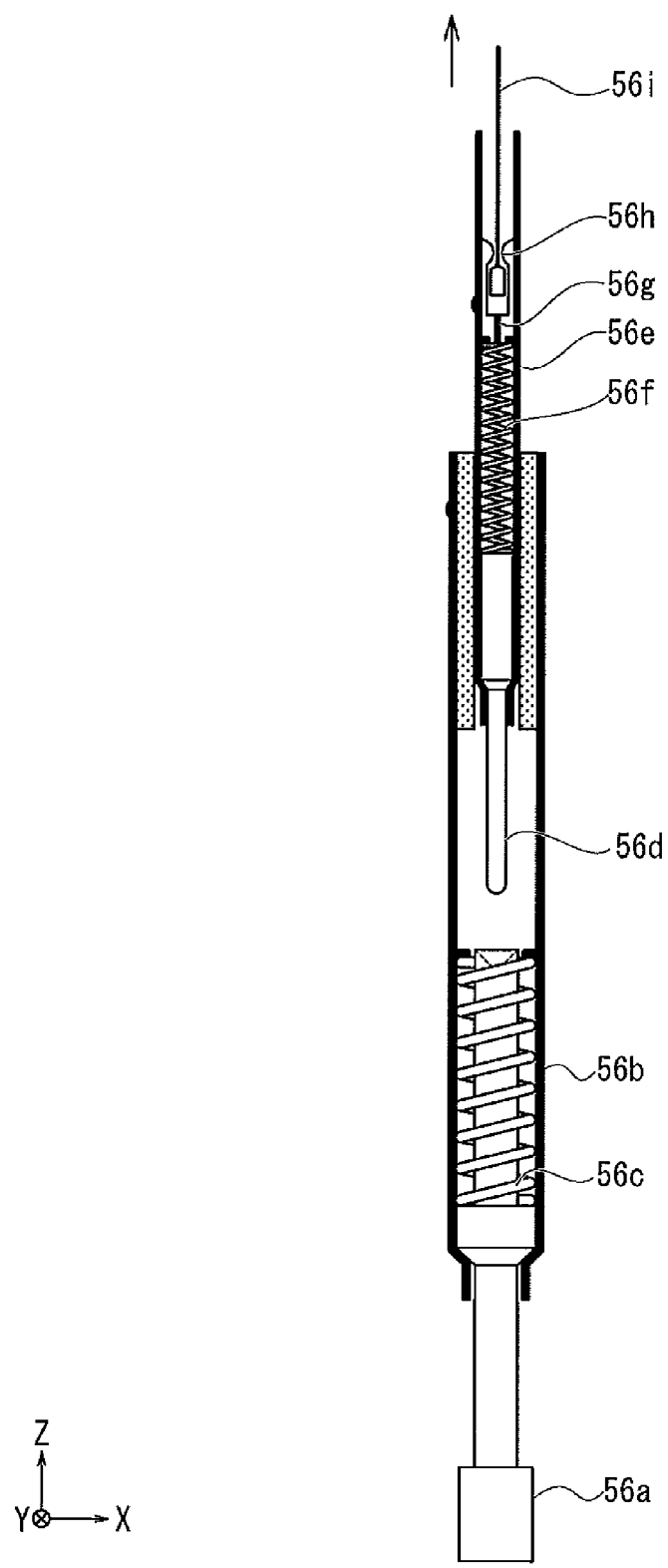
FIG. 33 is a view explaining an operation of an operator when the switch probe of the second embodiment is set to be in the OFF state.
Figure 34:
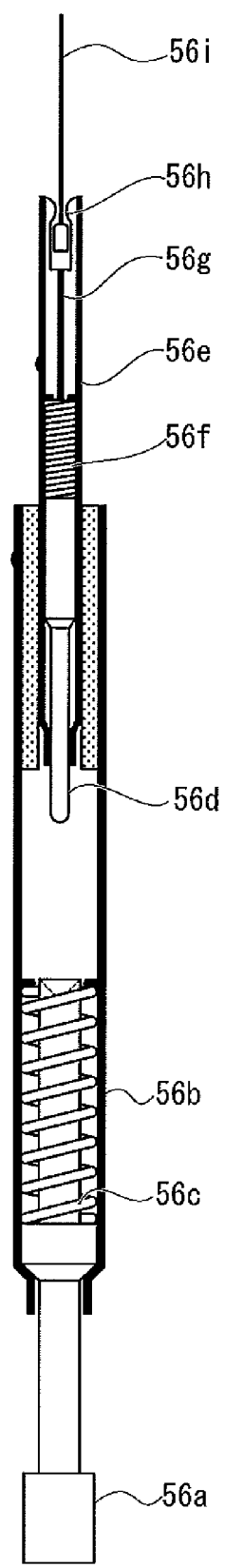
FIG. 34 is a view explaining an operation of an operator when the switch probe of the second embodiment is set to be in the OFF state.

For placing the switch probe 56A in the off-state, the operator pulls up the manipulation stick 56i in +Z direction to pull out the other end of the elastic element 56h from the end of the second barrel 56e and expand it in a direction orthogonal to the Z-axis, and releases the manipulation stick 56i, as shown in FIG. 33. Thereby, the elastic element 56h is retained at the +Z side end of the second barrel 56e. In this case, the +Z side end of the second barrel 56e functions as the engaging portion.

Figure 35:
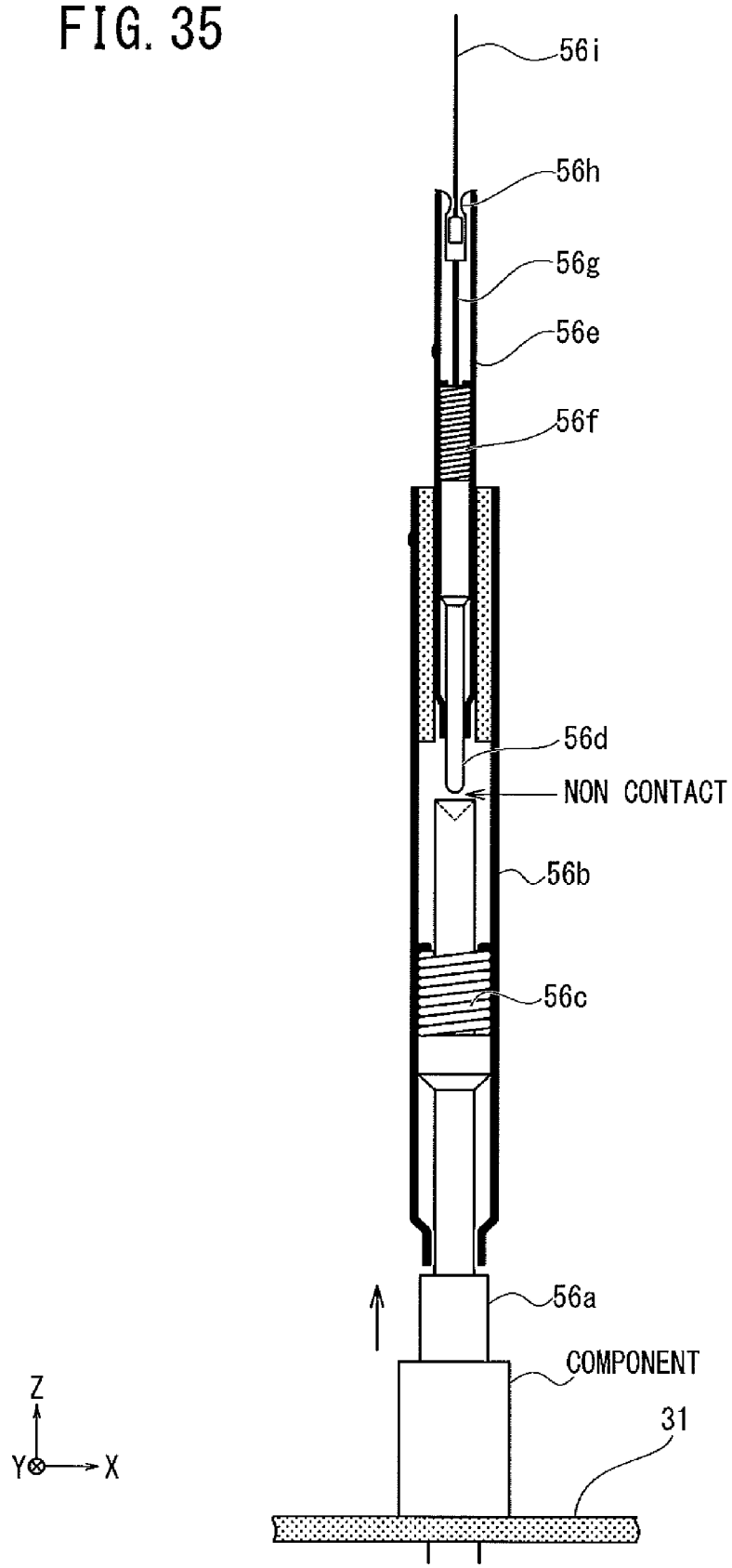
FIG. 35 is a view explaining a continuous OFF state of the switch probe in the second embodiment.

Thus, the first and second plungers 56a, 56d are prevented from contacting with each other even when the first plunger 56a is moved in +Z direction by the part mounted on the target substrate 31 (FIG. 35). Accordingly, the switch probe 56A is placed in the off-state.

Figure 36:
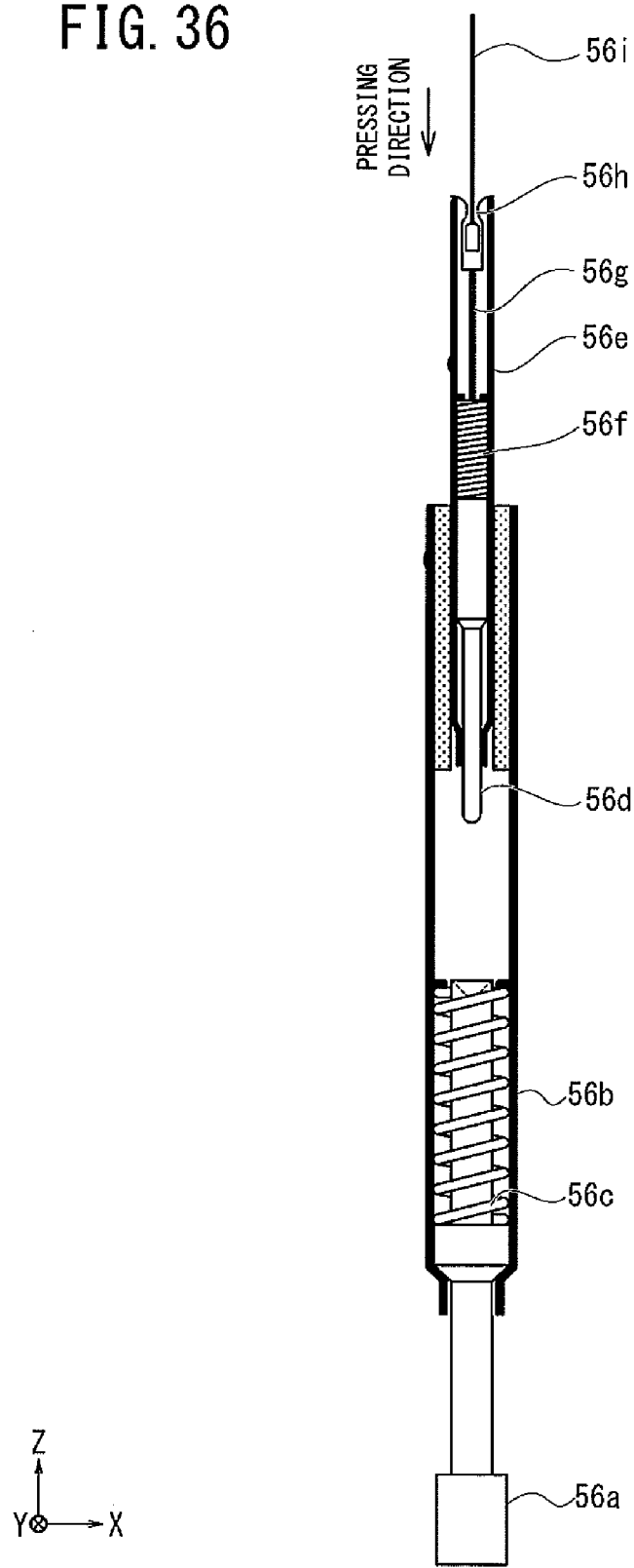
FIG. 36 is a view explaining an operation of an operator when changing the switch probe of the second embodiment from the continuous OFF state to a normal state.

For bringing back the switch probe 56A to the normal state from the off-state, the operator presses the manipulation stick 56i in −Z direction to release the engagement of the elastic element 56h with the end of the second barrel 56e as shown in FIG. 36. By the elastic force of the second spring 56f, the second plunger 56d is moved to a position so that it contacts with the first plunger 56a when pressed by the part.

Alternatively, it can be configured that the second plunger 56d is pressed into the second barrel 56e by the first plunger 56a to engage the elastic element 56h with the +Z side end of the second barrel 56e when an amount of pressing the first plunger 56a into the first barrel 56b reaches about the maximum amount. In this case the switch probe 56A can exclude the manipulation stick 56i for placing the switch probe 56 into the off-state. However, depending on a part on the target substrate 31, the amount of pressing the first plunger 56a need be set to a smaller value than about the maximum amount.

Third Embodiment

Figure 37:
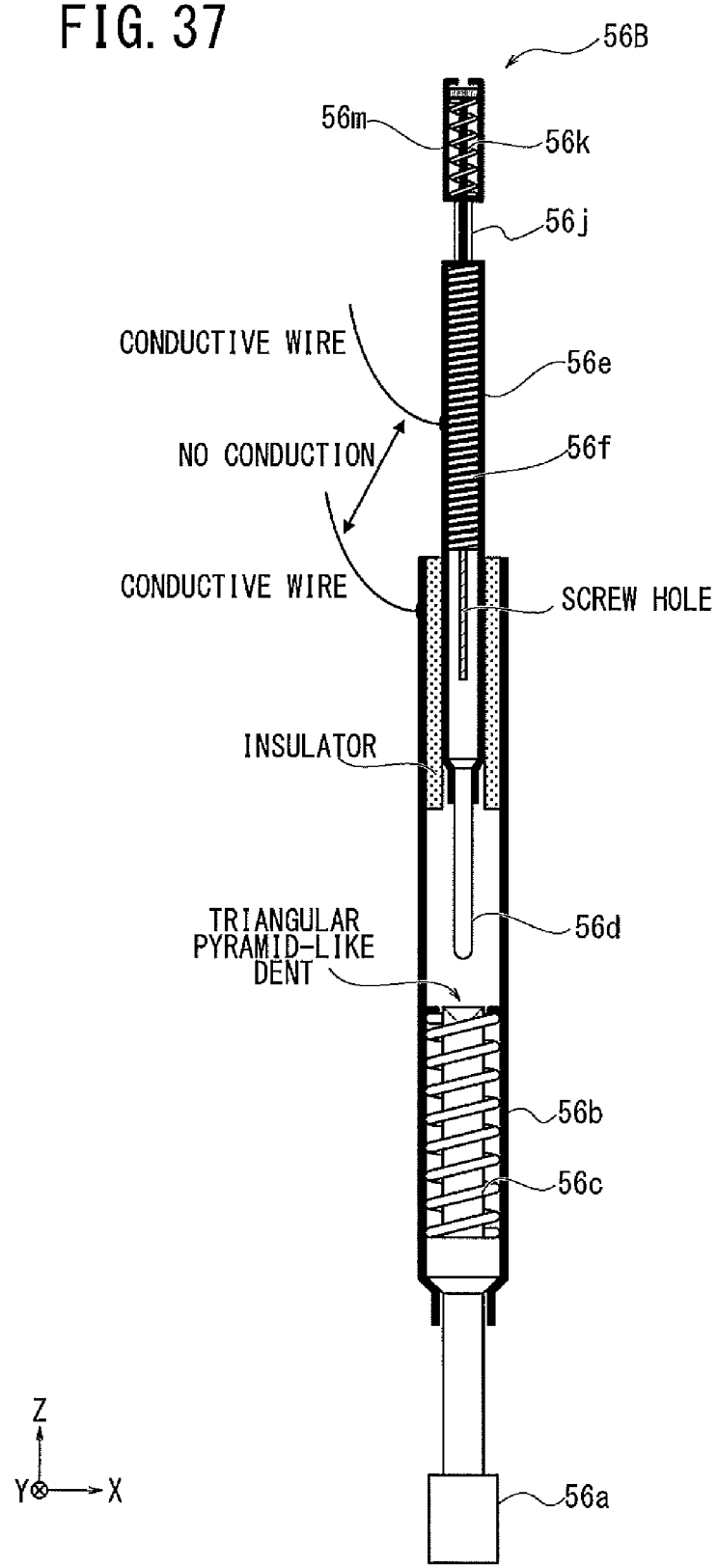
FIG. 37 is a view explaining the switch probe according to a third embodiment.

FIG. 37 shows a switch probe 56B according to a third embodiment. The switch probe 56B comprises a first plunger 56, a first barrel 56b, a first spring 56c, a second plunger 56d, a second barrel 56e, a second spring 56f, a screw 56j, a third spring 56k, and a spring bearing 56m. FIG. 37 shows the switch probe 56B with the target substrate 31 not set.

The second plunger 56d includes a screw hole in a predetermined length from one end in −Z direction.

The screw 56j has, at one end on +Z side, a head with thread grooves into which the tip of a driver is fitted and a part thereof on the other side is inserted into the second barrel 56e via the opening of the bottom face thereof. The screw 56j is screwed into the screw hole of the second plunger 56d.

The screw bearing 56m is provided on +Z side of the second barrel 56e via a narrow portion and contains the head of the screw 56j and the third spring 56k. The screw 56j is biased by the third spring 56k in +Z direction.

The elastic force of the third spring 56k is set to be smaller than that of the second spring 56f. An opening into which a driver for turning the screw 56j is inserted is formed in the end face of the screw bearing 56m on +Z side.

With the target substrate 31 not set or the certain part not mounted thereon, the first and second plungers 56a, 56d do not contact with each other and the conductive wires connected with the surfaces of the first and second barrels 56b, 56e are not conductive (off-state).

Figure 38:
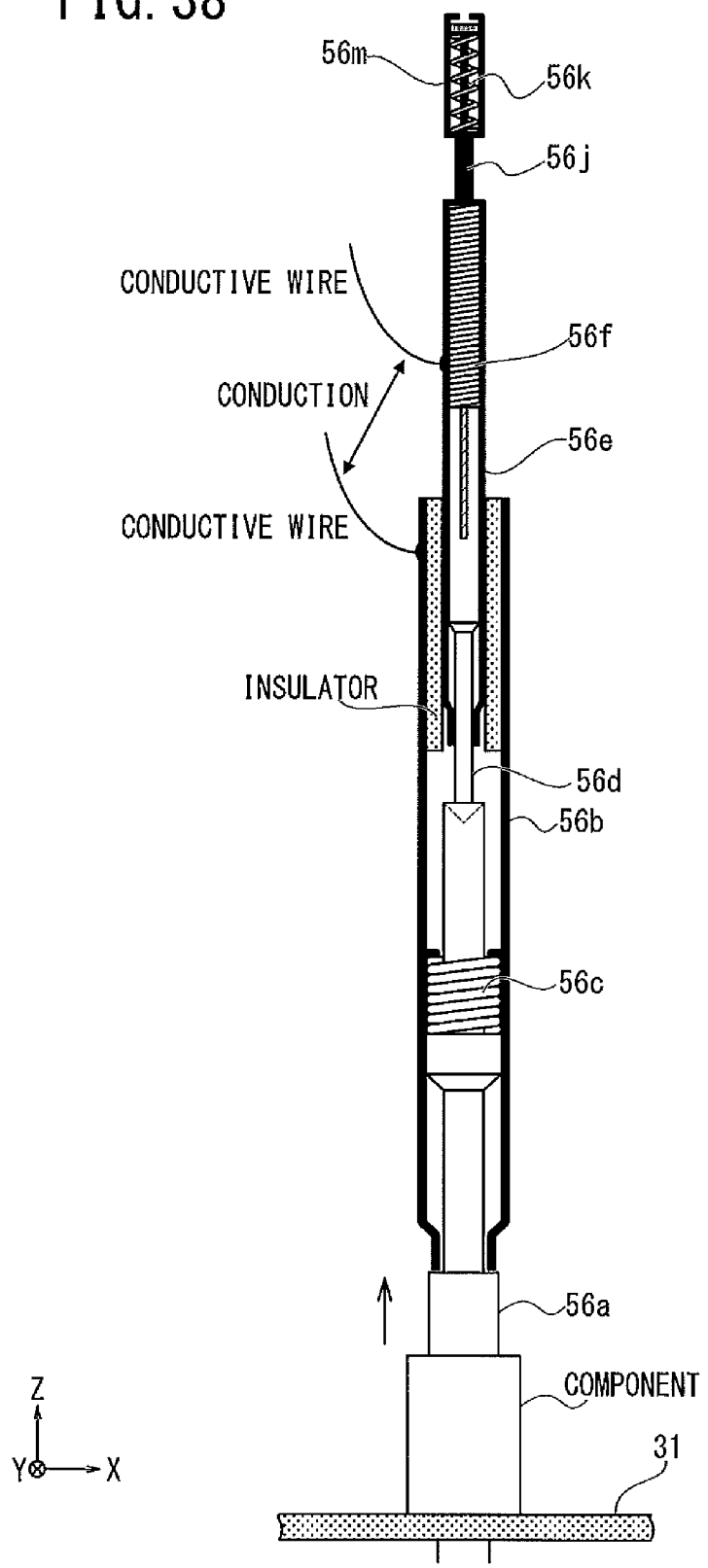
FIG. 38 is a view explaining the ON state of the switch probe of the third embodiment.

Meanwhile, with the target substrate 31 set and the certain part mounted thereon on −Z side of the switch probe 56B, the first plunger 56a is moved by the part in +Z direction. As shown in FIG. 38, the first and second plungers 56a, 56d contact with each other and the conductive wires connected with the surfaces of the first and second barrels 56b, 56e become conductive (on-state).

Figure 39:
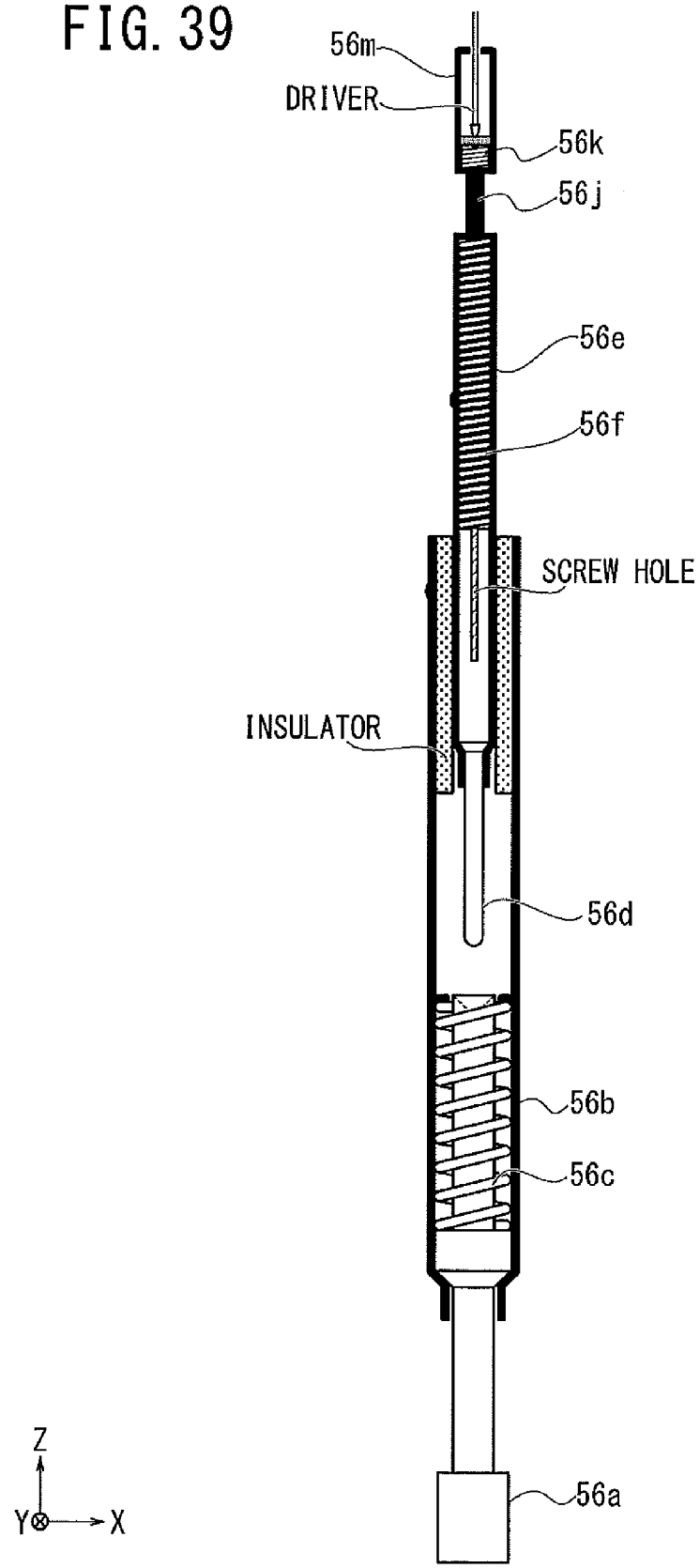
FIG. 39 is a view explaining an operation of an operator when the switch probe of the third embodiment is set to be in the OFF state.
Figure 40:
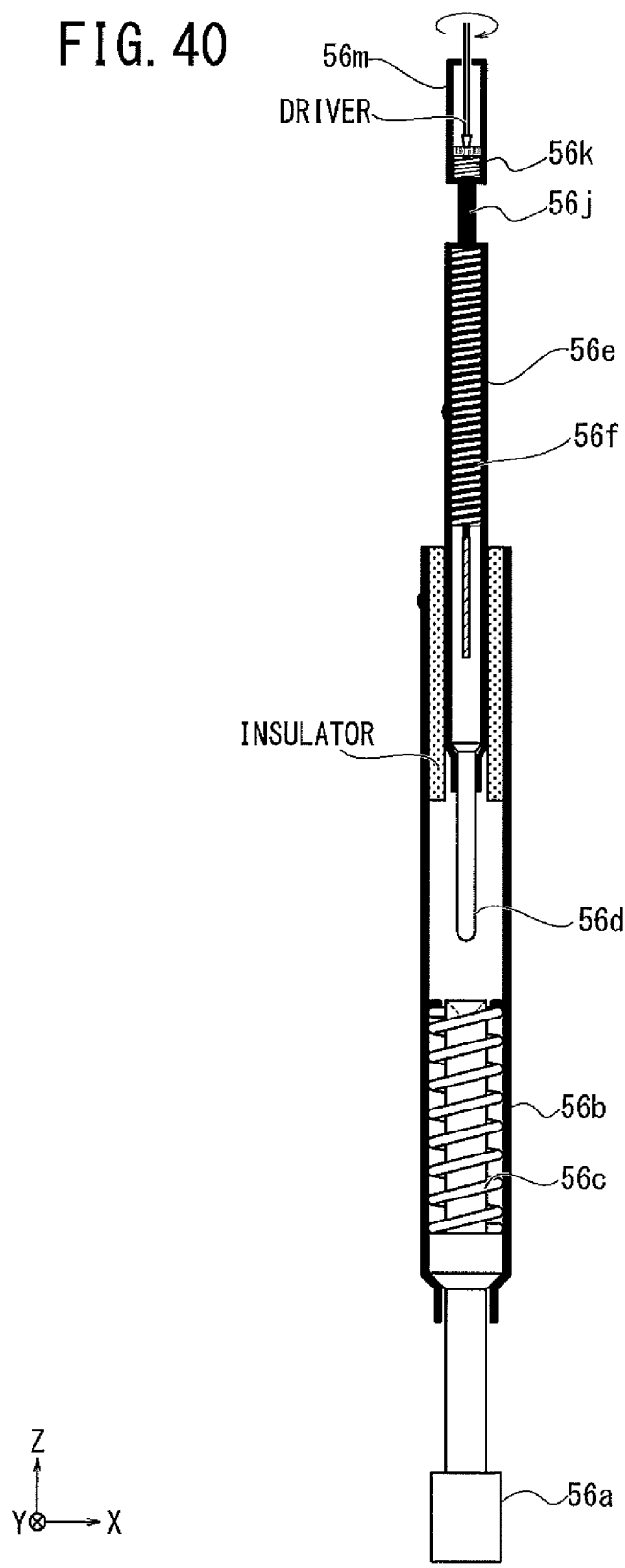
FIG. 40 is a view explaining an operation of an operator when the switch probe of the third embodiment is set to be in the OFF state.
Figure 41:
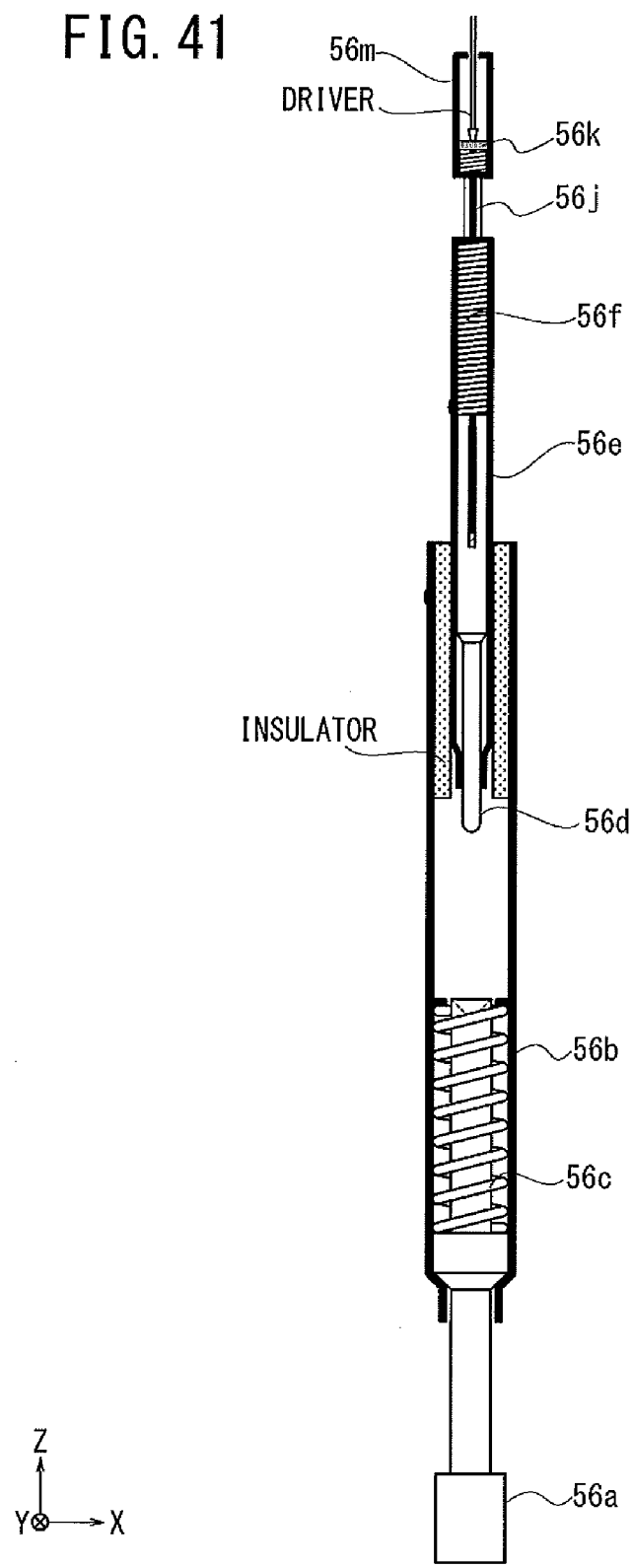
FIG. 41 is a view explaining an operation of an operator when the switch probe of the third embodiment is set to be in the OFF state.

For placing the switch probe 56b in the off-state, the operator inserts the driver into the opening of the screw bearing 56m to press the tip end of the screw 56j onto the second plunger 56d (FIG. 39). Then, the operator screws the tip end of the second plunger 56d into the screw hole while turning the driver to fasten the screw (FIG. 40). Thereby, the second plunger 56d is plunged into the second barrel 56e. The driver is continuously turned until the plunge amount of the second plunger 56d reaches a predetermined amount (FIG. 41) and then it is stopped turning and removed from the screw bearing 56m.

Figure 42:
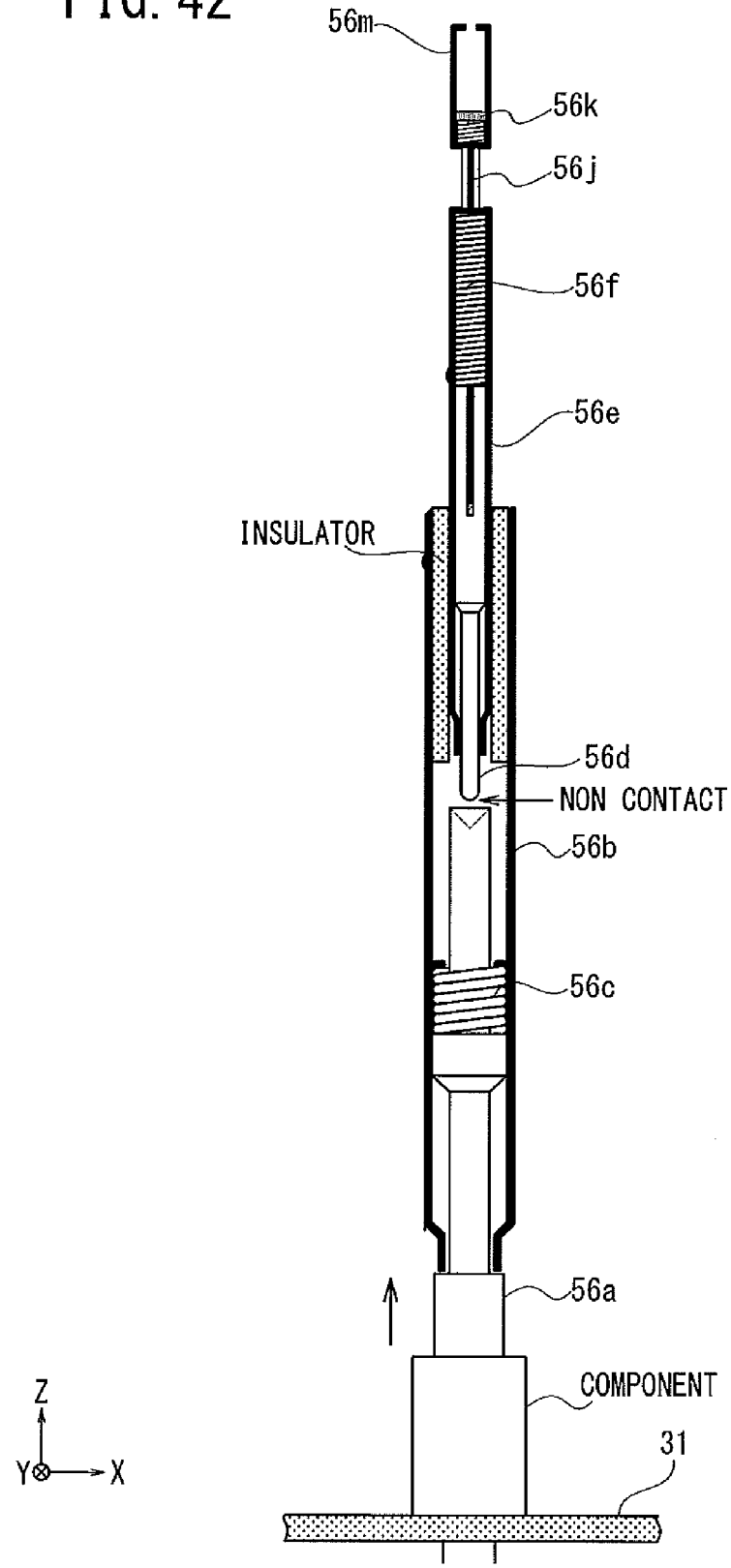
FIG. 42 is a view explaining the continuous OFF state of the switch probe of the third embodiment.

Thus, the first and second plungers 56a, 56d are prevented from contacting with each other even when the first plunger 56a is moved in +Z direction by the part mounted on the target substrate 31 (FIG. 42). The switch probe 56B is placed in the off-state.

For bringing back the switch probe 56A into the normal state from the off-state, the operator inserts the driver into the opening of the screw bearing 56m and turns the driver to loosen the screw 56j so that the tip end of the screw 56j is receded from the screw hole of the second plunger 56d. The second plunger 56d starts protruding from the second barrel 56e. The driver is kept turning until the tip end of the screw 56j is dropped out of the screw hole of the second plunger 56d. When the turning of the driver stops, the second plunger 56d sharply rises by the elastic force of the second spring 56f. Then, the driver is removed from the screw bearing 56m.

According to the switch probe 56B, the position of the second plunger 56d is freely adjustable in the Z-axis direction. That is, the plunge amount of the first plunger 56a for turning on the switch probe is adjustable.

Figure 43A:
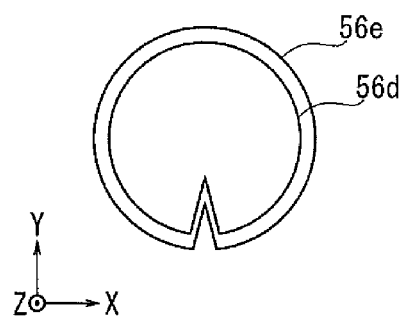
FIG. 43A is a view explaining a rotation preventing mechanism for preventing a second plunger from rotating.
Figure 43B:
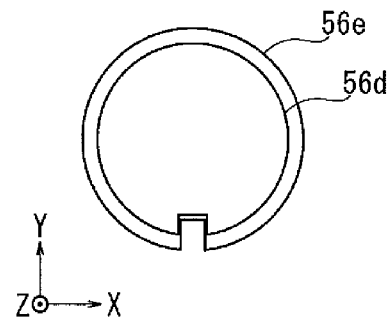
FIG. 43B is a view explaining the rotation preventing mechanism for preventing the second plunger from rotating.
Figure 44A:
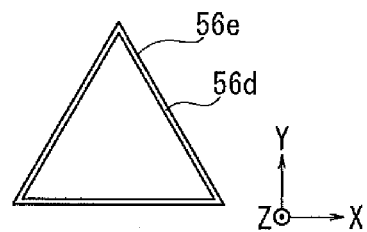
FIG. 44A is a view explaining a cross-section shape of the second plunger and a second barrel which have the rotation preventing mechanism.
Figure 44B:
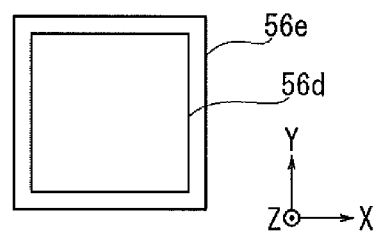
FIG. 44B is a view explaining a cross-section shape of the second plunger and the second barrel which have the rotation preventing mechanism.
Figure 44C:
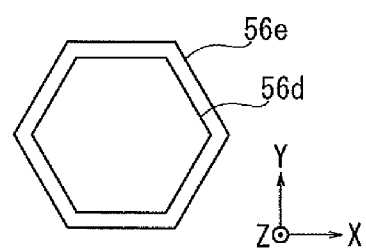
FIG. 44C is a view explaining a cross-section shape of the second plunger and the second barrel which have the rotation preventing mechanism.

Furthermore, the switch probe 56B comprises a rotation preventing mechanism for the second plunger 56d in the second plunger 56d and the second barrel 56e as shown in FIG. 43A for example. Alternatively, the rotation preventing mechanism can be one in FIG. 43B or ones in FIGS. 44A to 44C having cross sections of a shape to prevent the second plunger 56d and the second barrel 56e from rotating, for example.

Fourth Embodiment

Figure 45:
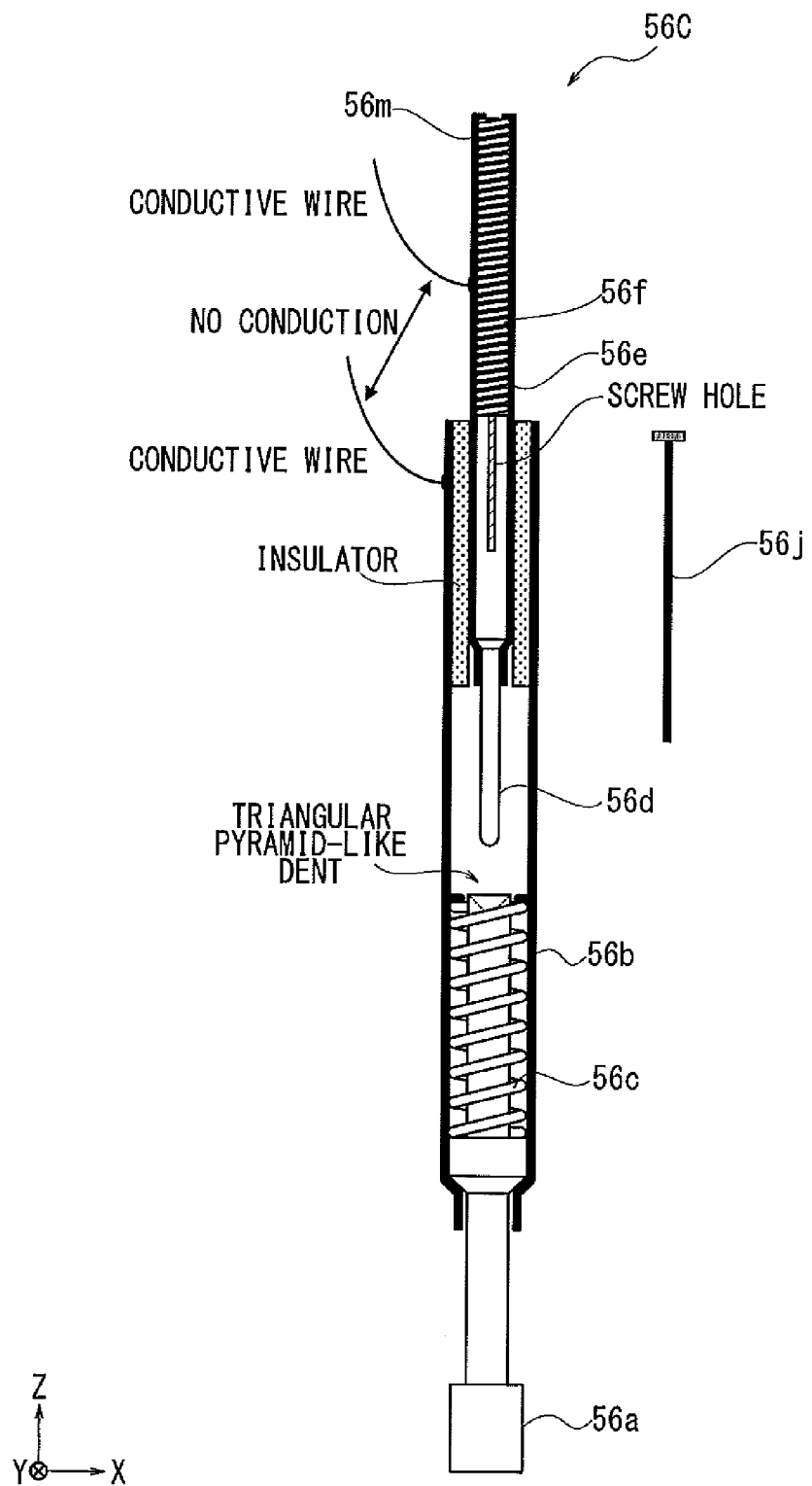
FIG. 45 is a view explaining the switch probe according to a fourth embodiment.

FIG. 45 shows a switch probe 56C according to a fourth embodiment. The switch probe 56C is different from the switch probe 56B in that the screw 56j is not detachable and it excludes the third spring 56k and the screw bearing 56m.

With the target substrate 31 not set or the certain part not mounted thereon, the first and second plungers 56a, 56d do not contact with each other and the conductive wires connected with the surfaces of the first and second barrels 56b, 56e are not conductive (off-state).

Figure 46:
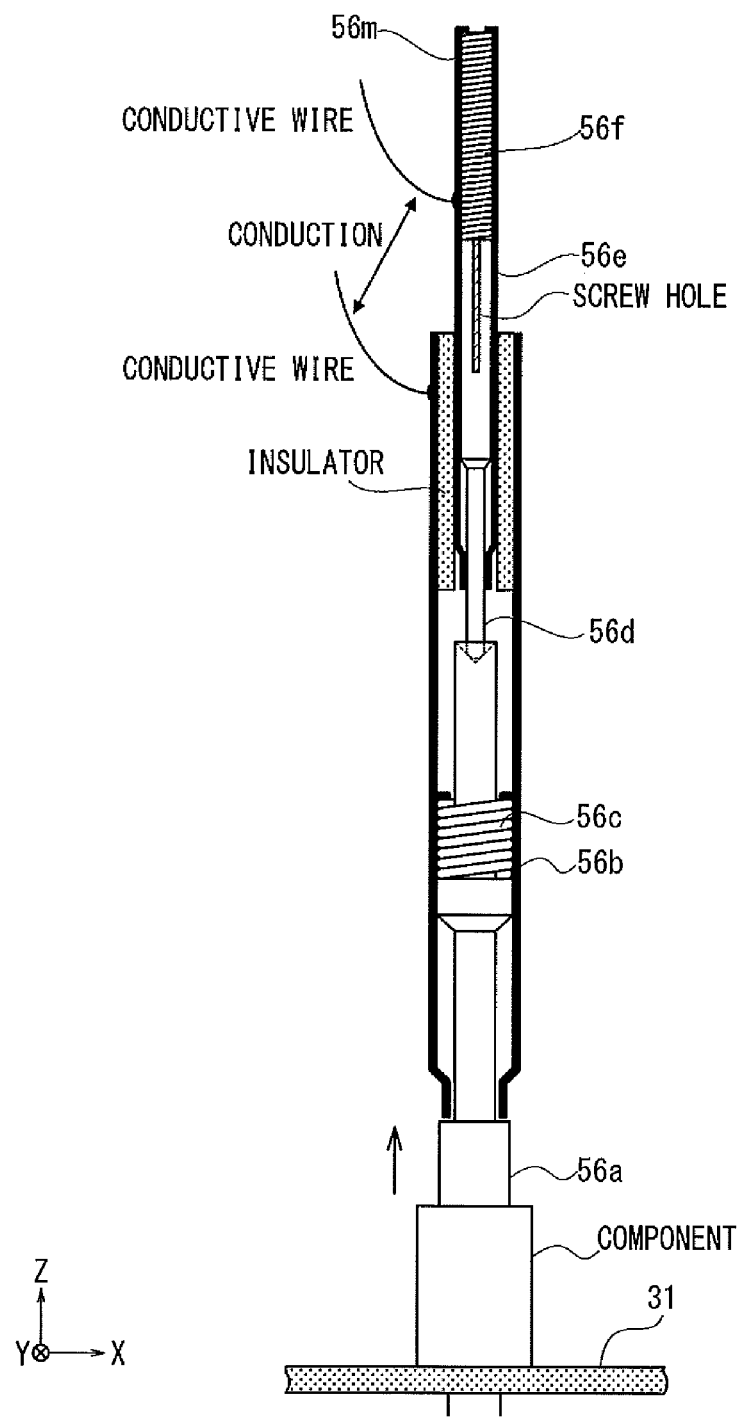
FIG. 46 is a view explaining the ON state of the switch probe of the fourth embodiment.

Meanwhile, with the target substrate 31 set or the certain part and mounted thereon on −Z side of the switch probe 56C, the first plunger 56a is moved by the part in +Z direction. The first and second plungers 56a, 56d contact with each other and the conductive wires connected with the surfaces of the first and second barrels 56b, 56e become conductive (on-state) as shown in FIG. 46.

Figure 47:
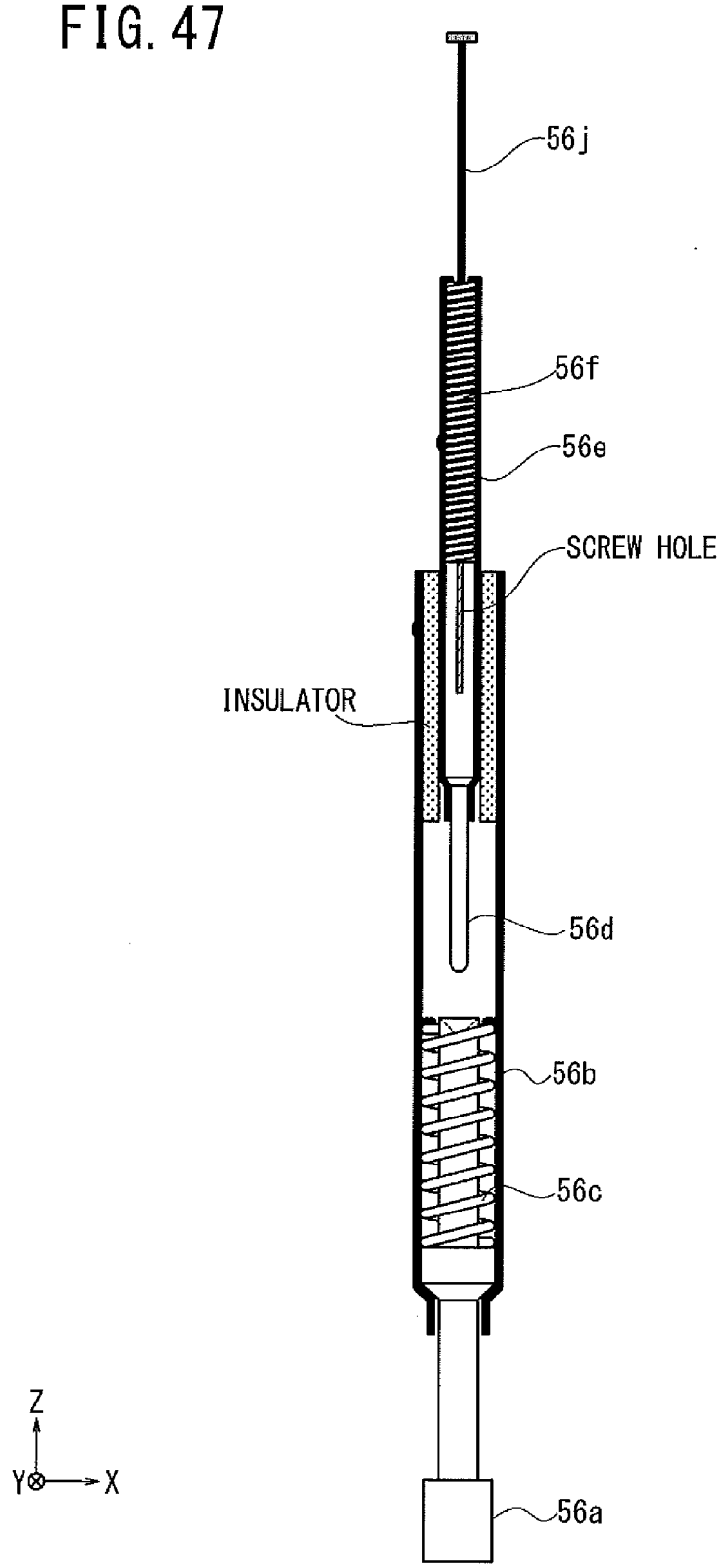
FIG. 47 is a view explaining an operation of an operator when the switch probe of the fourth embodiment is set to be in the OFF state.
Figure 48:
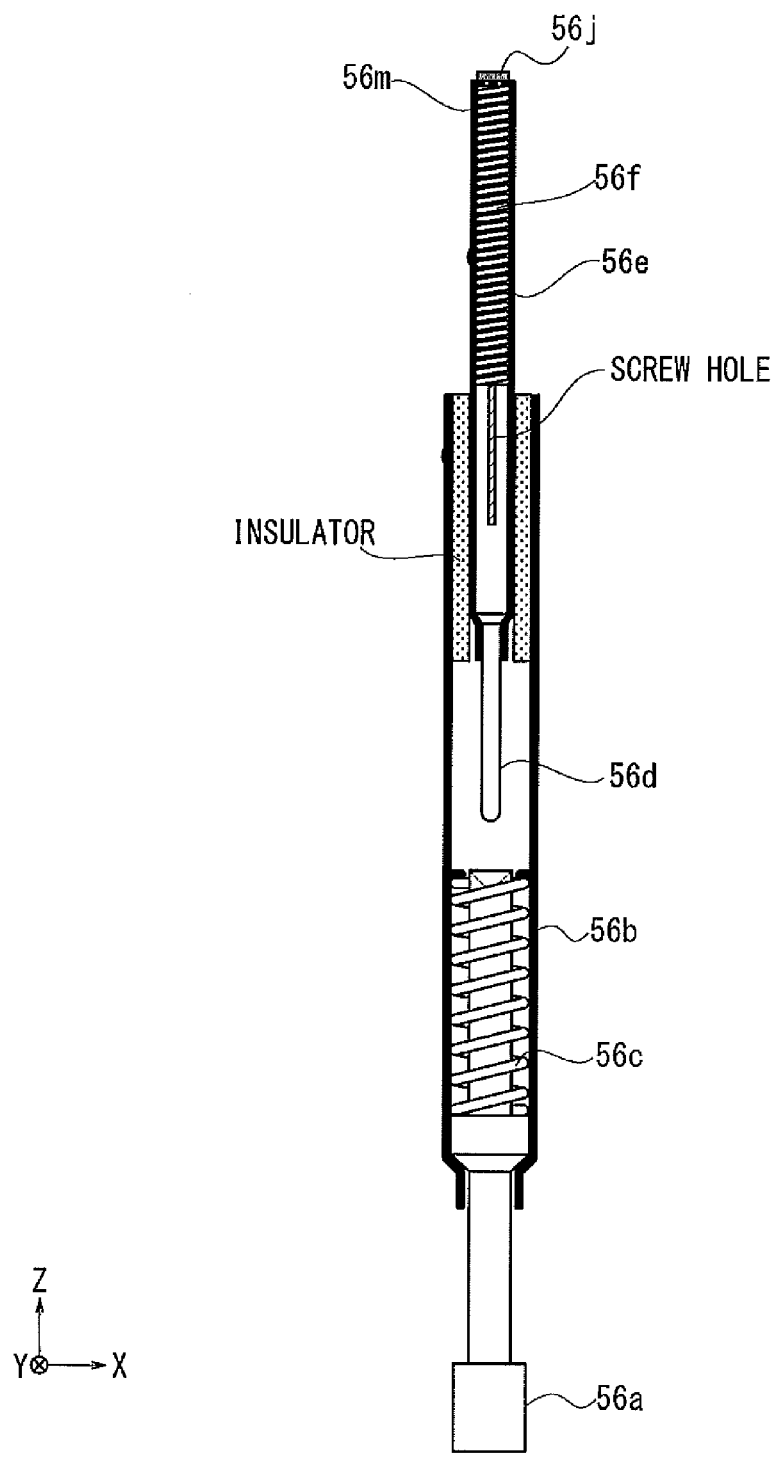
FIG. 48 is a view explaining an operation of an operator when the switch probe of the fourth embodiment is set to be in the OFF state.
Figure 49:
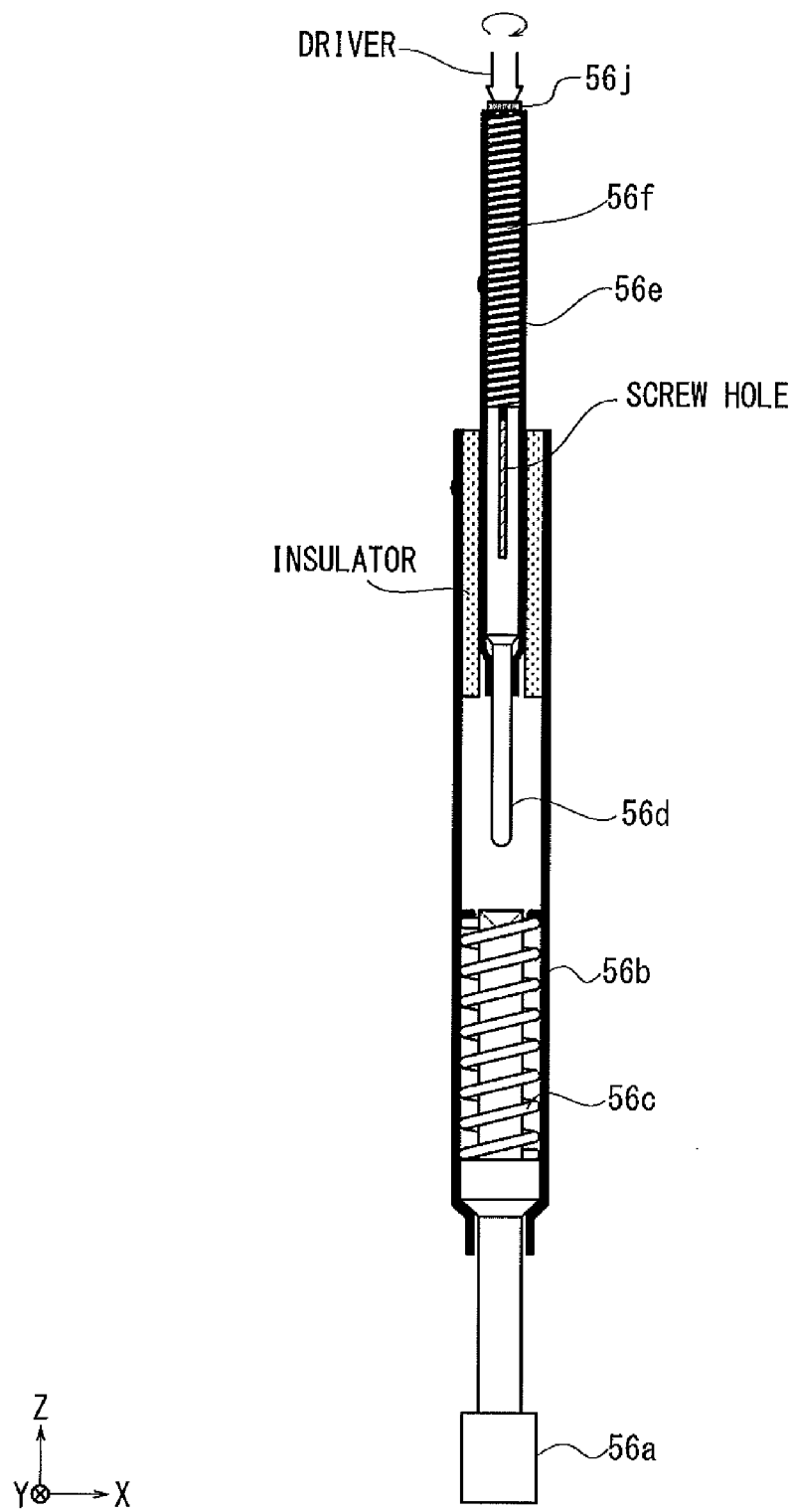
FIG. 49 is a view explaining an operation of an operator when the switch probe of the fourth embodiment is set to be in the OFF state.
Figure 50:
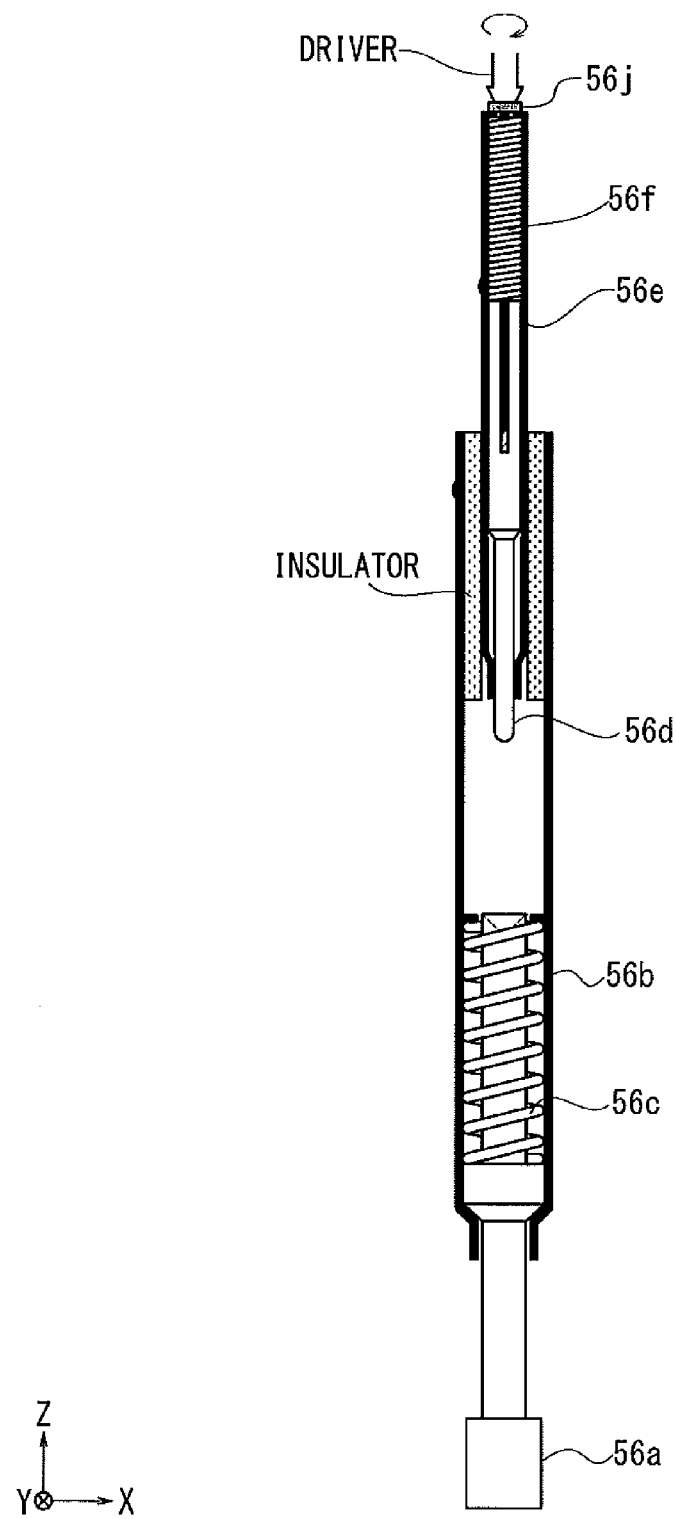
FIG. 50 is a view explaining an operation of an operator when the switch probe of the fourth embodiment is set to be in the OFF state.

For placing the switch probe 56C in the off-state, the operator inserts the screw 56j into the opening of +Z side end of the second barrel 56e (FIG. 47) to press the tip end of the screw 56j onto the second plunger 56d (FIG. 48). Then, the operator screws the tip end of the screw 56j into the second plunger 56d while turning the driver to fasten the screw (FIG. 49). Thereby, the second plunger 56d is plunged into the second barrel 56e. The driver is continuously turned until the plunge amount of the second plunger 56d reaches a predetermined amount (FIG. 41) and then the turning of the screw 56j is stopped (FIG. 50).

Figure 51:
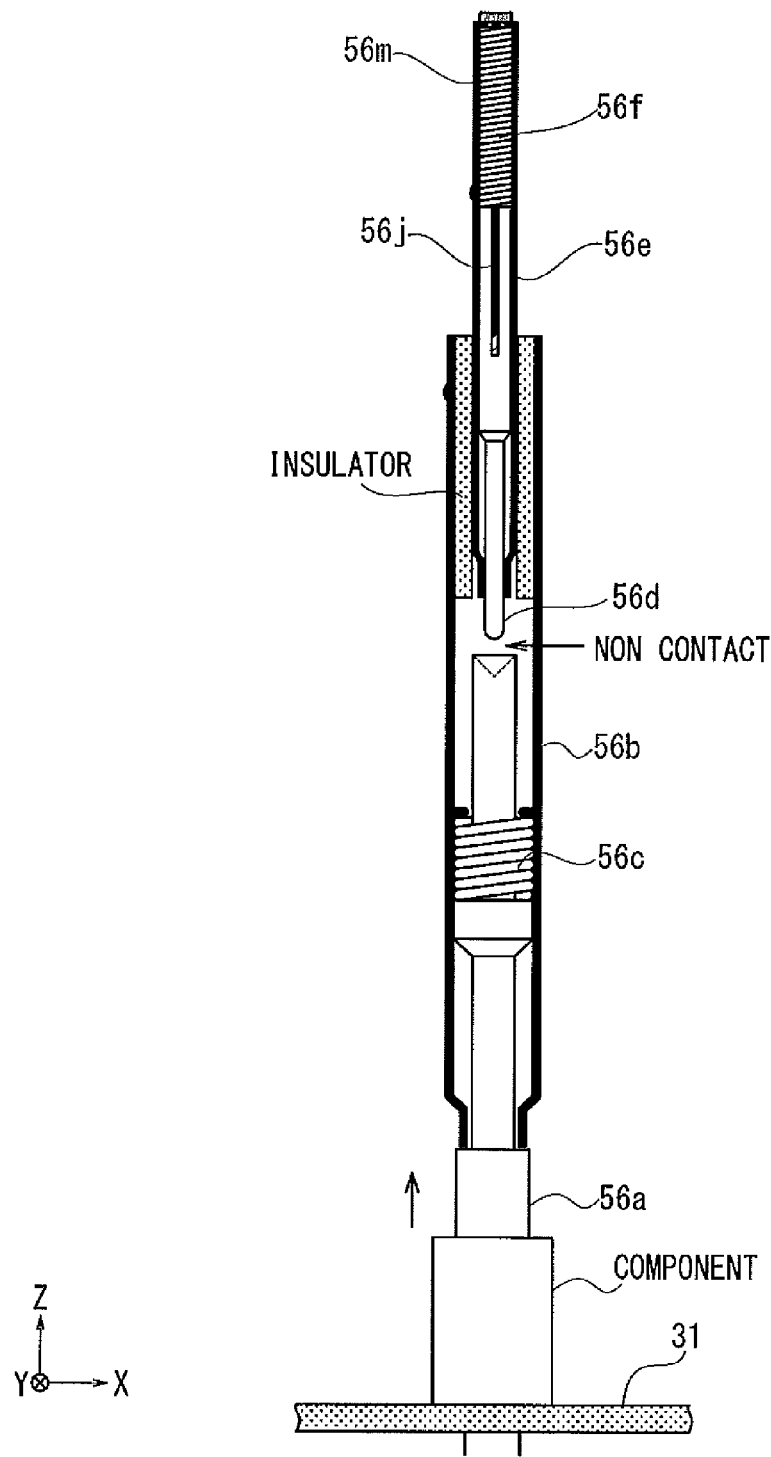
FIG. 51 is a view explaining the continuous OFF state of the switch probe of the fourth embodiment.

Thereby, the first and second plungers 56a, 56d are prevented from contacting with each other even when the first plunger 56a is moved in +Z direction by the part mounted on the target substrate 31 (FIG. 51). The switch probe 56C is placed in the off-state.

According to the switch probe 56C, the position of the second plunger 56d is freely adjustable in the Z-axis direction. That is, the plunge amount of the first plunger 56a for tuning on the switch probe is adjustable. Moreover, without the need to provide the screw 56j for every switch probe, the manufacture costs can be reduced.

Similarly to the switch probe 56B, the switch probe 56C comprises a rotation preventing mechanism for the second plunger 56d in the second plunger 56d and the second barrel 56e.

Fifth Embodiment

Figure 52:
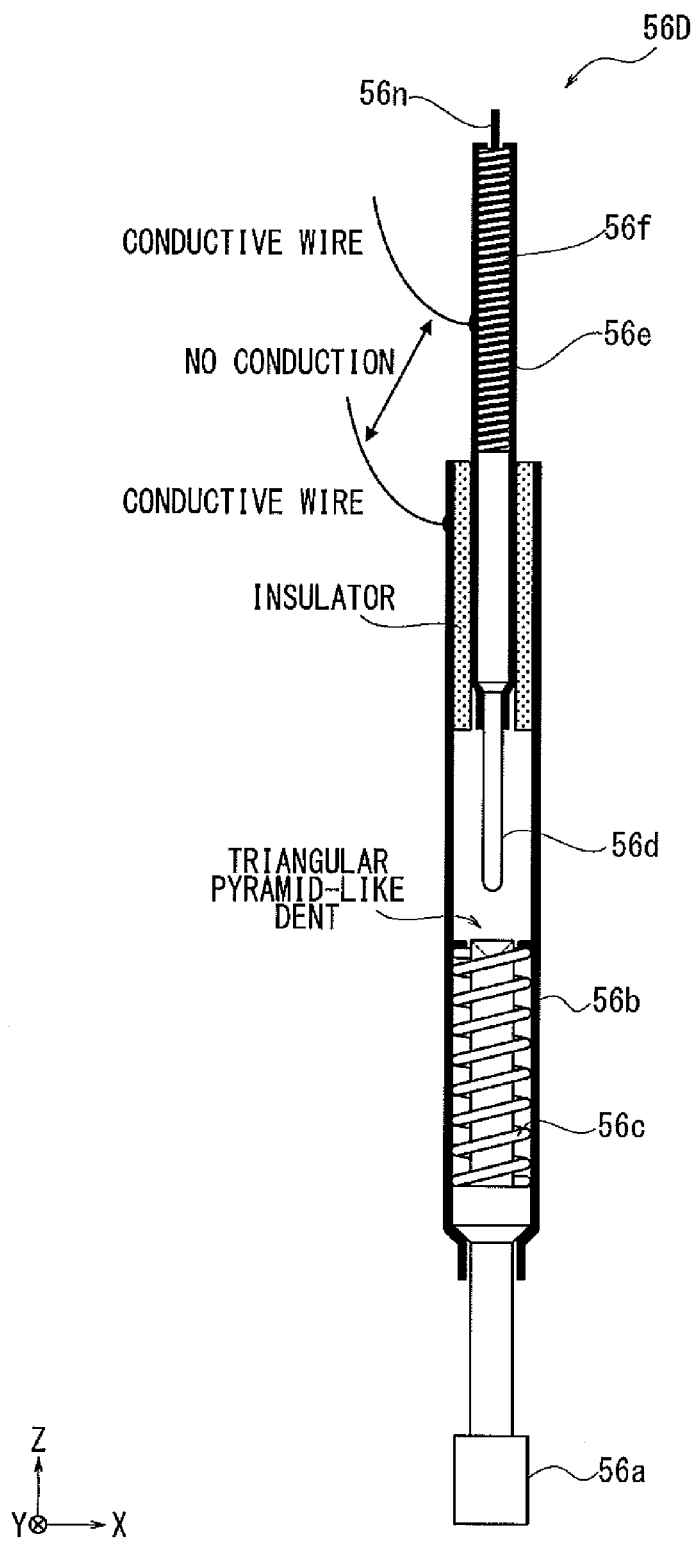
FIG. 52 is a view explaining the switch probe according to a fifth embodiment.
Figure 53:
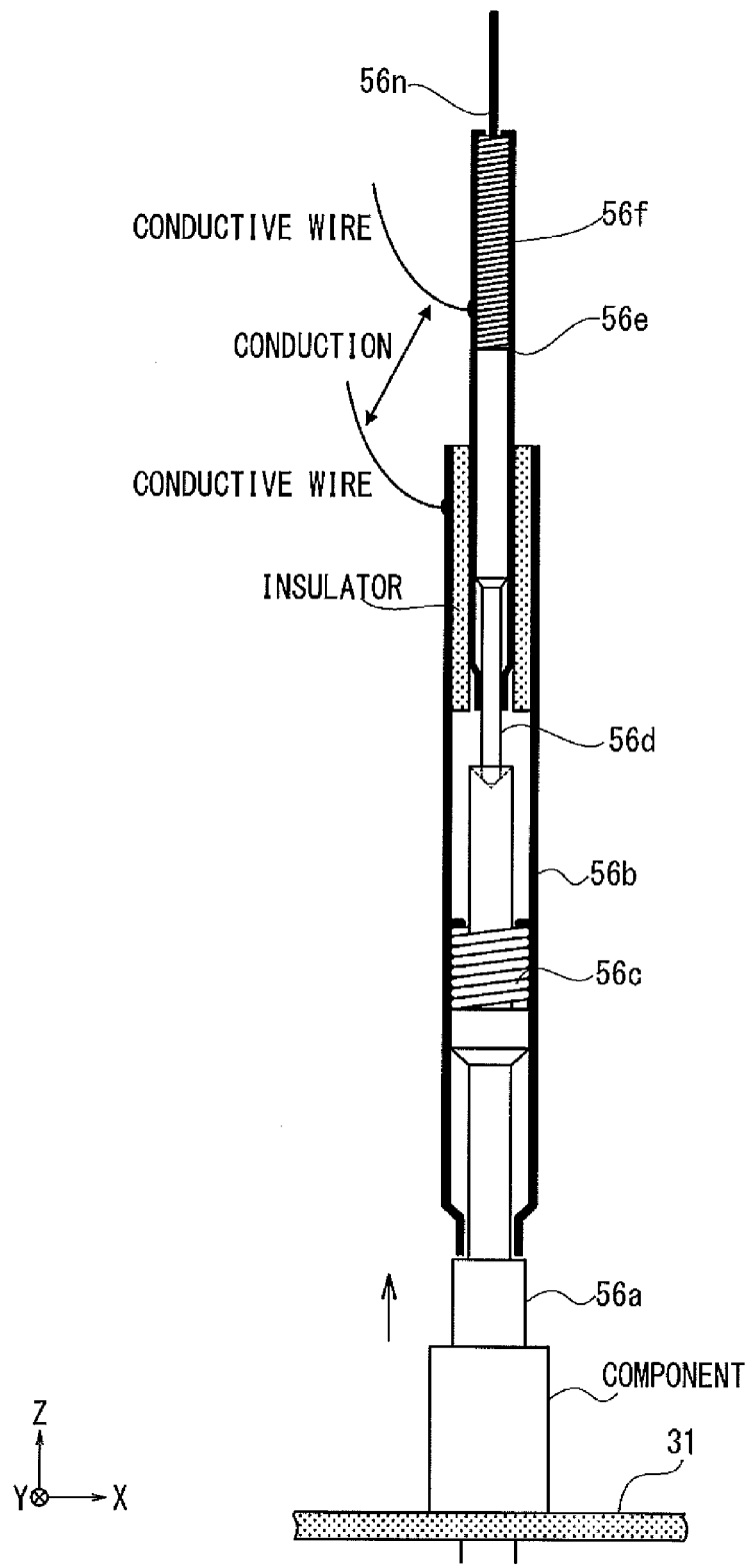
FIG. 53 is a view explaining the ON state of the switch probe of the fifth embodiment.

FIG. 52 shows a switch probe 56D according to a fifth embodiment. The switch probe 56D comprises a first plunger 56a, a first barrel 56b, a first spring 56c, a second plunger 56d, a second barrel 56e, a second spring 56f and a threaded rod 56n. FIG. 52 shows the switch probe 56D with the target substrate 31 not set.

The threaded rod 56n is fixed at one end on the second plunger 56d on +Z side, and the other end thereof is exposed from the second barrel 56e.

With the target substrate 31 not set or the certain part not mounted thereon, the first and second plungers 56a, 56d do not contact with each other and the conductive wires connected with the surfaces of the first and second barrels 56b, 56e are not conductive (off-state).

Meanwhile, with the target substrate 31 set or the certain part mounted thereon on −Z side of the switch probe 56D, the first plunger 56a is moved by the part in +Z direction.

Then, the first and second plungers 56a, 56d contact with each other and the conductive wires connected with the surfaces of the first and second barrels 56b, 56e become conductive (on-state).

Figure 54:
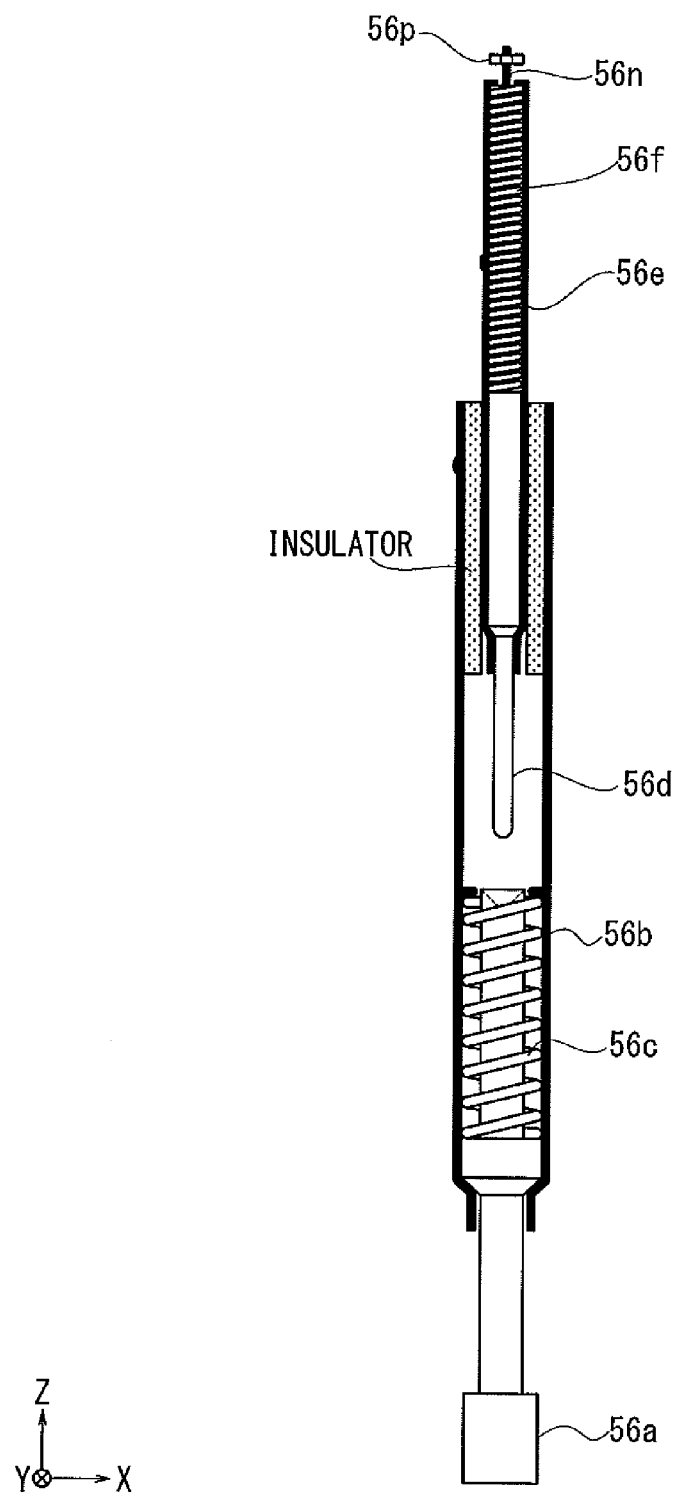
FIG. 54 is a view explaining an operation of an operator when the switch probe of the fifth embodiment is set to be in the OFF state.
Figure 55:
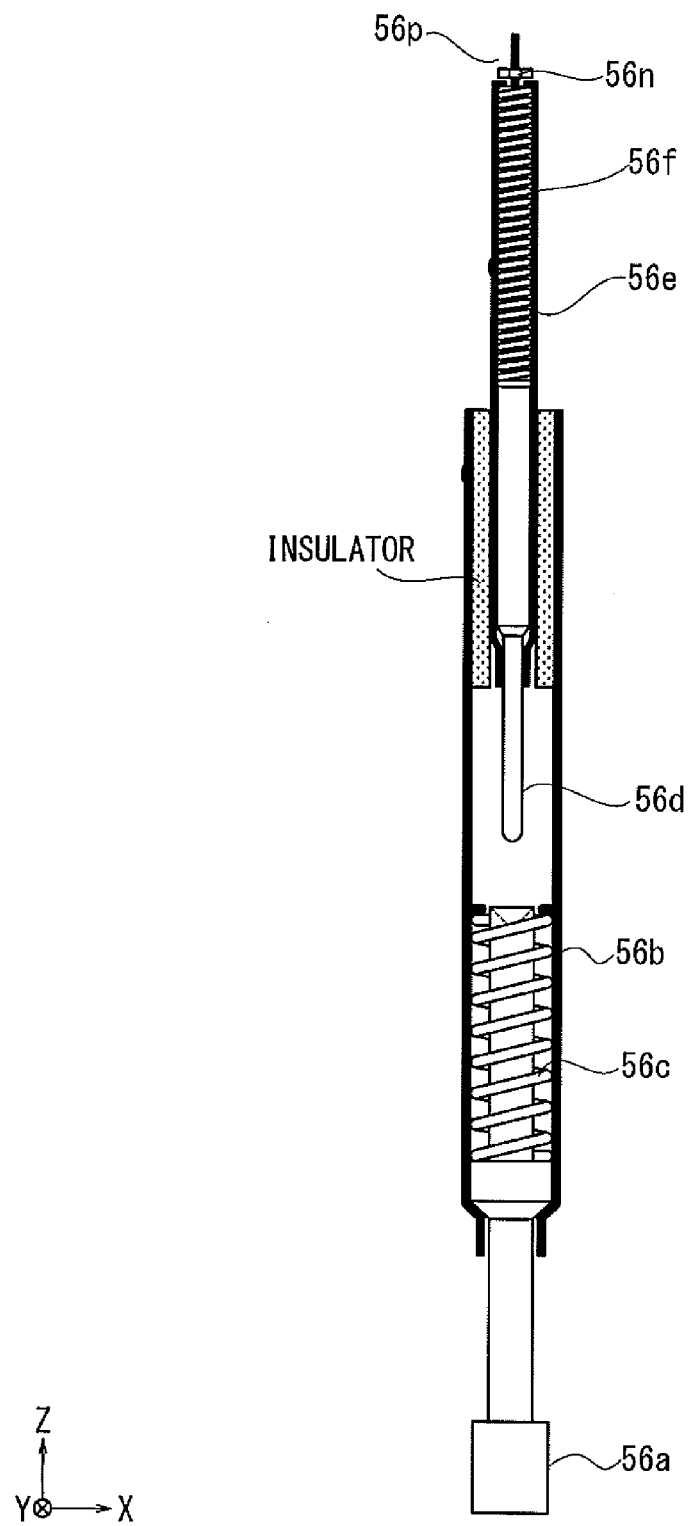
FIG. 55 is a view explaining an operation of an operator when the switch probe of the fifth embodiment is set to be in the OFF state.

For placing the switch probe 56D in the off-state, the operator screws a nut 56p into one end of the threaded rod 56n on +Z side (FIG. 54) and turns the nut 56p to move the threaded rod 56n in +Z direction (FIG. 55).

Figure 56:
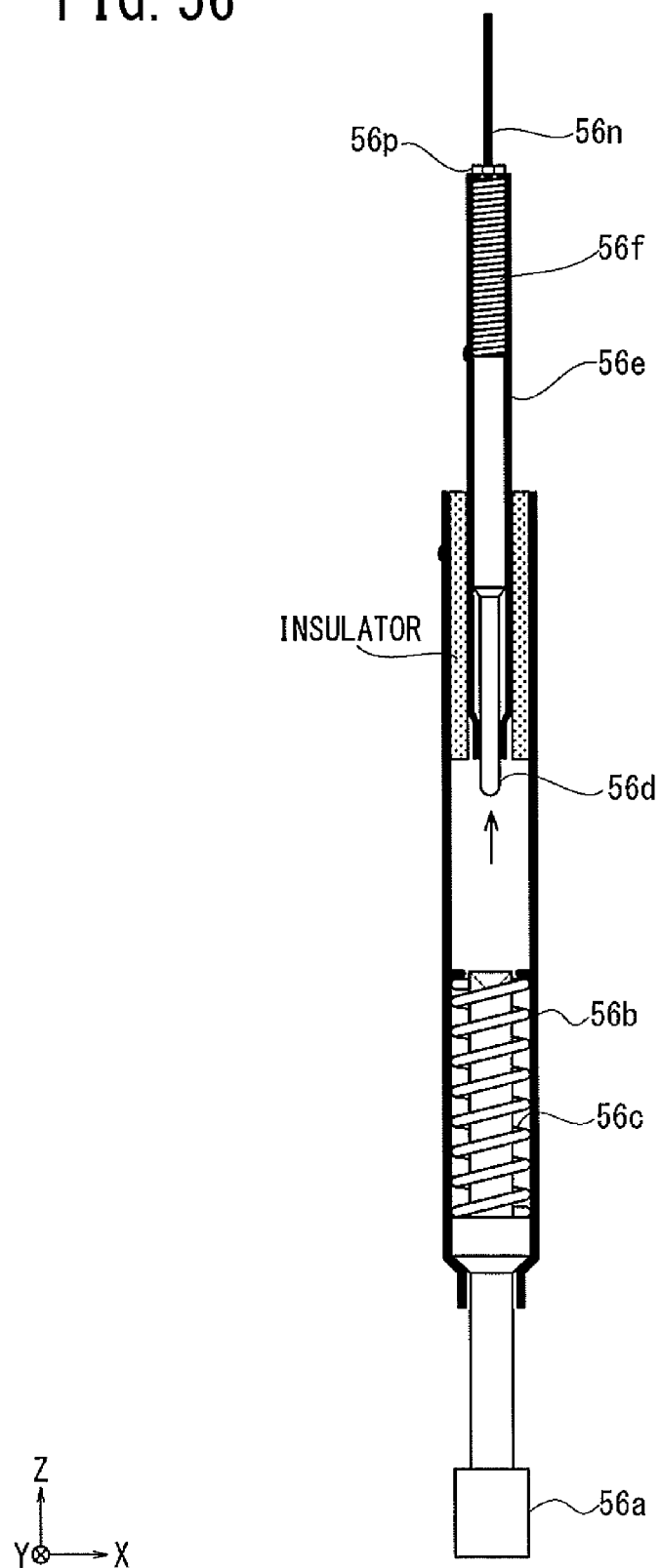
FIG. 56 is a view explaining an operation of an operator when the switch probe of the fifth embodiment is set to be in the OFF state.

When reaching the end of the second barrel 56e on +Z side, the nut 56p is restricted from further moving in −Z direction. Then, by further turning the nut 56p, the threaded rod 56n is moved in +Z direction to plunge the second plunger 56d into the second barrel 56e (FIG. 56). That is, the end of second barrel 56e on +Z side functions as a nut retainer.

Figure 57:
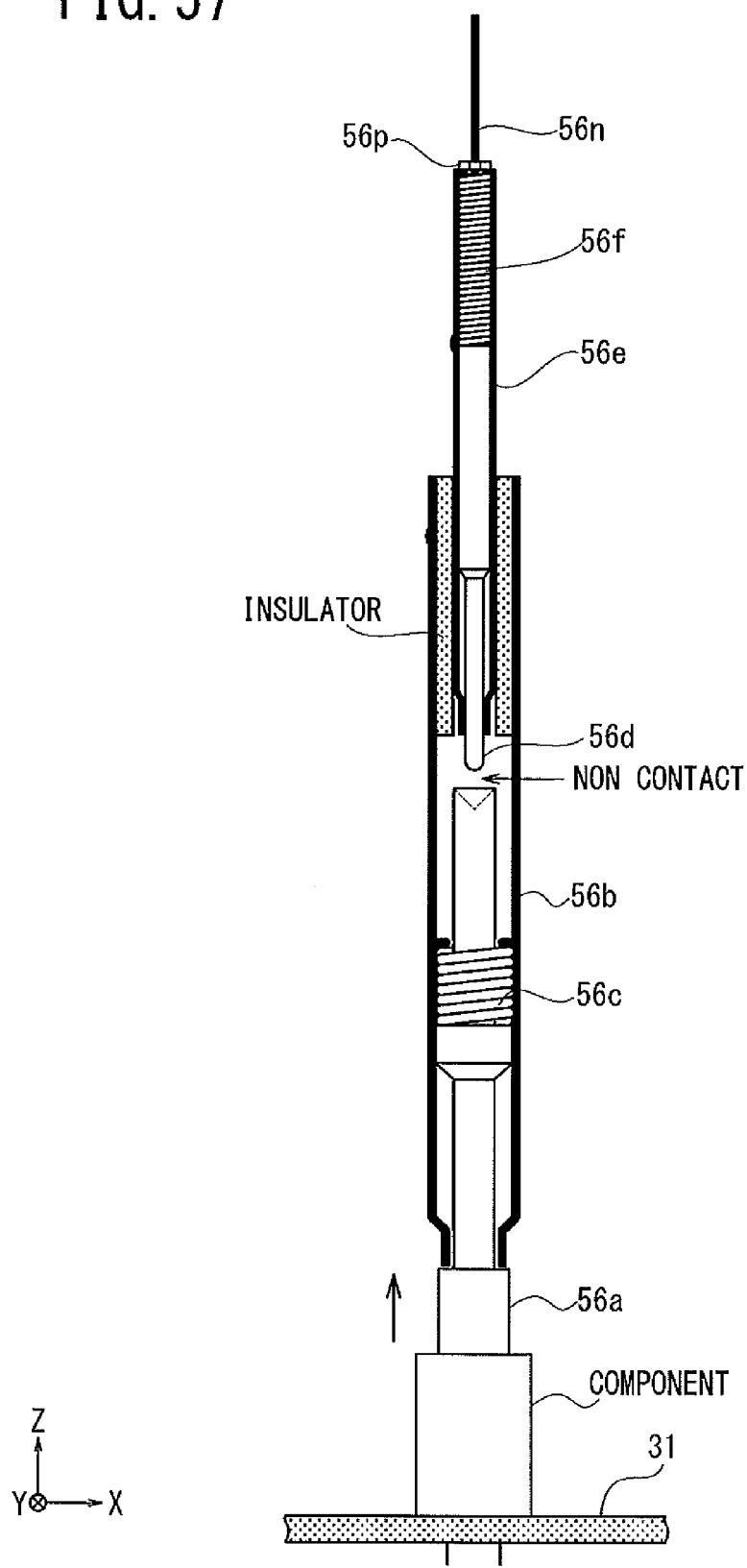
FIG. 57 is a view explaining the continuous OFF state of the switch probe of the fifth embodiment.

Thereby, the first and second plungers 56a, 56d are prevented from contacting with each other even when the first plunger 56a is moved in +Z direction by the part mounted on the target substrate 31 (FIG. 57). The switch probe 56C is placed in the off-state.

According to the switch probe 56D, the position of the second plunger 56d is freely adjustable in the Z-axis direction. That is, the plunge amount of the first plunger 56a for tuning on the switch probe is adjustable.

Similarly to the switch probe 56B, the switch probe 56C comprises a rotation preventing mechanism for the second plunger 56d in the second plunger 56d and the second barrel 56e.

Sixth Embodiment

Figure 58:
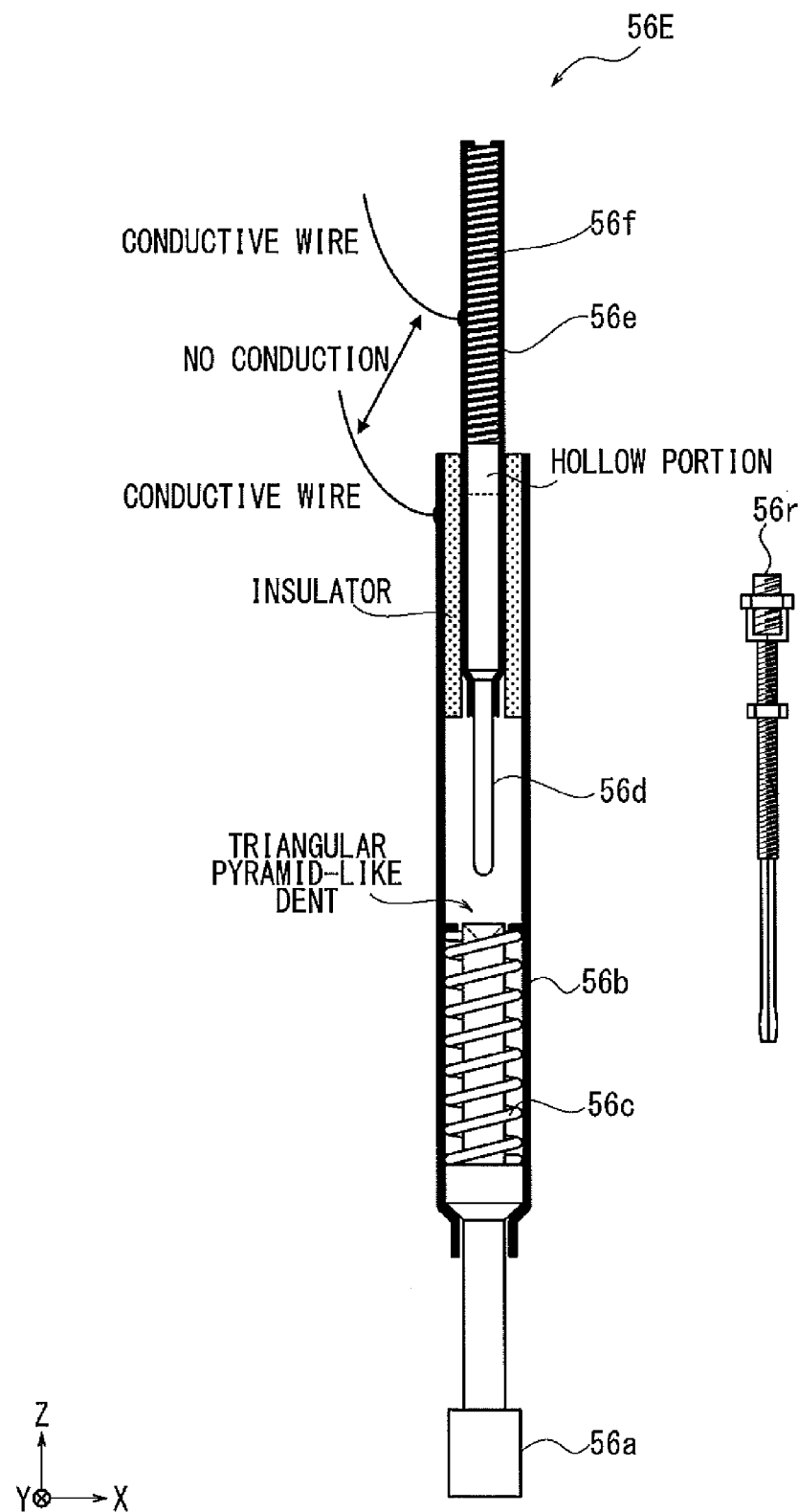
FIG. 58 is a view explaining the switch probe according to a sixth embodiment.

FIG. 58 shows a switch probe 56E according to a sixth embodiment. The switch probe 56E comprises a first plunger 56a, a first barrel 56b, a first spring 56c, a second plunger 56d, a second barrel 56e, a second spring 56f and a rod element 56r. FIG. 58 shows the switch probe 56E with the target substrate 31 not set. The rod element 56r is formed to be detachable from the switch probe 56E.

The second plunger 56d includes a hollow space (small hole) on one end on +Z side.

With the target substrate 31 not set or the certain part not mounted thereon, the first and second plungers 56a, 56d do not contact with each other and the conductive wires connected with the surfaces of the first and second barrels 56b, 56e are not conductive (off-state).

Meanwhile, with the target substrate 31 set or the certain part mounted thereon on −Z side of the switch probe 56E, the first plunger 56a is moved by the part in +Z direction.

Figure 59:
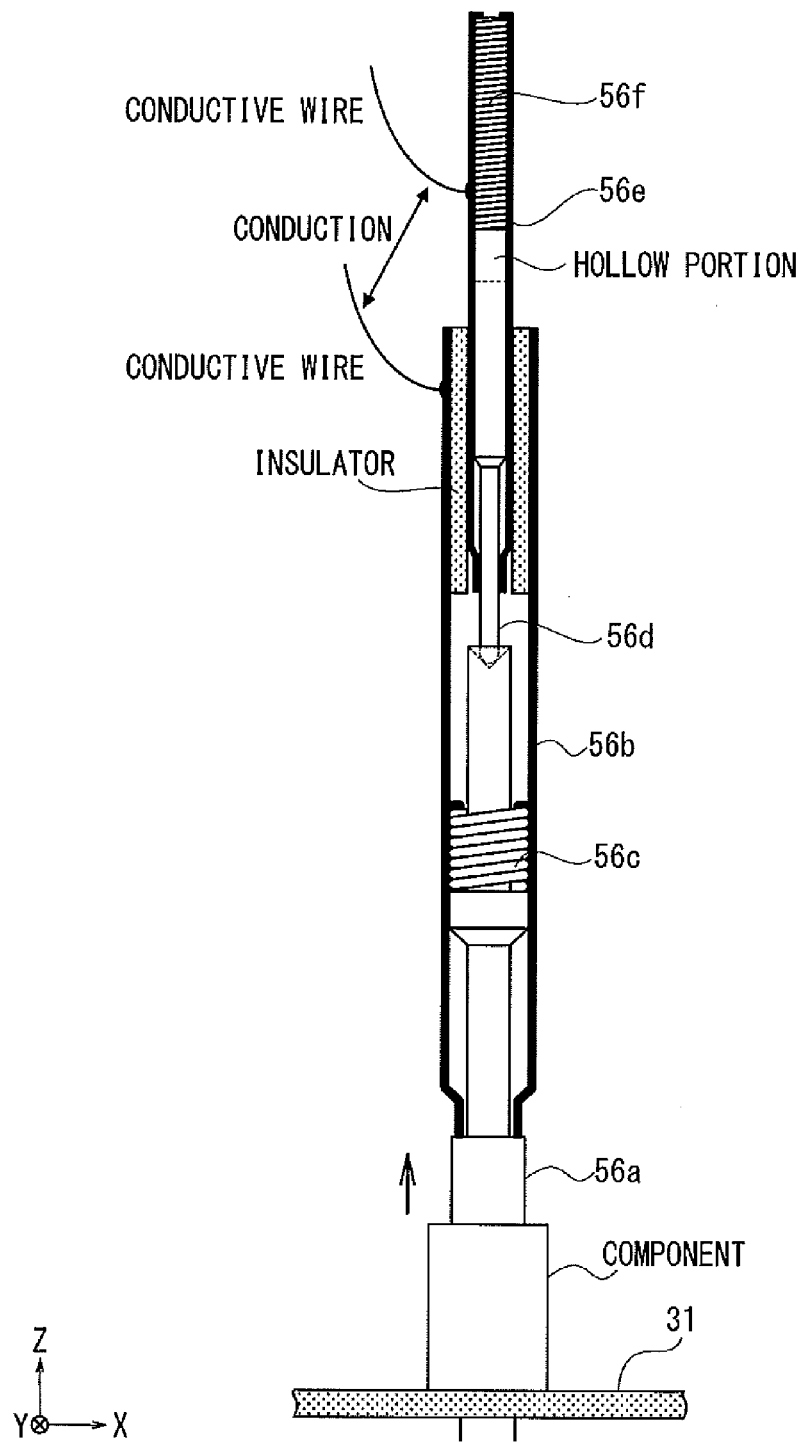
FIG. 59 is a view explaining the ON state of the switch probe of the sixth embodiment.

Then, the first and second plungers 56a, 56d contact with each other and the conductive wires connected with the surfaces of the first and second barrels 56b, 56e become conductive (on-state) as shown in FIG. 59.

Figure 60A:
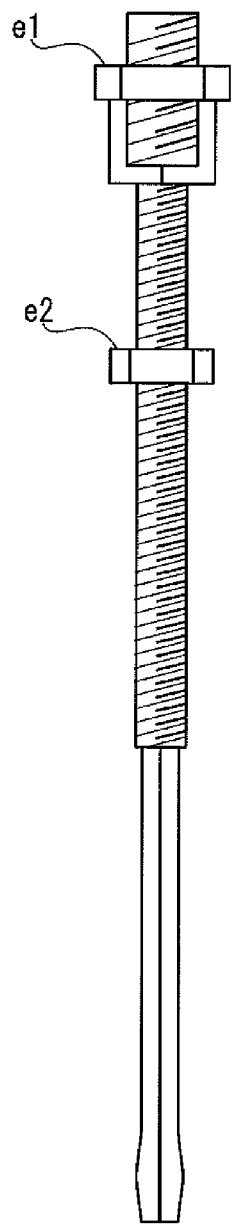
FIG. 60A is a view explaining function of a rod-like member in the switch probe of the sixth embodiment.
Figure 60B:
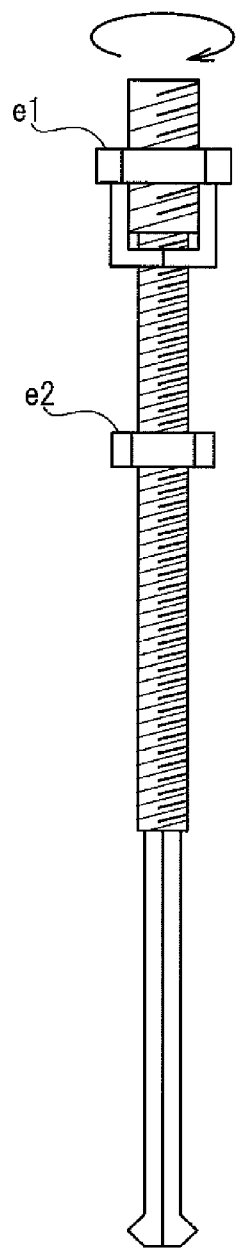
FIG. 60B is a view explaining function of a rod-like member in the switch probe of the sixth embodiment.

As shown in FIG. 60A, 60B, the rod element 56r comprises a tip portion reversibly deformable by a first nut e1 to be passable or non-passable through the hollow space and a screw portion engaged with a second nut e2.

By turning the first nut e1 in one direction, the tip portion (on −Z side) is expanded in a direction orthogonal to the Z-axis (FIG. 60B) and by turning the first nut e1 in the other direction, the tip portion is shrunk. The hollow space is formed in a size enough to allow the tip portion of the shrunk rod element 56r to pass but not to allow that of the expanded rod element 56r to pass.

Figure 60C:
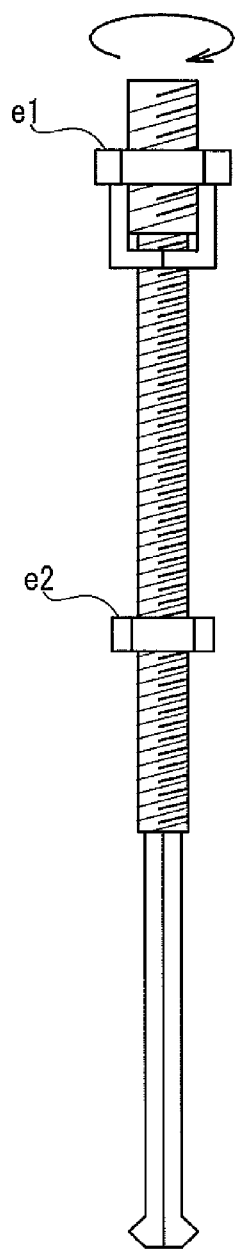
FIG. 60C is a view explaining function of a rod-like member in the switch probe of the sixth embodiment.

The second nut e2 can turn and move around the screw portion in Z-axis direction (FIG. 60C)

The rod element 56r is detached while the switch probe 56E is in the normal state.

Figure 61:
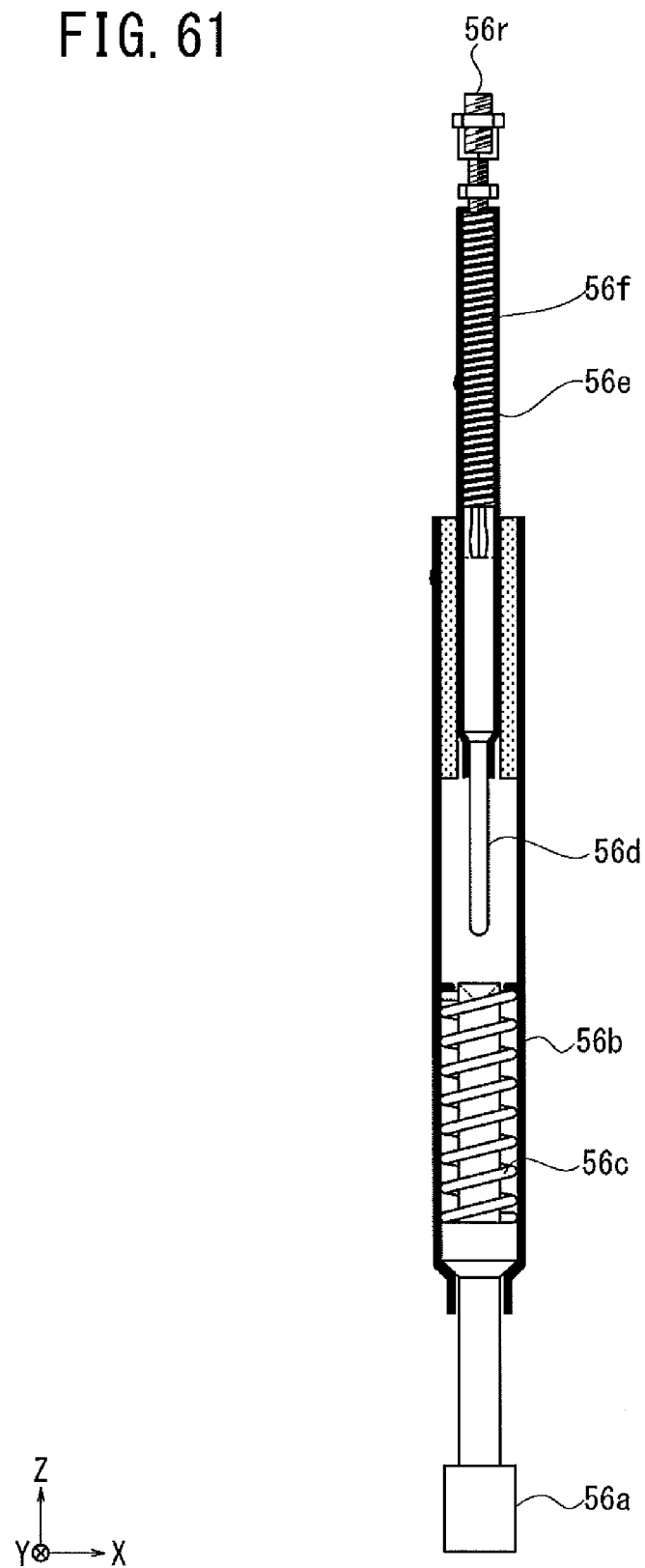
FIG. 61 is a view explaining an operation of an operator when the switch probe of the sixth embodiment is set to be in the OFF state.
Figure 62:
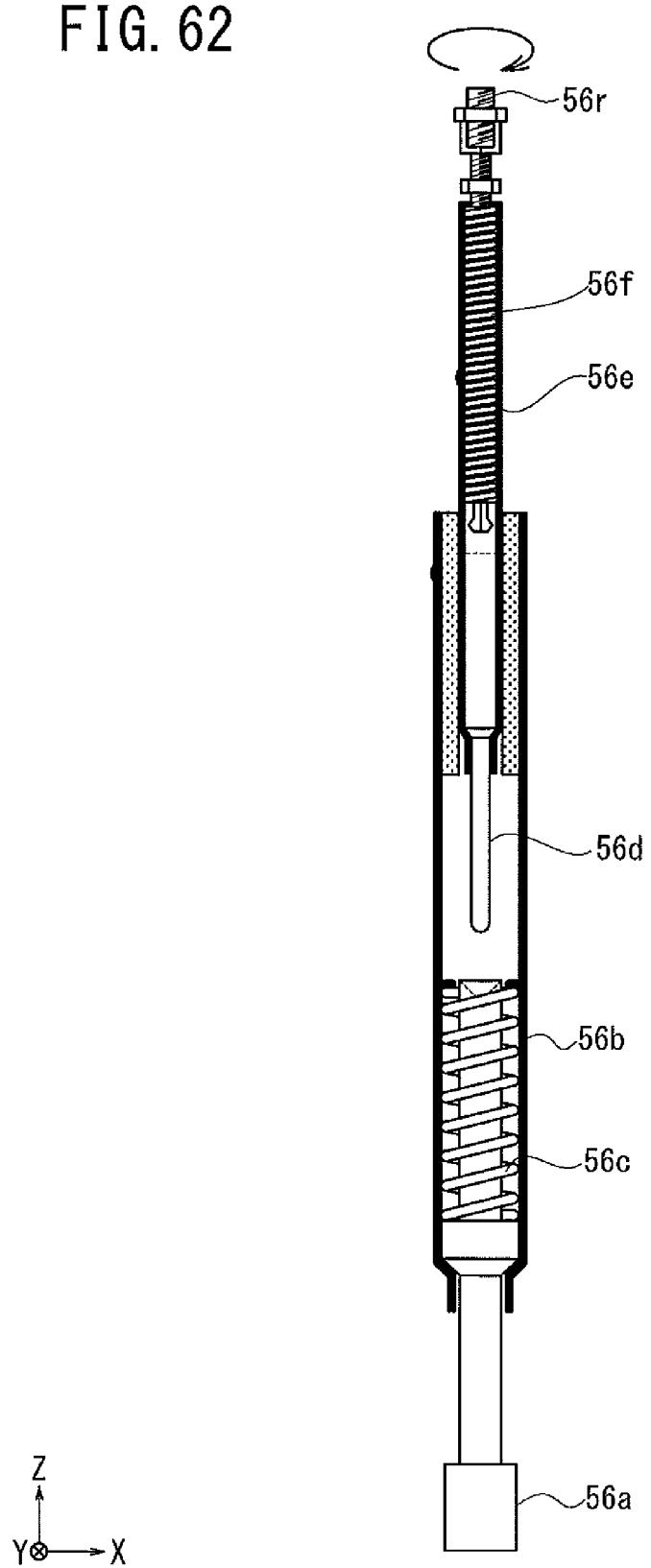
FIG. 62 is a view explaining an operation of an operator when the switch probe of the sixth embodiment is set to be in the OFF state.
Figure 63:
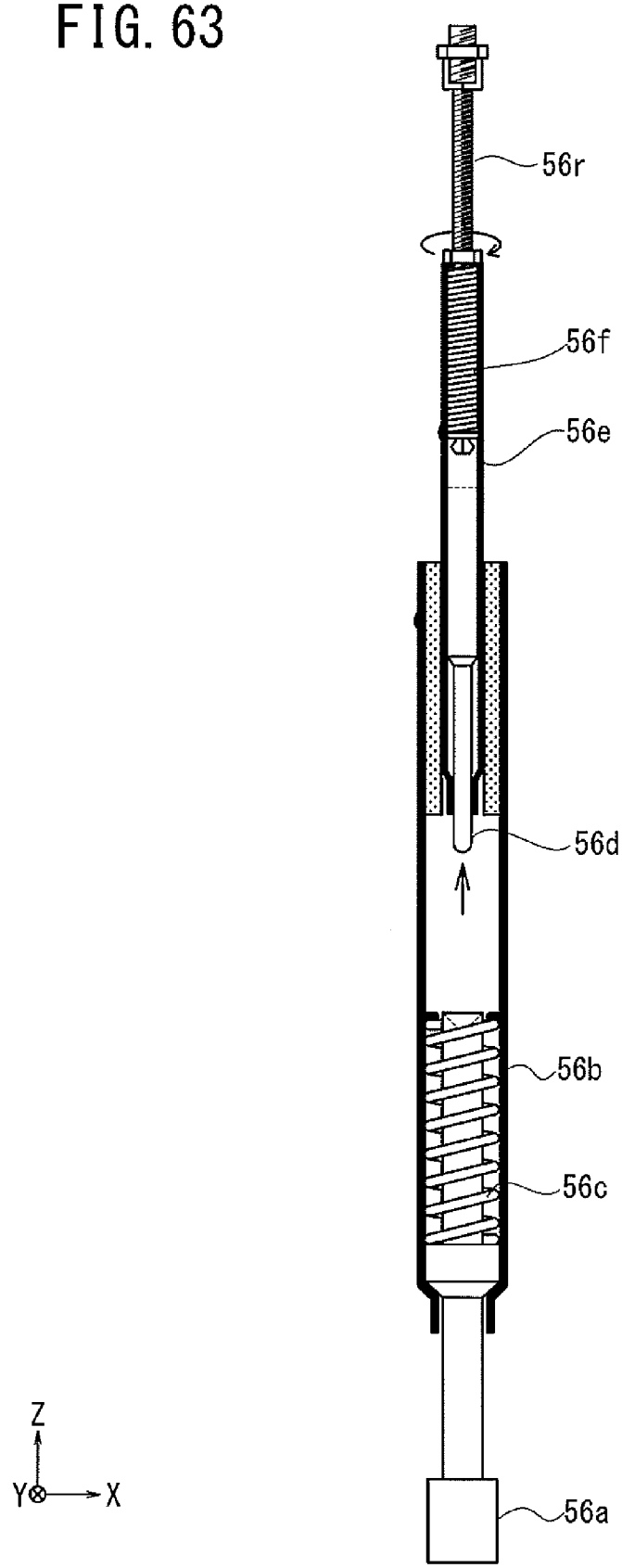
FIG. 63 is a view explaining an operation of an operator when the switch probe of the sixth embodiment is set to be in the OFF state.

For placing the switch probe 56E in the off-state, the operator first inserts the shrunk tip portion of the rod element 56r into the opening of one end of the second barrel 56e on +Z side and positions the other end of the rod element 56r in the hollow space of the second plunger 56d (FIG. 61). Then, the operator turns the first nut e1 in the one direction to expand the tip portion of the rod element 56r in a direction orthogonal to the Z-axis (FIG. 62). Next, the operator turns and moves the second nut e2 in the −Z direction relative to the screw portion. Since the movement of the second nut e2 in the −Z direction is restricted by the second barrel 56e, the turning second nut e2 moves the screw portion in +Z direction. The turning of the second nut e2 is stopped when the plunge amount of the second plunger 56d reaches a predetermined amount (FIG. 63).

Figure 64:
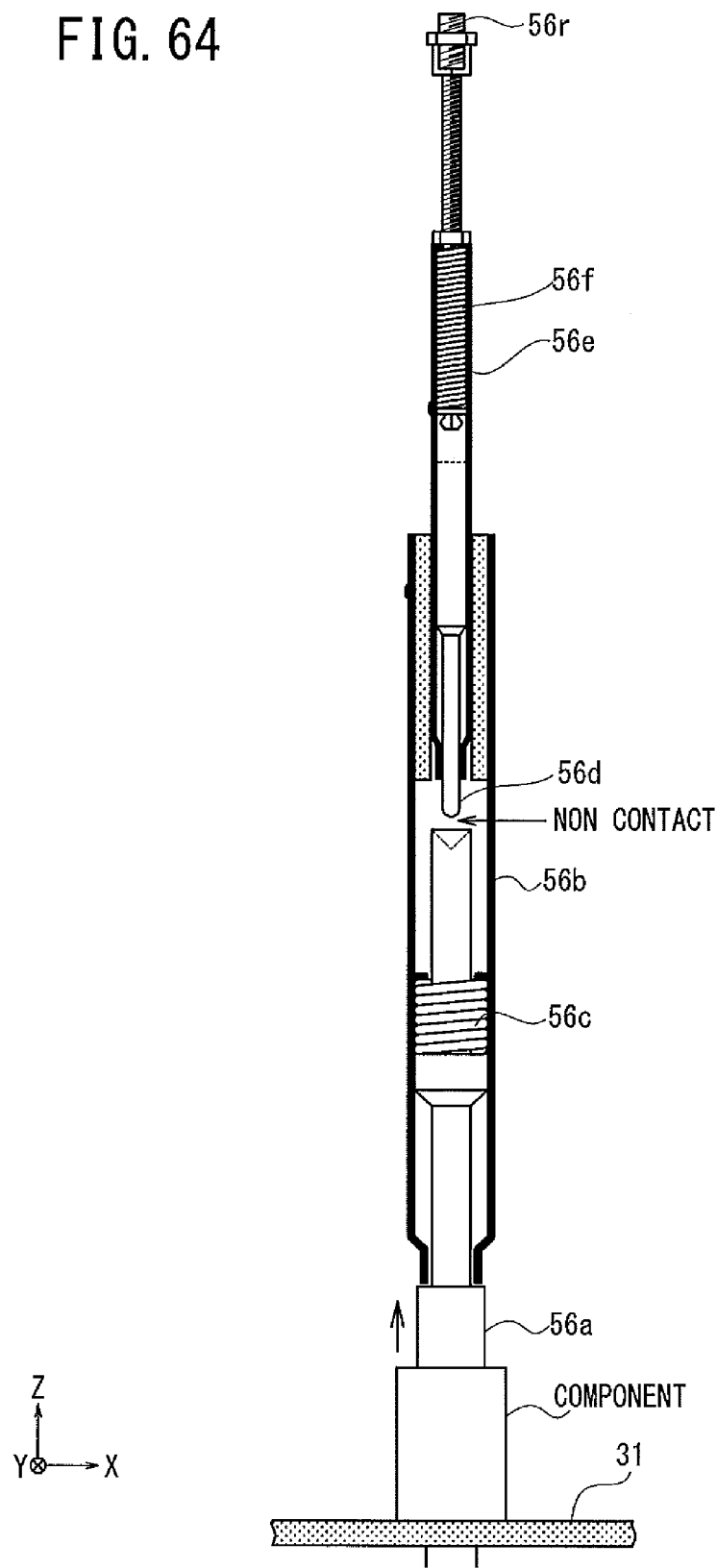
FIG. 64 is a view explaining the continuous OFF state of the switch probe of the sixth embodiment.

Thereby, the first and second plungers 56a, 56d are prevented from contacting with each other even when the first plunger 56a is moved in +Z direction by the part mounted on the target substrate 31 (FIG. 64). The switch probe 56C is placed in the off-state.

Note that the menus, contents, and layout of the display on the display unit are only illustrative and exemplary and should not be construed to limit the present invention.

Further, according to any of the above embodiments, the substrate inspection unit 20 can additionally comprise an LED for indicating an inspection result. For example, the LED can be configured to emit green light for indicating a passing status of the inspection and emit red light for indicating a failure status of the inspection.

Furthermore, according to any of the above embodiments, it can be configured that at least part of the operation by the programs on the CPU 15 is executed by the substrate inspection unit 20. For example, the substrate inspection unit 20 can be configured to incorporate an ROM in which programs are stored and the CPU on the jig plate 25.

Further, according to any of the above embodiments, a part of the various boards of the substrate inspection unit 20 such as digital IO board, AD conversion board, and buffer board can be provided in the personal computer 10.

Figure 65:
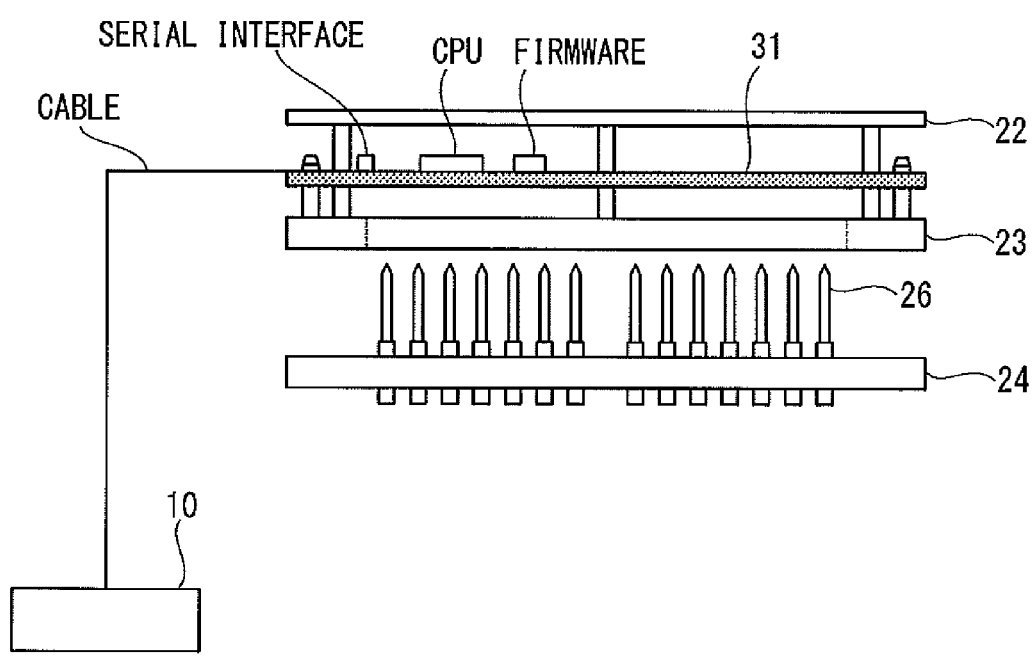
FIG. 65 is a view explaining an example of an inspection when the printed wiring substrate to be inspected is a CPU substrate.

Further, according to any of the above embodiments, in a case where the target substrate 31 is a so-called CPU substrate on which embedded software (firmware) is mounted, the personal computer 10 and the target substrate 31 can be connected in serial to check the operation of the CPU substrate (FIG. 65).

Further, according to any of the above embodiments the personal computer 10 and the substrate inspection unit 20 can be integrated.

Moreover, the above embodiments have described an example of the contract probe and the plunger. However, the present invention should not be limited to such an example. The structure of the contact probe and the shape of the tip of the plunger can be arbitrarily formed as long as they can achieve the same functions.

Further, the above embodiments have described examples where the certain part to be inspected by the switch probe is mounted only on +Z side of the target substrate 31. However, the present invention should not be limited to such examples. The certain part can be mounted on −Z side of the target substrate 31. In this case the switch probe is also attached to the pin board 24 as the contact probe.

As described above, the switch probe, the substrate inspection device and the substrate inspection system according to any one of the above embodiments are adapted to improve the work efficiency of the inspection of substrates.

Although the present invention has been described in terms of exemplary embodiments, it is not limited thereto. It should be appreciated that variations or modifications may be made in the embodiments described by persons skilled in the art without departing from the scope of the present invention as defined by the following claims.

What is claimed is:

1. A switch probe for use in a substrate inspection device to inspect a substrate to determine whether or not a part to be inspected is mounted on the substrate in a predetermined position, the switch probe comprising:
    a first tubular element;
    a first rod element partially accommodated in the first tubular element, and pressed into the first tubular element when the part to be inspected is mounted for substrate inspection;
    a second tubular element fixed in the first tubular element;
    a second rod element partially accommodated in the second tubular element which is inside the first tubular element, and contacting with the first rod element when the first rod element is pressed into the first tubular element; and
    a fixing mechanism configured to temporarily fix the second rod element in a position so that the second rod element does not contact with the first rod element even when the first rod element is pressed into the first tubular element, the fixing mechanism comprising:
        a screw hole formed in the vicinity of one end of the second rod element, extending to the first rod element;
        a first screw to screw into the screw hole when the second rod element is temporarily fixed; and
        a screw retainer configured to retain the screw when the second rod element is positioned for the temporary fixing.

2. A switch probe according to claim 1, wherein the first screw is configured to be detachable from the second rod element when the second rod element is not fixed.

3. A switch probe according to claim 1, wherein the fixing mechanism comprises
    a hollow space formed in the vicinity of the other end of the second rod element and having an entrance narrower than an inside;
    a third rod element including a screw portion engaged with a nut and a deformable element to reversibly deform the end of the second rod element to be insertable or non-insertable into the entrance of the hollow space when the second rod element is temporarily fixed; and a nut retainer provided on the second tubular element configured to retain the nut when the second rod element is positioned for temporary fixing.

4. A switch probe according to claim 3, wherein the third rod element is configured to be detachable from the second rod element when the second rod element is not fixed.

5. A switch probe according to claim 1, further comprising a rotation preventing mechanism configured to prevent the second rod element from rotating.

6. A substrate inspection device for inspecting a printed substrate, comprising:
A plurality of switch probes according to claim 1; and
a controller configured to output or receive an electric signal to/from the switch probes and inspect a printed substrate.

7. A substrate inspection system comprising:
the substrate inspection device according to claim 6;
an input unit with which an operator inputs information relative to a target printed substrate; and
a display unit to display a result of the inspection obtained by the substrate inspection device.

8. A switch probe according to claim 1, wherein the fixing mechanism is disposed within the second tubular element, and the fixing mechanism and the second tubular element are disposed relative to the second rod element to allow the second rod element to be moved independently.

9. A switch probe for use in a substrate inspection device to inspect a substrate to determine whether or not a part to be inspected is mounted on the substrate in a predetermined position, the switch probe comprising:
a first tubular element;
a first rod element partially accommodated in the first tubular element, and pressed into the first tubular element when the part to be inspected is mounted for substrate inspection;
a second tubular element fixed in the first tubular element;
a second rod element partially accommodated in the second tubular element which is inside the first tubular element, and contacting with the first rod element when the first rod element is pressed into the first tubular element; and
a fixing mechanism configured to temporarily fix the second rod element in a position so that the second rod element does not contact with the first rod element even when the first rod element is messed into the first tubular element, the fixing mechanism comprising:
a second screw fixed to the second rod element at one end and having a portion near the other end and exposed from the second tubular element to engage with a nut; and
a nut retainer provided in the second tubular element to retain the nut when the second rod element is positioned for the temporary fixing.

10. A switch probe according to claim 9, wherein the fixing mechanism is adjustable of the position in which the second rod element is temporarily fixed.

11. A switch probe for use in a substrate inspection device to inspect a substrate to determine whether or not a part to be inspected is mounted on the substrate in a predetermined position, the switch probe comprising:
a first tubular element;
a first rod element partially accommodated in the first tubular element and pressed into the first tubular element when the part to be inspected is mounted for substrate inspection;
a second tubular element fixed in the first tubular element;
a second rod element partially accommodated in the second tubular element which is inside the first tubular element, and contacting with the first rod element when the first rod element is pressed into the first tubular element; and
a fixing mechanism configured to temporarily fix the second rod element in a position so that the second rod element does not contact with the first rod element even when the first rod element is messed into the first tubular element, the fixing mechanism comprising:
a screw hole formed in the vicinity of the other end of the second rod element, extending to the first rod element;
a third screw to engage with a nut and be screwed into the screw hole when the second rod element is temporarily fixed; and
a nut retainer provided in the second tubular element to retain the nut when the second rod element is positioned for the temporary fixing.

12. A switch probe according to claim 11, wherein the third screw is configured to be detachable from the second rod element when the second rod element is not fixed.

13. A switch probe for use in a substrate inspection device to inspect a substrate to determine whether or not a part to be inspected is mounted on the substrate in a predetermined position, the switch probe comprising:
a first tubular element;
a first rod element partially accommodated in the first tubular element, and pressed into the first tubular element when the art to be inspected is mounted for substrate inspection;
a second tubular element fixed in the first tubular element;
a second rod element partially accommodated in the second tubular element which is inside the first tubular element, and contacting with the first rod element when the first rod element is pressed into the first tubular element; and
a fixing mechanism configured to temporarily fix the second rod element in a position so that the second rod element does not contact with the first rod element even when the first rod element is pressed into the first tubular element, the fixing mechanism comprising:
a fourth rod element fixed at one end on the second rod element;
a plate spring fixed on the other end of the fourth rod element and elastically deforming in a direction orthogonal to a longitudinal direction of the fourth rod element; and
an engaging portion provided on the second tubular element to engage with the plate spring when the second rod element is positioned for temporary fixing.

14. A switch probe for use in a substrate inspection device to inspect a substrate to determine whether or not a part to be inspected is mounted on the substrate in a predetermined position, the switch probe comprising:
a first tubular element;
a first rod element partially accommodated in the first tubular element, and pressed into the first tubular element when the part to be inspected is mounted for substrate inspection;
a second tubular element fixed in the first tubular element;
a second rod element partially accommodated in the second tubular element which is inside the first tubular element, and contacting with the first rod element when the first rod element is pressed into the first tubular element; and a fixing mechanism configured to temporarily fix the second rod element in a position so that the second rod element does not contact with the first rod element even when the first rod element is pressed into the first tubular element, the fixing mechanism comprising:
a fifth rod element fixed on the second rod element;
a protrusion formed on an inner wall of a side face of the second tubular element; and
an engaging portion formed on a side face of the second rod element to engage with the protrusion when the second rod element is temporarily fixed.

* * * * *